United States Patent
Saida et al.

(10) Patent No.: US 8,737,122 B2
(45) Date of Patent: May 27, 2014

(54) NONVOLATILE MEMORY DEVICE

(75) Inventors: Daisuke Saida, Tokyo (JP); Minoru Amano, Kanagawa-ken (JP); Tazumi Nagasawa, Kanagawa-ken (JP); Yuichi Ohsawa, Kanagawa-ken (JP); Junichi Ito, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 85 days.

(21) Appl. No.: 13/416,076

(22) Filed: Mar. 9, 2012

(65) Prior Publication Data

US 2013/0070522 A1  Mar. 21, 2013

(30) Foreign Application Priority Data

Sep. 21, 2011 (JP) .................................. 2011-206667

(51) Int. Cl.
*G11C 11/15* (2006.01)
*G11C 11/16* (2006.01)

(52) U.S. Cl.
CPC ..................................... *G11C 11/16* (2013.01)
USPC ...... 365/173; 365/148; 365/158; 365/189.16; 365/230.03

(58) Field of Classification Search
CPC ............... G11C 11/16; G11C 11/5607; G11C 13/0007; G11C 11/14; G11C 11/15; G11C 13/0004; G11C 2213/74
USPC ......... 365/158, 173, 171, 145, 154, 157, 148, 365/66, 189.16, 230.03
See application file for complete search history.

(56) References Cited

U.S. PATENT DOCUMENTS 8,072,800 B2 * 12/2011 Chen et al. .................... 365/158
8,077,509 B2  12/2011 Yanagi et al.
8,085,582 B2  12/2011 Nakamura et al.
2004/0165425 A1 *  8/2004 Nakamura et al. ............ 365/171

FOREIGN PATENT DOCUMENTS

JP          2010-206023        9/2010

OTHER PUBLICATIONS

U.S. Appl. No. 13/795,620, filed Mar. 12, 2013, Saida, et al.
U.S. Appl. No. 13/601,343, filed Aug. 31, 2012, Saida, et al.
U.S. Appl. No. 13/228,040, filed Sep. 8, 2011, Daisuke Saida, et al.
U.S. Appl. No. 13/227,959, filed Sep. 8, 2011, Daisuke Saida, et al.
U.S. Appl. No. 13/210,678, filed Aug. 16, 2011, Tadaomi Daibou, et al.
U.S. Appl. No. 13/037,592, filed Mar. 1, 2011, Daisuke Saida, et al.

* cited by examiner

*Primary Examiner* — Thong Q Le
(74) *Attorney, Agent, or Firm* — Oblon, Spivak, McClelland, Maier & Neustadt, L.L.P.

(57) ABSTRACT

According to one embodiment, a nonvolatile memory device includes a magnetic memory element and a control unit. The magnetic memory element includes a stacked body including first and second stacked units. The first stacked unit includes a first ferromagnetic layer having a magnetization fixed, a second ferromagnetic layer having a magnetization variable and a first nonmagnetic layer provided between the first and second ferromagnetic layers. The second includes a third ferromagnetic layer having a magnetization rorated by a passed current to produce oscillation, a fourth ferromagnetic layer having a magnetization fixed and a second nonmagnetic layer provided between the third and fourth ferromagnetic layers stacked with each other. A frequency of the oscillation changes in accordance with the direction of the magnetization of the second ferromagnetic layer. The control unit includes a reading unit reading out the magnetization of the second ferromagnetic layer.

19 Claims, 35 Drawing Sheets

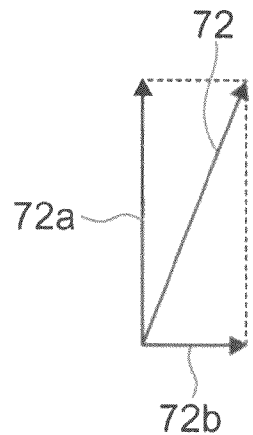 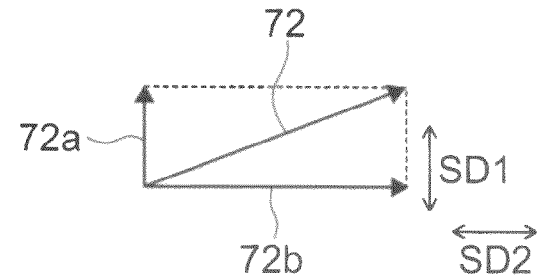
FIG. 3A    FIG. 3B
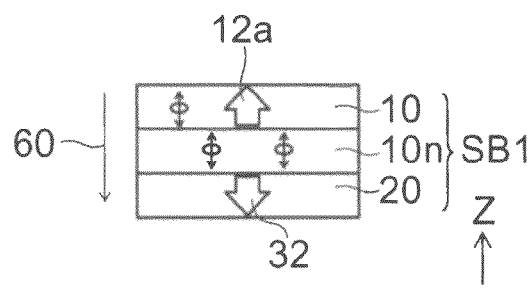 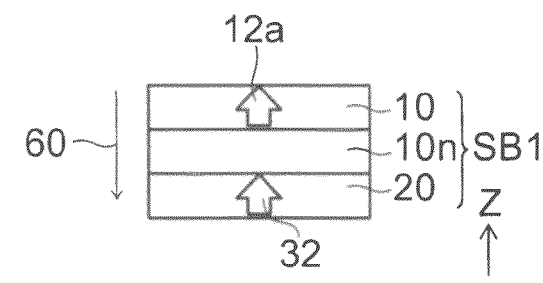
FIG. 4A    FIG. 4B
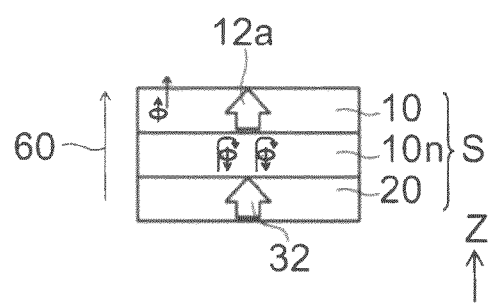 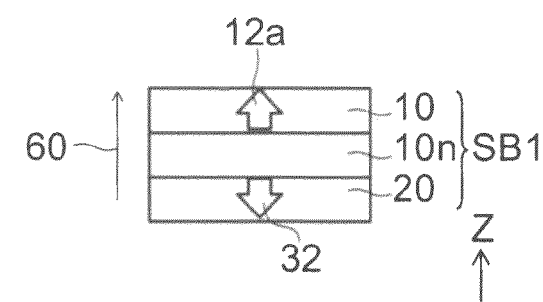
FIG. 4C    FIG. 4D

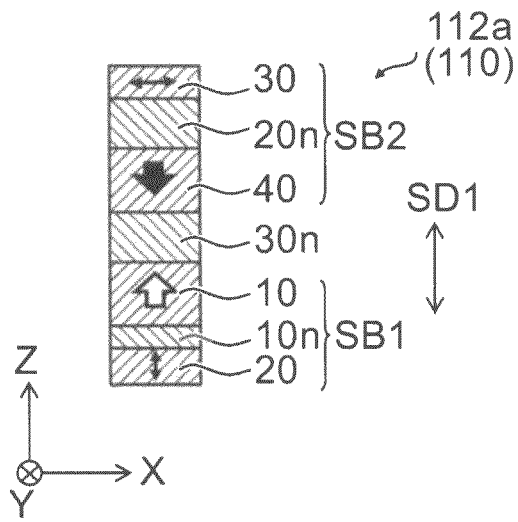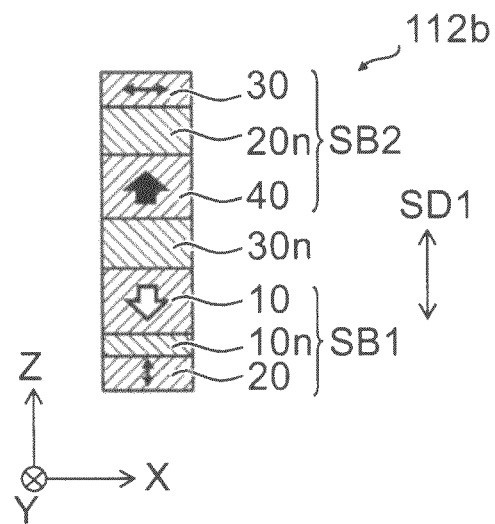
FIG. 11A  FIG. 11B
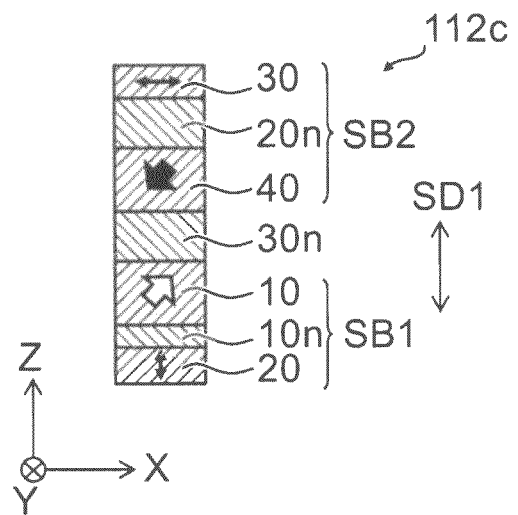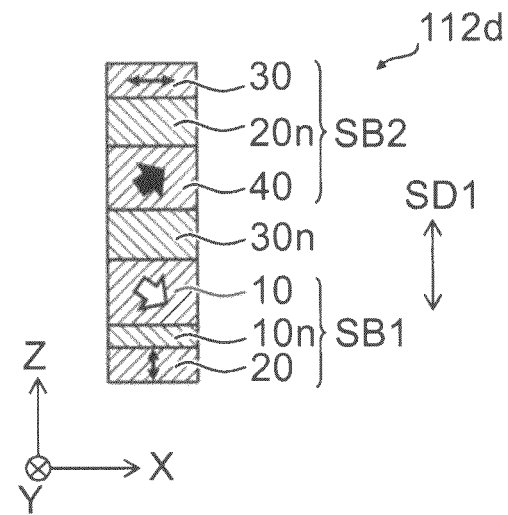
FIG. 12A  FIG. 12B

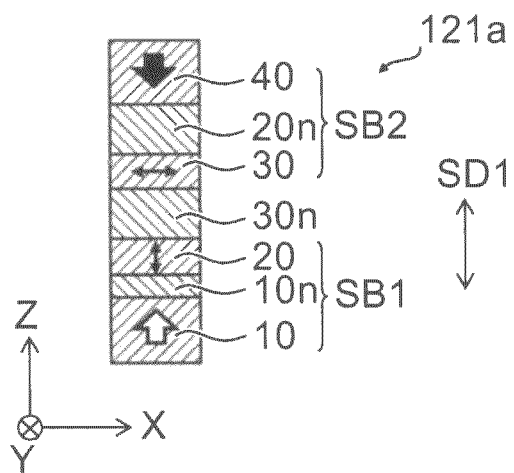
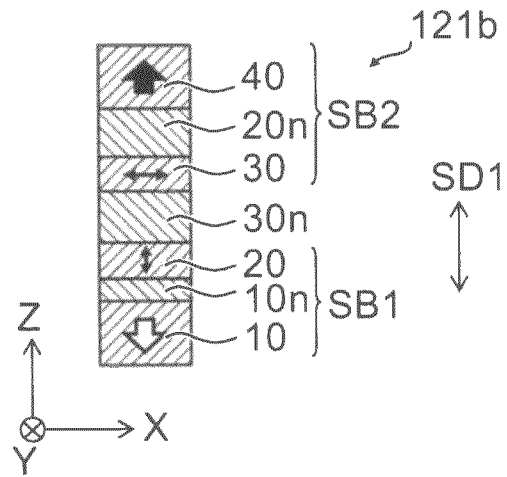
FIG. 13A          FIG. 13B
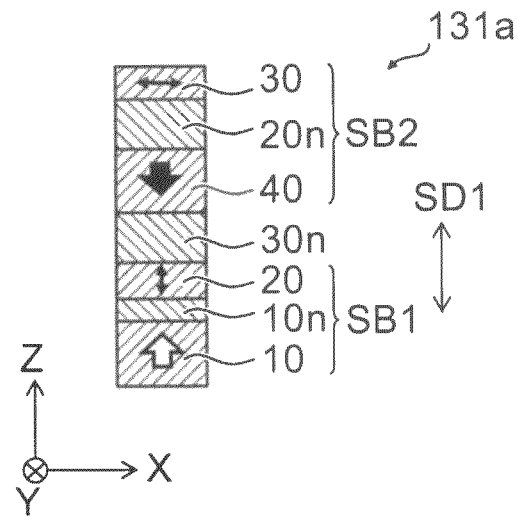
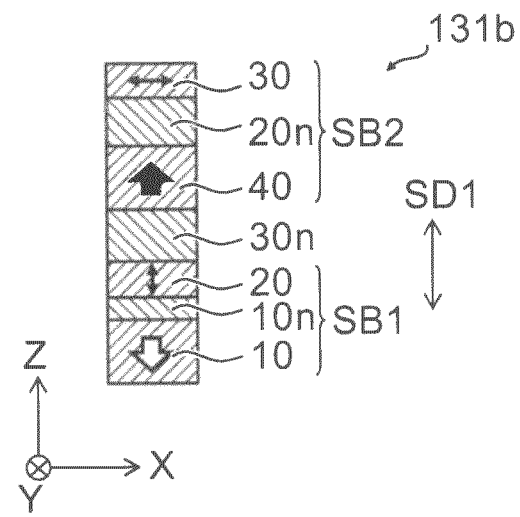
FIG. 14A          FIG. 14B

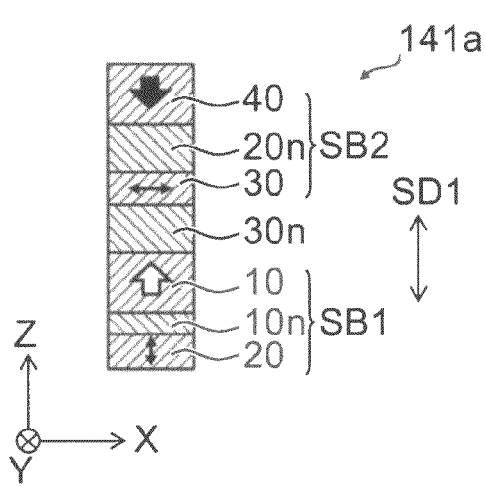
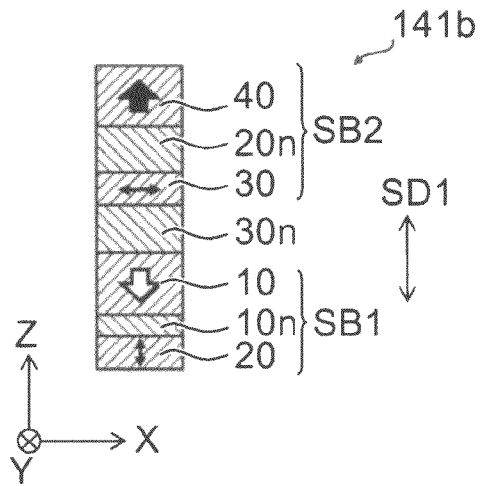
FIG. 15A    FIG. 15B
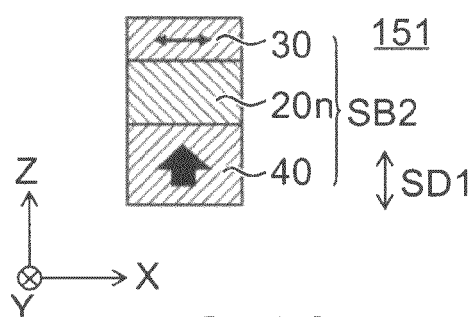
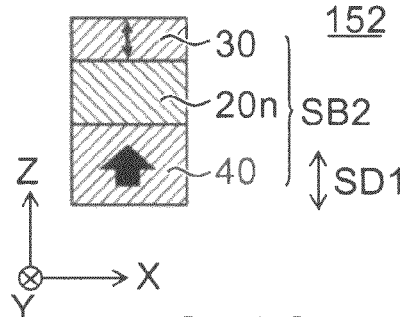
FIG. 16A    FIG. 16B
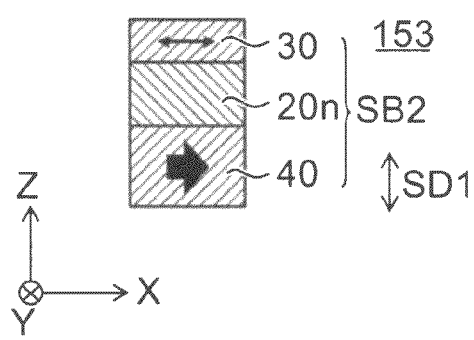
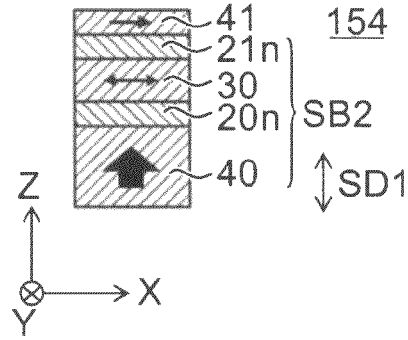
FIG. 16C    FIG. 16D

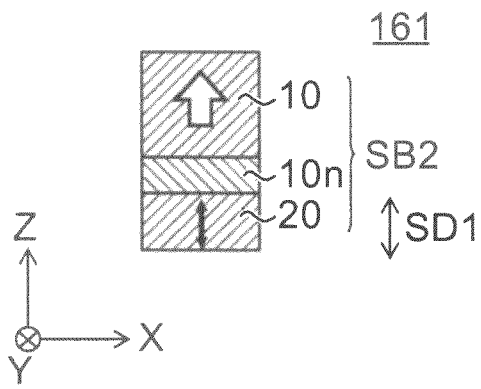 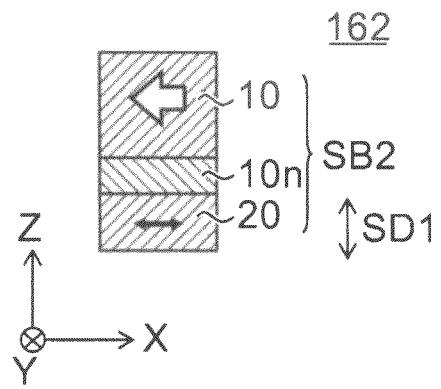
FIG. 17A  FIG. 17B
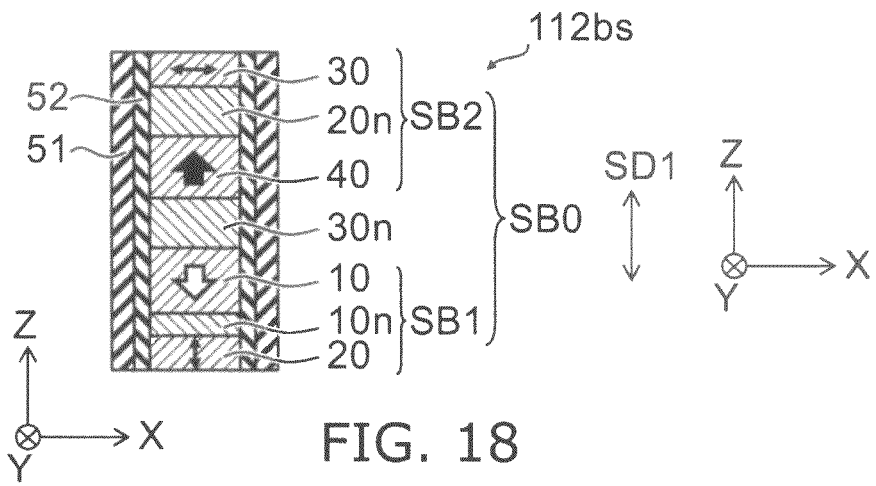
FIG. 18
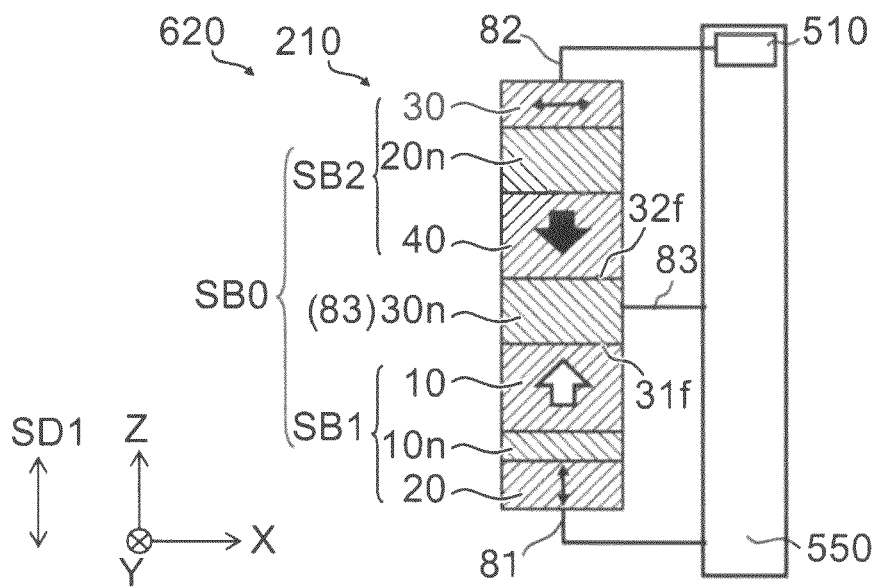
FIG. 19

NONVOLATILE MEMORY DEVICE

CROSS-REFERENCE TO RELATED APPLICATIONS

This application is based upon and claims the benefit of priority from the prior Japanese Patent Application No. 2011-206667, filed on Sep. 21, 2011; the entire contents of which are incorporated herein by reference.

FIELD

Embodiments described herein relate generally to a nonvolatile memory device.

BACKGROUND

Some magnetic random access memories (MRAM) have a configuration in which a magnetic tunnel junction (MTJ) element exhibiting the tunneling magnetoresistive (TMR) effect is used for a data memory unit. The configuration is drawing attention as a high-speed and large-capacity nonvolatile memory. Writing to the memory layer of the MTJ element is performed by, for example, a spin-transfer torque writing system. It is important to ensure stable operation in the magnetic memory element.

BRIEF DESCRIPTION OF THE DRAWINGS

FIG. 3A and FIG. 3B are schematic views showing magnetization;

FIG. 4A to FIG. 4D are schematic views showing an operation of the nonvolatile memory element according to the first embodiment;

FIG. 11A and FIG. 11B are schematic cross-sectional views showing the configurations of parts of nonvolatile memory devices according to the first embodiment;

FIG. 12A and FIG. 12B are schematic cross-sectional views showing the configurations of parts of nonvolatile memory devices according to the first embodiment;

FIG. 13A and FIG. 13B are schematic cross-sectional views showing the configurations of parts of nonvolatile memory devices according to the first embodiment;

FIG. 14A and FIG. 14B are schematic cross-sectional views showing the configurations of parts of nonvolatile memory devices according to the first embodiment;

FIG. 15A and FIG. 15B are schematic cross-sectional views showing the configurations of parts of nonvolatile memory devices according to the first embodiment;

FIG. 16A to FIG. 16D are schematic cross-sectional views showing the configurations of parts of nonvolatile memory devices according to the first embodiment;

FIG. 17A and FIG. 17B are schematic cross-sectional views showing the configurations of parts of nonvolatile memory devices according to the first embodiment;

FIG. 18 is a schematic cross-sectional view showing the configuration of a part of a nonvolatile memory device according to the first embodiment;

FIG. 19 is a schematic view showing the configuration of a nonvolatile memory device according to a second embodiment;

DETAILED DESCRIPTION

Figure 1:
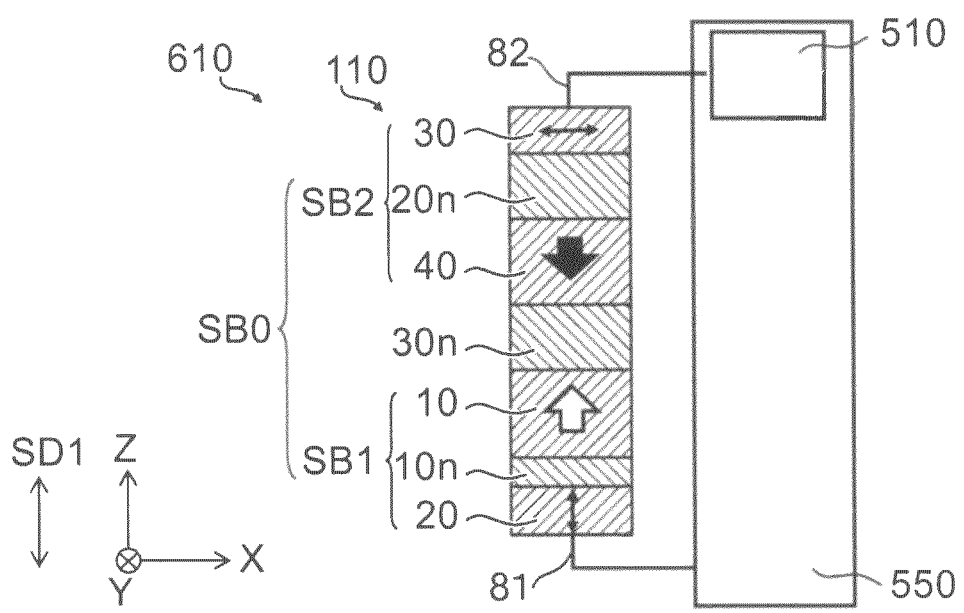
FIG. 1 is a schematic view showing a nonvolatile memory device according to a first embodiment.

According to one embodiment, a nonvolatile memory device includes a magnetic memory element and a control unit. The magnetic memory element includes a stacked body including a first stacked unit and a second stacked unit. The first stacked unit includes a first ferromagnetic layer, a second ferromagnetic layer and a first nonmagnetic layer. A magnetization of the first ferromagnetic layer is fixed in a first direction. The second ferromagnetic layer is stacked with the first ferromagnetic layer along a stacking direction. A direction of a magnetization of the second ferromagnetic layer is variable. The first nonmagnetic layer is provided between the first ferromagnetic layer and the second ferromagnetic layer. The second stacked unit is stacked with the first stacked unit along the stacking direction. The second stacked unit includes a third ferromagnetic layer, a fourth ferromagnetic layer and a second nonmagnetic layer. In the third ferromagnetic layer, a magnetization is rotated by a passed current to produce oscillation and a frequency of the oscillation changes in accordance with the direction of the magnetization of the second ferromagnetic layer. The fourth ferromagnetic layer is stacked with the third ferromagnetic layer along the stacking direction. A magnetization of the fourth ferromagnetic layer is fixed in a second direction. The second nonmagnetic layer is provided between the third ferromagnetic layer and the fourth ferromagnetic layer. The control unit includes a reading unit configured to read out the direction of the magnetization of the second ferromagnetic layer by detecting the change in the frequency of the oscillation of the third ferromagnetic layer.

According to another embodiment, a nonvolatile memory device includes a magnetic memory element and a control unit. The magnetic memory element includes a first stacked unit, a second stacked unit and a third nonmagnetic layer. The first stacked unit includes a first ferromagnetic layer, a second ferromagnetic layer and a first nonmagnetic layer. A magnetization of the first ferromagnetic layer is fixed in a first direction. The second ferromagnetic layer is stacked with the first ferromagnetic layer along a stacking direction. A direction of a magnetization of the second ferromagnetic layer is variable. The first nonmagnetic layer is provided between the first ferromagnetic layer and the second ferromagnetic layer. The second stacked unit includes a third ferromagnetic layer, a fourth ferromagnetic layer and a second nonmagnetic layer. A magnetization of the third ferromagnetic layer is rotated by a passed current to produce oscillation. A frequency of the oscillation changes in accordance with the direction of the magnetization of the sixth ferromagnetic layer. The fourth ferromagnetic layer is stacked with the third ferromagnetic layer along a stacking direction. The first ferromagnetic layer, the second ferromagnetic layer, and the first nonmagnetic layer are stacked along the stacking direction. A magnetization of the fourth ferromagnetic layer is fixed in a second direction. The second nonmagnetic layer is provided between the third ferromagnetic layer and the fourth ferromagnetic layer. The third nonmagnetic layer has a first surface perpendicular to the stacking direction and a second surface on a side opposite to the first surface. At least a part of the first surface faces the first stacked unit, and at least a part of the second surface faces the second stacked unit. The control unit includes a reading unit configured to read out the direction of the magnetization of the second ferromagnetic layer by detecting the change in the frequency of the oscillation of the third ferromagnetic layer.

According to another embodiment, a nonvolatile memory device includes a plurality of bit lines, a plurality of word lines, a plurality of memory cells and a control unit including a reading unit connected to the plurality of bit lines. Each of the memory cells is provided at each of facing portions. The bit lines face the word lines at the facing portions. Each of the memory cells includes a first stacked unit, a second stacked unit stacked with the first stacked unit along a stacked direction, an intermediate interconnection provided between the first stacked unit and the second stacked unit and a selection transistor including a gate and configured to allow current passage by switching the gate to be ON state. The first stacked unit includes a first ferromagnetic layer, a second ferromagnetic layer and a first nonmagnetic layer. A magnetization of the first ferromagnetic layer is fixed in a first direction. The second ferromagnetic layer is stacked with the first ferromagnetic layer along the stacking direction. A direction of a magnetization of the second ferromagnetic layer is variable. The first nonmagnetic layer is provided between the first ferromagnetic layer and the second ferromagnetic layer. The second stacked unit includes a third ferromagnetic layer, a fourth ferromagnetic layer and a second nonmagnetic layer. A magnetization of the third ferromagnetic layer is rotated by a passed current to produce oscillation. The fourth ferromagnetic layer is stacked with the third ferromagnetic layer along the stacking direction. A magnetization of the fourth ferromagnetic layer is fixed in a second direction. The second nonmagnetic layer is provided between the third ferromagnetic layer and the fourth ferromagnetic layer. Each of the bit lines includes a first to a third bit interconnection. Each of the first to third bit interconnections is connected to one of the memory cells provided at the facing portion. The first bit interconnection is directly or indirectly connected to a first end of the first stacked unit of the one of the memory cells on a side opposite to the intermediate interconnection. The second bit interconnection is directly or indirectly connected to a second end of the second stacked unit of the one of the memory cells on a side opposite to the intermediate interconnection. The third bit interconnection is directly or indirectly connected to the intermediate interconnection of the one of the memory cells. The selection transistor of the one of the memory cells is disposed at least a position between the first bit interconnection and the first end and a position between the second bit interconnection and the second end. The one of the word lines is connected to the gate of the selection transistor of the one of the memory cells. The reading unit is configured to read out the direction of the magnetization of the second ferromagnetic layer by detecting a change in a frequency of the oscillation of the third ferromagnetic layer in accordance with the direction of the magnetization of the second ferromagnetic layer.

According to another embodiment, a nonvolatile memory device includes a first magnetic memory element, a second magnetic memory element, a first bit interconnection, a second bit interconnection, a third bit interconnection, a fourth bit interconnection, a fifth bit interconnection, a first selection transistor, a second selection transistor, a third selection transistor, a fourth selection transistor, a first word interconnection, a second word interconnection and a control unit. The first magnetic memory element includes a first stacked unit, a second stacked unit and a first intermediate interconnection. The first stacked unit includes a first ferromagnetic layer, a second ferromagnetic layer and a first nonmagnetic layer. A magnetization of the first ferromagnetic layer is fixed in a first direction. The second ferromagnetic layer is stacked with the first ferromagnetic layer along the stacking direction. A direction of a magnetization of the second ferromagnetic layer is variable. The first nonmagnetic layer is provided between the first ferromagnetic layer and the second ferromagnetic layer. The second stacked unit is stacked with the first stacked unit along the stacking direction and includes a third ferromagnetic layer, a fourth ferromagnetic layer and a second nonmagnetic layer. A magnetization of the third ferromagnetic layer is rotated by a passed current to produce oscillation. The fourth ferromagnetic layer is stacked with the third ferromagnetic layer along the stacking direction. A magnetization of the fourth ferromagnetic layer is fixed in a second direction. The second nonmagnetic layer is provided between the third ferromagnetic layer and the fourth ferromagnetic layer. The first intermediate interconnection is provided between the first stacked unit and the second stacked unit. The second magnetic memory element is juxtaposed to the first magnetic memory element along a direction orthogonal to the stacking direction. The second magnetic memory element includes a third stacked unit, a fourth stacked unit and a second intermediate interconnection. The third stacked unit includes a fifth ferromagnetic layer, a sixth ferromagnetic layer and a third nonmagnetic layer. A magnetization of the fifth ferromagnetic layer is fixed in a third direction. The sixth ferromagnetic layer is stacked with the fifth ferromagnetic layer along the stacking direction. A direction of a magnetization of the sixth ferromagnetic layer is variable. The third nonmagnetic layer is provided between the fifth ferromagnetic layer and the sixth ferromagnetic layer. The fourth stacked unit is stacked with the third stacked unit along the stacking direction and includes a seventh ferromagnetic layer, an eighth ferromagnetic layer and a fourth nonmagnetic layer. A magnetization of the seventh ferromagnetic layer is rotated by a passed current to produce oscillation. A frequency of the oscillation changes in accordance with the direction of the magnetization of the sixth ferromagnetic layer. The eighth ferromagnetic layer is stacked with the seventh ferromagnetic layer along the stacking direction. A magnetization of the eighth ferromagnetic layer is fixed in a fourth direction. The fourth nonmagnetic layer is provided between the seventh ferromagnetic layer and the eighth ferromagnetic layer. The second intermediate interconnection is provided between the third stacked unit and the fourth stacked unit. The first bit interconnection is directly or indirectly connected to a first end of the first stacked unit on a side opposite to the first intermediate interconnection. The second bit interconnection is directly or indirectly connected to a second end of the second stacked unit on a side opposite to the first intermediate interconnection. The third bit interconnection is directly or indirectly connected to the first intermediate interconnection and the second intermediate interconnection. The fourth bit interconnection is directly or indirectly connected to a third end of the third stacked unit on a side opposite to the second intermediate interconnection. The fifth bit interconnection is directly or indirectly connected to a fourth end of the fourth stacked unit on a side opposite to the second intermediate interconnection. The first selection transistor is disposed between the first bit interconnection and the first end. The second selection transistor is connected between the first intermediate interconnection and the third bit interconnection. The third selection transistor is disposed between the fourth bit interconnection and the third end. The fourth selection transistor is connected between the second intermediate interconnection and the third bit interconnection. The first word interconnection is directly or indirectly connected to a gate of the first selection transistor and a gate of the third selection transistor. The second word interconnection is directly or indirectly connected to a gate of the second selection transistor and a gate of the fourth selection transistor. The control unit is connected to the first to fifth bit interconnections and includes a reading unit configured to read out the direction of the magnetization of the second ferromagnetic layer by detecting the change in the frequency of the oscillation of the third ferromagnetic layer or configured to read out the direction of the magnetization of the sixth ferromagnetic layer by detecting the change in the frequency of the oscillation of the seventh ferromagnetic layer.

Various embodiments will be described hereinafter with reference to the accompanying drawings.

The drawings are schematic or conceptual; and the relationships between the thickness and width of portions, the proportions of sizes among portions, etc., are not necessarily the same as the actual values thereof. Further, the dimensions and proportions may be illustrated differently among drawings, even for identical portions.

In the specification of this application and the drawings, components similar to those described in regard to a drawing thereinabove are marked with the same reference numerals, and a detailed description is omitted as appropriate.

First Embodiment

FIG. 1 is a schematic view illustrating the configuration of a nonvolatile memory device according to a first embodiment.

As shown in FIG. 1, a nonvolatile memory device 610 according to the embodiment includes a magnetic memory element 110 and a control unit 550. The control unit 550 includes a reading unit 510. The magnetic memory element 110 includes a stacked body SB0. The stacked body SB0 includes a first stacked unit SB1 and a second stacked unit SB2.

The first stacked unit SB1 includes a first ferromagnetic layer 10, a second ferromagnetic layer 20, and a first nonmagnetic layer 10n.

In the first ferromagnetic layer 10, the magnetization (the magnetization of the first ferromagnetic layer 10) is fixed in a first direction. The first direction has, for example, a component perpendicular to the film surface of the first ferromagnetic layer 10. The "film surface" is a surface parallel to the major surface of the layer and corresponds to a "layer surface." However, the embodiment is not limited thereto but the first direction is arbitrary. In the following, first, an example in the case where the first direction has a component perpendicular to the film surface of the first ferromagnetic layer 10 is described. That is, in the first ferromagnetic layer 10, the magnetization is fixed in the first direction having a component perpendicular to the film surface.

In the second ferromagnetic layer 20, the direction of the magnetization (the magnetization of the second ferromagnetic layer 20) is variable. The direction of the magnetization of the second ferromagnetic layer 20 is variable. The direction of the magnetization of the second ferromagnetic layer 20 is, for example, perpendicular to the film surface (the film surface of the second ferromagnetic layer 20). However, the embodiment is not limited thereto but the direction of the magnetization of the second ferromagnetic layer 20 is arbitrary. In the following, an example in the case where the direction of the magnetization of the second ferromagnetic layer 20 has a component perpendicular to the film surface of the second ferromagnetic layer 20 is described.

The first nonmagnetic layer 10n is provided between the first ferromagnetic layer 10 and the second ferromagnetic layer 20.

That is, the first ferromagnetic layer 10, the second ferromagnetic layer 20, and the first nonmagnetic layer 10n are stacked. The direction (axis) along which the first ferromagnetic layer 10, the second ferromagnetic layer 20, and the first nonmagnetic layer 10n are stacked is referred to as a stacking direction SD1. The stacking direction SD1 is, for example, perpendicular to the film surface of the first ferromagnetic layer 10.

For convenience of description, the stacking direction SD1 is taken as a Z-axis. One axis perpendicular to the Z-axis is taken as an X-axis. The axis perpendicular to the Z-axis and the X-axis is taken as a Y-axis.

In the specification of this application, "stack" includes not only the case where a plurality of layers are stacked in contact with each other but also the case where a plurality of layers are stacked via other components.

The second stacked unit SB2 is stacked with the first stacked unit SB1 along the stacking direction SD1. The second stacked unit SB2 includes a third ferromagnetic layer 30, a fourth ferromagnetic layer 40, and a second nonmagnetic layer 20n.

In the third ferromagnetic layer 30, the magnetization (the magnetization of the third ferromagnetic layer 30) is rotated by a passed current to produce oscillation. In the third ferromagnetic layer 30, the direction of the magnetization (the magnetization of the third ferromagnetic layer 30) is variable. The direction of the magnetization of the third ferromagnetic layer 30 is, for example, parallel to the film surface of the third ferromagnetic layer 30. However, the embodiment is not limited thereto but the direction of the magnetization of the third ferromagnetic layer 30 is arbitrary. In the following, an example in the case where the direction of the magnetization of the third ferromagnetic layer 30 has a component parallel to the film surface of the third ferromagnetic layer 30 is described.

The fourth ferromagnetic layer 40 is stacked with the third ferromagnetic layer 30 along the stacking direction SD1. In the fourth ferromagnetic layer 40, the magnetization (the magnetization of the fourth ferromagnetic layer 40) is fixed in a second direction. The second direction is, for example, a direction having a component perpendicular to the film surface of the fourth ferromagnetic layer 40. However, the embodiment is not limited thereto but the second direction is arbitrary. In the following, first, an example in the case where the second direction has a component perpendicular to the film surface of the fourth ferromagnetic layer 40 is described.

The second nonmagnetic layer 20n is provided between the third ferromagnetic layer 30 and the fourth ferromagnetic layer 40.

In this example, the stacked body SB0 further includes a third nonmagnetic layer 30n. The third nonmagnetic layer 30n is provided between the first stacked unit SB1 and the second stacked unit SB2. The third nonmagnetic layer 30n is provided as necessary and may be omitted.

Furthermore, in this example, the nonvolatile memory device 610 further includes a first interconnection 81 and a second interconnection 82. The first interconnection 81 is directly or indirectly connected to one end of the stacked body SB0 (for the sake of convenience, assumed to be the end on the side of the first stacked unit SB1). The second interconnection 82 is directly or indirectly connected to the other end of the stacked body SB0 (for the sake of convenience, assumed to be the end on the side of the second stacked unit SB2). The first interconnection 81 connects one end of the magnetic memory element 110 and the control unit 550 directly or indirectly. The second interconnection 82 connects the other end of the magnetic memory element 110 and the control unit 550 directly or indirectly. In this example, the second interconnection 82 is connected to the reading unit 510.

Figure 2A:
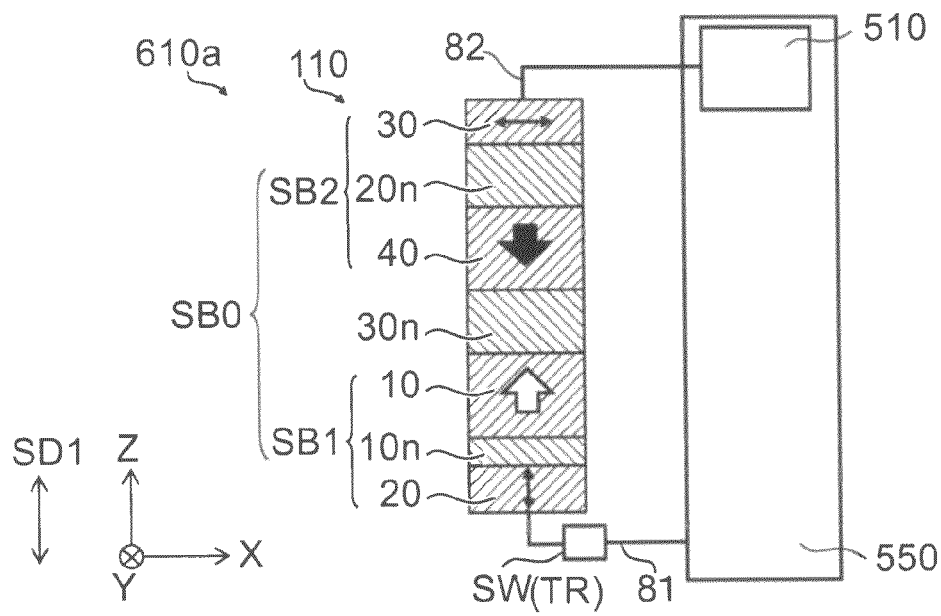
FIG. 2A and FIG. 2B are other nonvolatile memory devices according to the first embodiment.
Figure 2B:
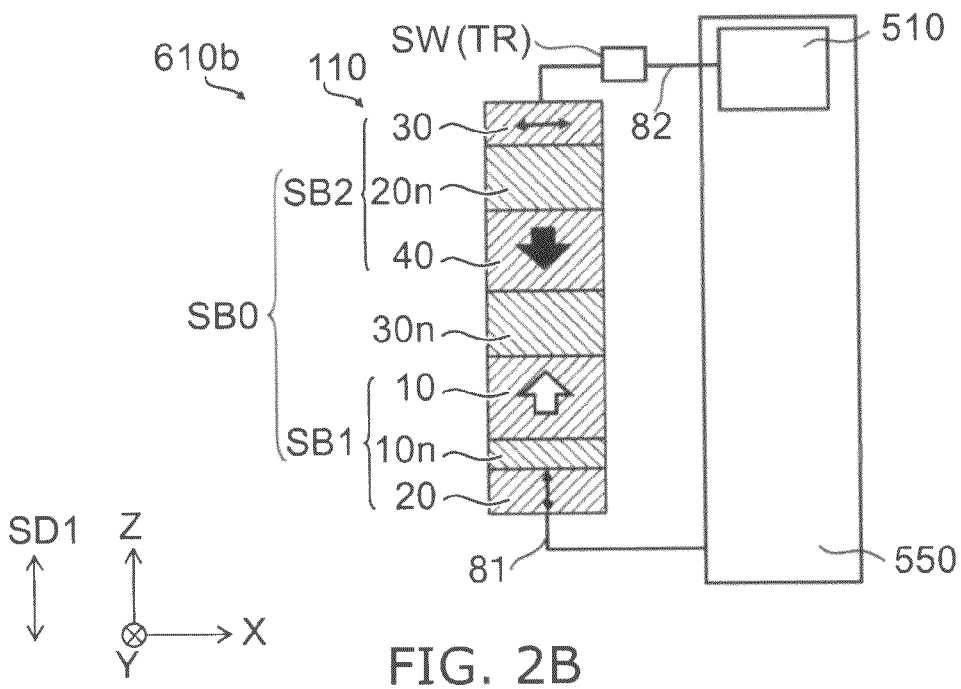

FIG. 2A and FIG. 2B are schematic views illustrating the configurations of other nonvolatile memory devices according to the first embodiment.

As shown in FIG. 2A and FIG. 2B, other nonvolatile memory devices 610a and 610b according to the embodiment further include a switch SW. The switch SW is provided at least one of between the one end of the stacked body SB0 mentioned above and the first interconnection 81 (a first position) and between the other end of the stacked body SB0 mentioned above and the second interconnection 82 (a second position). A selection transistor TR, for example, is used as the switch SW.

In the case where the third nonmagnetic layer 30n is provided and the third nonmagnetic layer 30n and the control unit 550 are electrically connected, the switch SW may be provided between the third nonmagnetic layer 30n and the control unit 550 (a third position).

In the specification of this application, "directly connected" includes a state of being electrically connected with no other conductive member (e.g. a via electrode, an interconnection, etc.) interposed therebetween. "Indirectly connected" includes a state of being electrically connected with another conductive member (e.g. a via electrode, an interconnection, etc.) interposed therebetween and a state of being connected in a state where a switch (e.g. a transistor, etc.) is interposed therebetween to enable switching between conduction and non-conduction.

In the following, for the sake of simple description, the magnetic memory element 110 illustrated in FIG. 1 is described.

The reading unit 510 reads out the direction of the magnetization of the second ferromagnetic layer 20 by detecting the change in the frequency of the oscillation of the third ferromagnetic layer 30 in accordance with the direction of the magnetization of the second ferromagnetic layer 20. The reading unit 510 detects the change in the frequency of the oscillation of the third ferromagnetic layer 30. Thereby, a nonvolatile memory device capable of stable operation can be provided.

An example of the operation of the magnetic memory element 110 will now be described.

In the magnetic memory element 110, for example, an electron whose spin is polarized by passing a current through the stacked body SB0 along the stacking direction SD1 is caused to act on the second ferromagnetic layer 20, and a magnetic field generated by the magnetization of the third ferromagnetic layer 30 becoming uniform in the spin polarization direction of the electron is caused to act on the second ferromagnetic layer 20. Thereby, the direction of the magnetization of the second ferromagnetic layer 20 can be determined to a direction in accordance with the direction of the current. The current mentioned above flows in a direction substantially perpendicular to the film surfaces of the layers of the stacked body SB0.

In the magnetic memory element 110, the first stacked unit SB1 functions as a magnetic memory unit. The second stacked unit SB2 functions as a sensor that reads out the magnetic memory state in the first stacked unit SB1 at the time of reading. Hereinafter, the second stacked unit SB2 may be referred to as a sensor unit and the first stacked unit SB1 may be referred to as a magnetic memory unit, as appropriate.

The first ferromagnetic layer 10 is, for example, a first magnetization fixed layer. In the second ferromagnetic layer 20, for example, the magnetization easy axis is in a direction substantially perpendicular to the film surface. The second ferromagnetic layer 20 functions as a magnetic memory layer. The first nonmagnetic layer 10n functions as a first spacer layer. The first stacked unit SB1 including the first ferromagnetic layer 10, the first nonmagnetic layer 10n, and the second ferromagnetic layer 20 has a structure of, for example, MTJ (magnetic tunnel junction).

The third ferromagnetic layer 30 functions as, for example, a magnetization rotation layer. The fourth ferromagnetic layer 40 functions as, for example, a second magnetization fixed layer in which the magnetization is fixed in a direction substantially perpendicular to the film surface. The second nonmagnetic layer 20n functions as a second spacer layer.

The shapes of the first stacked unit SB1 and the second stacked unit SB2 when projected onto the X-Y plane perpendicular to the Z-axis (when cut along a plane perpendicular to the Z-axis) are, for example, a circle (including a flat circle). In the embodiment, however, the shapes of the first stacked unit SB1 and the second stacked unit SB2 when projected onto the X-Y plane are arbitrary.

In this specific example, a perpendicular magnetization film, for example, is used as the first ferromagnetic layer 10, the second ferromagnetic layer 20, and the fourth ferromagnetic layer 40. An in-plane magnetization film, for example, is used as the third ferromagnetic layer. The perpendicular magnetization film and the in-plane magnetic layer will now be briefly described.

FIG. 3A and FIG. 3B are schematic views illustrating magnetization.

FIG. 3A illustrates the magnetization in a perpendicular magnetization film. FIG. 3B illustrates the magnetization in an in-plane magnetization film.

As shown in FIG. 3A and FIG. 3B, one axis perpendicular to the stacking direction SD1 is taken as an in-plane axis SD2. The in-plane axis SD2 is an axis in the X-Y plane. An out-of-plane magnetization component 72a is defined as to be a projection of the magnetization 72 onto the Z-axis. The out-of-plane magnetization component 72a is parallel to the stacking direction SD1. An in-plane magnetization component 72b is defined as to be a projection of the magnetization 72 onto the X-Y plane. The in-plane magnetization component 72b is parallel to the in-plane axis SD2.

As shown in FIG. 3A, the perpendicular magnetization film has a magnetization state in which the out-of-plane magnetization component 72a is larger than the in-plane magnetization component 72b. In the perpendicular magnetization film, the direction of the magnetization is preferably substantially perpendicular to the film surface in view of operating characteristics.

As shown in FIG. 3B, the in-plane magnetization film has a magnetization state in which the in-plane magnetization component 72b is larger than the out-of-plane magnetization component 72a. In the in-plane magnetization film, the direction of the magnetization is preferably substantially parallel to the film surface in view of operating characteristics.

For convenience of description, the direction from the first stacked unit SB1 toward the second stacked unit SB2 is referred to as "upward" or an "upward direction." The direction from the second stacked unit SB2 toward the first stacked unit SB1 is referred to as "downward" or a "downward direction."

As illustrated in FIG. 1, in this specific example, the first direction (the direction of the magnetization of the first ferromagnetic layer 10) is the upward direction, and the second direction (the direction of the magnetization of the fourth ferromagnetic layer 40) is the downward direction. However, as described later, the first direction and the second direction may be variously altered.

In the magnetic memory element 110, for example, an electronic current can be passed through the stacked body SB0 with a pair of electrodes (an electrode connected to the first interconnection 81 (not shown) and an electrode connected to the second interconnection 82 (not shown)) provided across the stacked body SB0. The electronic current is a flow of electrons. When a current flows upward, the electronic current flows downward.

The second ferromagnetic layer 20 takes the role of storing data. The magnetization of the second ferromagnetic layer 20 can be reversed comparatively easily. In the third ferromagnetic layer 30, for example, the direction of the magnetization becomes uniform in the direction of the spin-polarized electron in writing. In the third ferromagnetic layer 30, for example, a high frequency magnetic field is generated in reading.

When an electronic current is passed in the direction perpendicular to the film surface, the magnetization in the third ferromagnetic layer 30 precesses. Thereby, a rotating magnetic field (a high frequency magnetic field) is generated. Further, the electric potential of the third ferromagnetic layer 30 (the voltage applied across the second stacked unit SB2) makes an alternating current fluctuation. The frequency of the high frequency magnetic field and the frequency of the voltage are, for example, about 1 GHz (gigahertz) to 60 GHz.

In the magnetic memory element 110, the direction of the magnetization of the second ferromagnetic layer 20 can be controlled by passing an electronic current through the stacked body SB0. Specifically, the direction of the magnetization of the second ferromagnetic layer 20 can be reversed by changing the direction of the flow of the electronic current (polarity). When storing information, for example, "0" and "1" are allotted in accordance with the direction of the magnetization of the second ferromagnetic layer 20.

An example of the "write" operation in the magnetic memory element 110 will now be described.

FIG. 4A to FIG. 4D are schematic views illustrating an operation of the magnetic memory element according to the embodiment. The drawings illustrate states of the first stacked unit SB1 in the "write" operation in the magnetic memory element 110. In the drawings, the second stacked unit SB2 and the third nonmagnetic layer 30n are omitted.

FIG. 4A illustrates a state where an electronic current 60 has started to be passed from the first ferromagnetic layer 10 toward the second ferromagnetic layer 20. FIG. 4B illustrates a state where passing the electronic current 60 from the first ferromagnetic layer 10 toward the second ferromagnetic layer 20 has been completed (a state where the magnetization is reversed). FIG. 4C illustrates a state where the electronic current 60 has started to be passed from the second ferromagnetic layer 20 toward the first ferromagnetic layer 10. FIG. 4D illustrates a state where passing the electronic current 60 from the second ferromagnetic layer 20 toward the first ferromagnetic layer 10 has been completed (a state where the magnetization is reversed). FIG. 4C and FIG. 4D correspond to the cases where the direction of the electronic current 60 is reversed in the cases illustrated in FIG. 4A and FIG. 4B, respectively.

In the write operation, the electronic current 60 is passed to cross the film surface of the first ferromagnetic layer 10 and the film surface of the second ferromagnetic layer 20 to perform the write operation on the second ferromagnetic layer 20. Herein, the case is described where the magnetoresistive effect via the first nonmagnetic layer 10n is a normal type.

In the magnetoresistive effect of the "normal type," the electric resistance when the magnetizations of magnetic layers on both sides of a nonmagnetic layer are parallel to each other is lower than the electric resistance when they are antiparallel. In the case of the normal type, the electric resistance between the first ferromagnetic layer 10 and the second ferromagnetic layer 20 via the first nonmagnetic layer 10n is lower when the magnetization of the first ferromagnetic layer 10 is parallel to the magnetization of the second ferromagnetic layer 20 than when antiparallel.

As shown in FIG. 4A, an electron having passed through the first ferromagnetic layer 10 having a magnetization 12a in a direction substantially perpendicular to the film surface obtains a spin in the same direction as the magnetization of the first ferromagnetic layer 10. When the electron flows into the second ferromagnetic layer 20, the angular momentum of the spin is transmitted to the second ferromagnetic layer 20 to act on the magnetization 32 of the second ferromagnetic layer 20. That is, what is called a spin-transfer torque works.

Thereby, as shown in FIG. 4B, the magnetization 32 of the second ferromagnetic layer 20 becomes in the same direction as the magnetization 12a of the first ferromagnetic layer 10. This direction is the upward direction in FIG. 4B, for example one direction parallel to the stacking direction SD1. "0", for example, is allotted to the state of the second ferromagnetic layer 20 having the magnetization 32 in this direction (the upward direction in FIG. 4B).

As shown in FIG. 4C, out of the electrons having passed through the first nonmagnetic layer 10n, an electron having a spin in the same direction as the magnetization 12a of the first ferromagnetic layer 10 (the upward direction in FIG. 4C) passes through the first ferromagnetic layer 10. On the other hand, an electron having a spin in the opposite direction to the magnetization 12a of the first ferromagnetic layer 10 (the downward direction in FIG. 4C) is reflected at the interface between the first ferromagnetic layer 10 and the first nonmagnetic layer 10n. The angular momentum of the spin of the reflected electron is transmitted to the second ferromagnetic layer 20 to act on the magnetization 32 of the second ferromagnetic layer 20.

Thereby, as shown in FIG. 4D, the magnetization 32 of the second ferromagnetic layer 20 becomes in the opposite direction to the magnetization 12a of the first ferromagnetic layer 10 (the downward direction in FIG. 4D). That is, a spin-transfer torque works. "1", for example, is allotted to the state of the second ferromagnetic layer 20 having the magnetization 32 in this direction (the downward direction in FIG. 4D).

"0" or "1" is appropriately allotted to the different states of the second ferromagnetic layer 20 based on such action. Thereby, "writing" in the magnetic memory element 110 is performed.

On the other hand, in the case where the magnetoresistive effect is a "reverse type," the electric resistance between the first ferromagnetic layer 10 and the second ferromagnetic layer 20 via the first nonmagnetic layer 10n is higher when the magnetization of the first ferromagnetic layer 10 is parallel to the magnetization of the second ferromagnetic layer 20 than when antiparallel. The "write" operation in the reverse type is similar to that in the case of the normal type.

In the write operation in the embodiment, there is a case where the magnetic field generated from the sensor unit acts on the reversal of the magnetization in the second ferromagnetic layer 20 to assist the magnetization reversal in the second ferromagnetic layer 20.

Figures 5A, 5B:
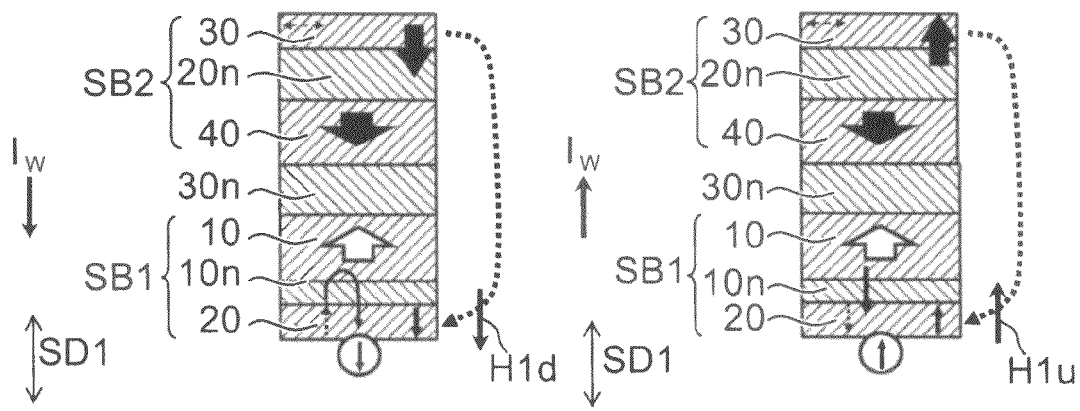
FIG. 5A and FIG. 5B are schematic views showing an operation of the nonvolatile memory device according to the first embodiment.

FIG. 5A and FIG. 5B are schematic views illustrating an operation of the nonvolatile memory device according to the first embodiment.

That is, the drawings illustrate the assist of the reversal magnetization.

In FIG. 5A, when a current (a write current $I_W$) is passed in a direction from the sensor unit toward the magnetic memory unit (the downward direction), the direction of the magnetization of the third ferromagnetic layer 30 of the sensor unit is inclined downward due to the torque received from the spin-polarized electron. As a result, the stray magnetic field H1d generated from the third ferromagnetic layer 30 becomes a downward magnetic field. The downward stray magnetic field H1d is applied to the second ferromagnetic layer 20 of the magnetic memory unit to assist the reversal of the magnetization of the second ferromagnetic layer 20, and the magnetization is reversed efficiently.

In FIG. 5B, when a current (the write current $I_W$) is passed upward, the direction of the third ferromagnetic layer 30 of the sensor unit is inclined upward due to the torque received from the spin-polarized electron. As a result, the stray magnetic field H1u generated from the third ferromagnetic layer 30 becomes an upward magnetic field. The upward stray magnetic field H1u is applied to the second ferromagnetic layer 20 of the magnetic memory unit to assist the reversal of the magnetization of the second ferromagnetic layer 20, and the magnetization is reversed efficiently.

Such a write operation is performed by, for example, the control unit 550.

Next, an example of the "read" operation in the magnetic memory element 110 will now be described.

In the embodiment, the detection of the direction of the magnetization of the second ferromagnetic layer 20 is performed by utilizing the oscillation frequency of the third ferromagnetic layer 30 of the sensor unit.

Figures 6A, 6B:
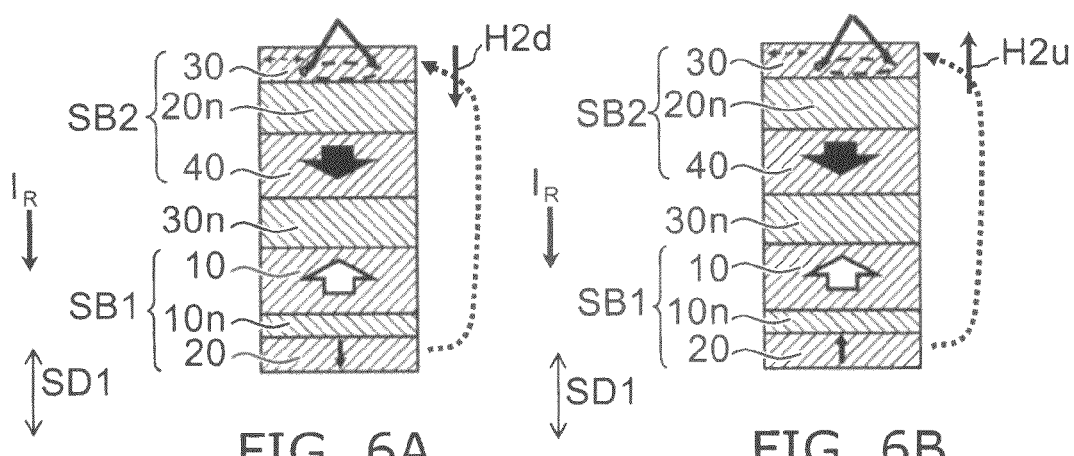
FIG. 6A and FIG. 6B are schematic views showing an operation of the nonvolatile memory device according to the first embodiment.

FIG. 6A and FIG. 6B are schematic views illustrating an operation of the nonvolatile memory device according to the first embodiment.

The drawings illustrate the read operation of the magnetic memory element 110. The drawings illustrate a state where the magnitude of the stray magnetic field applied to the third ferromagnetic layer 30 changes in accordance with the direction of the magnetization of the second ferromagnetic layer 20.

In this example, the first ferromagnetic layer 10, the fourth ferromagnetic layer 40, and the third ferromagnetic layer 30 are stacked in this order above the second ferromagnetic layer 20. The direction of the magnetization of the first ferromagnetic layer 10 is the upward direction, and the direction of the magnetization of the fourth ferromagnetic layer 40 is the downward direction. In the third ferromagnetic layer 30, the magnetization direction exists in the film surface. A read current $I_R$ is passed downward, for example.

As shown in FIG. 6A, when the direction of the magnetization of the second ferromagnetic layer 20 is the downward direction, a downward stray magnetic field H2d is applied in the position of the third ferromagnetic layer 30.

On the other hand, as shown in FIG. 6B, when the direction of the magnetization of the second ferromagnetic layer 20 is the upward direction, an upward stray magnetic field H2u is applied in the position of the third ferromagnetic layer.

Since the direction of the stray magnetic field applied to the third ferromagnetic layer 30 changes between when the direction of the magnetization of the second ferromagnetic layer 20 is the downward direction and when the upward direction, the frequency of the oscillation in the third ferromagnetic layer 30 changes.

Figure 7:
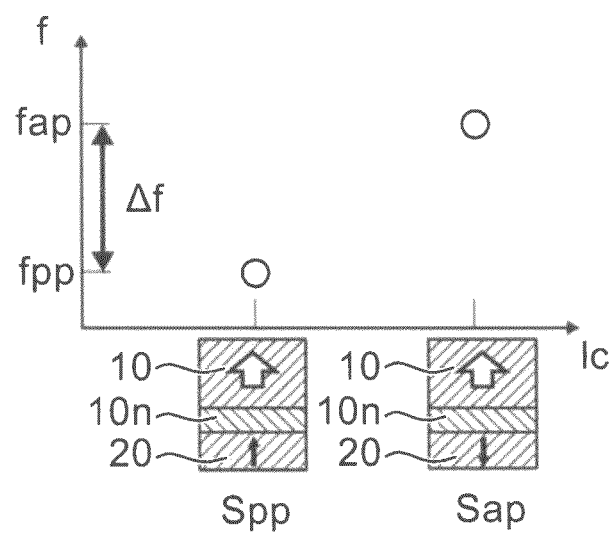
FIG. 7 is a schematic diagram showing an operation of the nonvolatile memory device according to the first embodiment.

FIG. 7 is a schematic diagram illustrating an operation of the nonvolatile memory device according to the first embodiment.

The drawing schematically illustrates the relationship between the direction of the magnetization of the second ferromagnetic layer 20 and the frequency f of the oscillation in the third ferromagnetic layer 30.

When the direction of the magnetization of the second ferromagnetic layer 20 is the upward direction, the direction of the magnetization of the second ferromagnetic layer 20 is the same as the direction of the magnetization of the first ferromagnetic layer 10, which is a parallel state Spp. When the direction of the magnetization of the second ferromagnetic layer 20 is the downward direction, the direction of the magnetization of the second ferromagnetic layer 20 is opposite to the direction of the magnetization of the first ferromagnetic layer 10, which is an antiparallel state Sap.

As shown in FIG. 7, when the direction of the magnetization of the second ferromagnetic layer 20 is the upward direction (the parallel state Spp), the frequency f of the oscillation is a parallel state frequency fpp. When the direction of the magnetization of the second ferromagnetic layer 20 is the downward direction (the antiparallel state Sap), the frequency f of the oscillation is an antiparallel state frequency fap. For example, the parallel state frequency fpp is lower than the antiparallel state frequency fap, and the difference between both (frequency change Δf) is, for example, approximately not less than 100 MHz (megahertz) and not more than 900 MHz.

The change (the frequency change Δf) of the frequency of the oscillation in the third ferromagnetic layer 30 resulting from the change of the direction of the magnetization in the second ferromagnetic layer 20 causes a change in the frequency of the fluctuation of the voltage across the second stacked unit SB2.

The direction of the magnetization in the second ferromagnetic layer 20 can be distinguished by detecting such a change in the frequency using, for example, at least one of a low-pass filter, a band-pass filter, a delay detection circuit, etc.

In the example illustrated in FIG. 7, the frequency band of the antiparallel state Sap is cut off by, for example, a low-pass filter. Thereby, the voltage signal of the parallel state Spp is selectively detected. That is, the magnetization state (the information written in the second ferromagnetic layer 20) can be distinguished based on the presence or absence of a detection signal (a signal that has passed through the low-pass filter).

By relating "0" and "1" to these states of different frequencies, respectively, the memory of two value data can be read out. The direction of the read current $I_R$ is not limited to the direction from the sensor unit toward the magnetic memory unit (the downward direction) but may be the opposite direction (the upward direction).

Such a read operation is performed by, for example, the reading unit 510 provided in the control unit 550.

Figure 8:
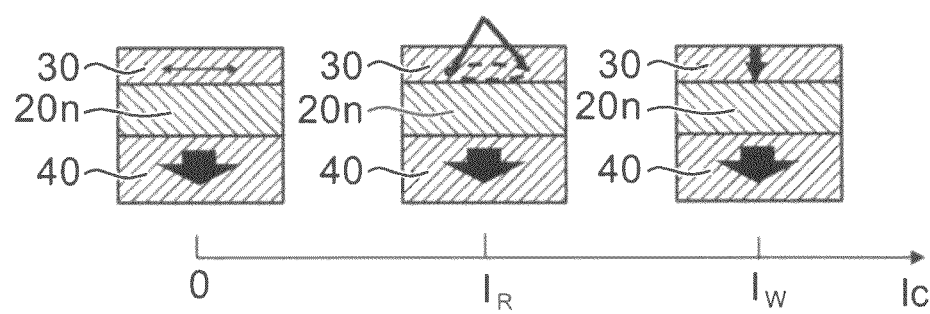
FIG. 8 is a schematic view showing characteristics of the nonvolatile memory device according to the first embodiment.

FIG. 8 is a schematic view illustrating characteristics of the nonvolatile memory device according to the first embodiment.

The drawing illustrates the current Ic used in the operation of the embodiment (the write current $I_W$ and the read current $I_R$).

As shown in FIG. 8, the read current $I_R$ is smaller than the write current $I_W$. When the current Ic flowing through the third ferromagnetic layer 30 is the magnitude of the read current $I_R$, the third ferromagnetic layer 30 oscillates. When the current Ic is the magnitude of the write current $I_W$, the third ferromagnetic layer 30 does not oscillate and the magnetization of the third ferromagnetic layer 30 is uniform in the direction of the spin torque. That is, oscillation occurs in the third ferromagnetic layer 30 at the time of reading, and oscillation does not occur in the third ferromagnetic layer 30 at the time of writing.

By setting to such conditions, the write operation and the read operation mentioned above are separately performed.

The inventors have found that the operating states mentioned above can be obtained when the characteristics of the third ferromagnetic layer 30 and the write current $I_W$ satisfy a prescribed relationship.

The damping coefficient of the third ferromagnetic layer 30 is denoted by α, the magnetization of the third ferromagnetic layer 30 is denoted by Ms (emu/cc=emu/cm³), the volume of the third ferromagnetic layer 30 is denoted by V (cubic centimeter), and the demagnetic field coefficient of the third ferromagnetic layer 30 is denoted by Nz. The stray magnetic field from the first ferromagnetic layer 10, the second ferromagnetic layer 20, and the fourth ferromagnetic layer 40 in the position of the third ferromagnetic layer 30 is denoted by Hs (Oe; oersted). For example, the position of the third ferromagnetic layer 30 is a position of the center of the third ferromagnetic layer 30 along the X-Y-Z axes with respect to the position of the center of the second ferromagnetic layer 20 along the X-Y-Z axes. The write current supplied to the stacked body SB0 in the write operation of setting the magnetization of the second ferromagnetic layer 20 in a prescribed direction is denoted by $I_W$ (A; ampere). When these values satisfy the relationship of Formula 1 below, the operating states mentioned above (the third ferromagnetic layer 30 oscillates at the read current $I_R$; and the third ferromagnetic layer 30 does not oscillate and the magnetization is uniform in the direction of the spin torque at the write current $I_W$) can be obtained. The damping coefficient α and the demagnetic field coefficient Nz are dimensionless constants.

$$\frac{2e\alpha}{\hbar} \cdot \frac{M_s V}{g(\theta)} (4\pi N_z M_s - H_s) < I_w \quad (1)$$

$$\hbar = h/2\pi$$

where e represents the elementary electric charge and approximately $1.60218 \times 10^{-19}$ (A·s; ampere·second). h is the Planck constant and approximately $6.626 \times 10^{-27}$ (erg·s; erg·second). $6.626 \times 10^{-27}$ erg·s (erg·second) is equivalent to $6.626 \times 10^{-34}$ J·s (joule·second). θ (rad; radian) is the angle between the direction of the magnetization of the third ferromagnetic layer 30 and the stacking direction SD1 (the Z-axis). As a system of units, the conversion from "°; degree"

to "rad; radian" is "rad=(2π/360)×degree". g(θ) is the spin polarization efficiency of the third ferromagnetic layer 30.

The inventors of this application have further investigated the characteristics of the magnetization of the third ferromagnetic layer 30 of the magnetic memory element 110.

Figure 9:
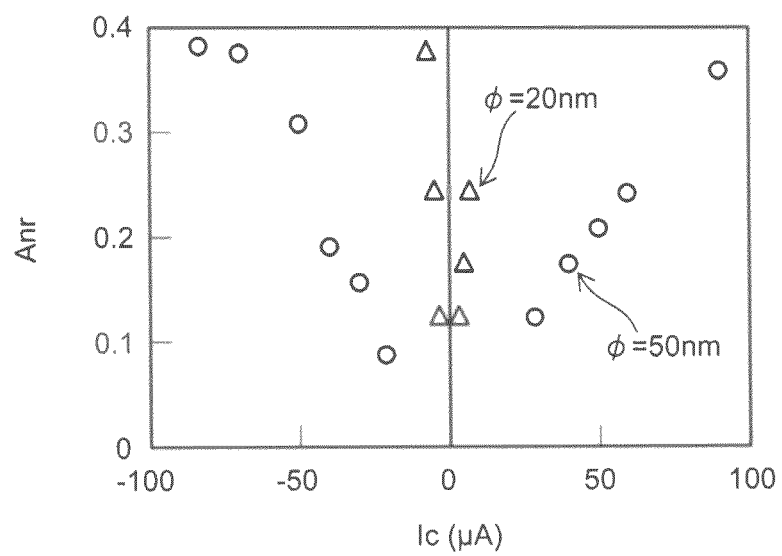
FIG. 9 is a graph showing the characteristics of the nonvolatile memory device according to the first embodiment.

FIG. 9 is a graph illustrating characteristics of the nonvolatile memory device according to the first embodiment.

The drawing illustrates an example of the result of a calculation using micromagnetics of the angle θ of the magnetization of the third ferromagnetic layer 30 in a state where the third ferromagnetic layer 30 oscillates. This calculation employed two models in which the shape of the second stacked unit SB2 when projected onto the X-Y plane is a circle and the diameter φ thereof is 20 nm (nanometers) and 50 nm. The ratio of the component parallel to the Z-axis of the magnetization vector of the third ferromagnetic layer 30 to the magnetization vector (the film-surface-perpendicular-direction proportion) has been found. The horizontal axis is the current Ic (μA; microampere) flowing through the third ferromagnetic layer 30. The vertical axis is the film-surface-perpendicular-direction proportion Anr of magnetization (the ratio of the component parallel to the Z-axis of the magnetization vector of the third ferromagnetic layer 30 to the magnetization vector when the third ferromagnetic layer 30 keeps the oscillation state).

FIG. 9 shows that the proportion Anr of the manetization component in z-axis to the magnetization in the third ferromagnetic layer 30 is 0.4 or less.

According to the findings revealed by such a micromagnetics analysis, the operating states mentioned above can be obtained when the damping coefficient α of the third ferromagnetic layer 30, the magnetization Ms of the third ferromagnetic layer 30, the volume V of the third ferromagnetic layer 30, the demagnetic field coefficient Nz of the third ferromagnetic layer 30, the stray magnetic field Hs from the first ferromagnetic layer 10, the second ferromagnetic layer 20, and the fourth ferromagnetic layer 40 in the position of the third ferromagnetic layer 30, and the write current $I_W$ satisfy the relationship of Formula 2 below.

$$\frac{2e\alpha}{\hbar} \cdot \frac{M_s V}{g(\theta)} (4\pi N_z M_s - H_s) < I_w \quad (2)$$

$$\hbar = h/2\pi$$

When a magnetic field near the resonance frequency of the second ferromagnetic layer 20 is applied to the second ferromagnetic layer 20, the reversal of the magnetization of the second ferromagnetic layer 20 is assisted by the resonance effect. According to the findings obtained by the inventors of this application, the resonance effect occurs in the second ferromagnetic layer 20 when an external magnetic field in a band within ±1 GHz with respect to the resonance frequency of the second ferromagnetic layer 20 is applied to the second ferromagnetic layer 20.

To suppress false writing at the time of reading, preferably writing does not take place in the second ferromagnetic layer 20 at a current of the magnitude of the read current $I_R$, and further the frequency f of the oscillation in the third ferromagnetic layer 30 is preferably in a frequency band in which the resonance effect in the second ferromagnetic layer 20 does not occur.

That is, the upper limit $f_{max}$ of the frequency f of the oscillation of the sensor unit is given by Formula 3 below.

$$f_{max} = \frac{\gamma}{2\pi}(4\pi N_z M_s - H_s) \quad (3)$$

where Ms is the magnetization of the third ferromagnetic layer 30, Nz is the demagnetic field coefficient of the third ferromagnetic layer 30, γ is the gyromagnetic ratio of the third ferromagnetic layer 30 (approximately 17.6×10^6 Hz/Oe; hertz/oersted), and Hs is the stray magnetic field (Oe; oersted) from the first ferromagnetic layer 10, the second ferromagnetic layer 20, and the fourth ferromagnetic layer 40 in the position of the third ferromagnetic layer 30.

On the other hand, the resonance frequency $f_0$ in the second ferromagnetic layer 20 of the first stacked unit SB1 is given by Formula 4 below.

$$f_0 = \frac{\gamma'}{2\pi}(H_k - 4\pi N_z' M_s' \pm H_s') \quad (4)$$

where Ms' (emu/cc) is the magnetization of the second ferromagnetic layer 20. Nz' is the demagnetic field coefficient of the second ferromagnetic layer 20. γ' is the gyromagnetic ratio of the second ferromagnetic layer 20 (approximately 17.6×10^6 Hz/Oe; hertz/oersted). Hs' (Oe) is the stray magnetic field from the first ferromagnetic layer 10, the third ferromagnetic layer 30, and the fourth ferromagnetic layer 40 in the position of the second ferromagnetic layer 20. The demagnetic field coefficient Nz' is a dimensionless constant. Hk (Oe; oersted) is the anisotropic magnetic field of the second ferromagnetic layer 20.

To suppress false writing at the time of reading, the absolute value of the difference between $f_{max}$ and $f_0$ is preferably 1 GHz or more. That is, $|f_{max}-f_0|>10^9$ (hertz) preferably holds.

Accordingly, to suppress false writing, the configuration (including material etc.) of the sensor unit and the magnetic memory unit preferably satisfies Formula 5 or Formula 6 below.

$$\frac{\gamma}{2\pi}(4\pi N_z M_s - H_s) < \frac{\gamma'}{2\pi}(H_k - 4\pi N_z' M_s' \pm H_s') - 10^9 \quad (5)$$

$$\frac{\gamma}{2\pi}(4\pi N_z M_s - H_s) > \frac{\gamma'}{2\pi}(H_k - 4\pi N_z' M_s' \pm H_s') + 10^9 \quad (6)$$

For example, Hs'=0 when the direction of the magnetization of the first ferromagnetic layer 10 (the first direction) is set to the opposite direction to the direction of the magnetization of the fourth ferromagnetic layer 40 (the second direction) so that the stray magnetic field may be canceled for the third ferromagnetic layer 30.

Furthermore, according to the findings described in regard to, for example, FIG. 9 (the findings regarding the angle θ of the magnetization of the third ferromagnetic layer 30 at the time of oscillation found by the inventors of this application through a micromagnetics analysis), Formula 7 below is derived from Formula 5 and Formula 6 above.

$$\frac{\gamma}{2\pi}(0.4 \times 4\pi N_z M_s - H_s) < \frac{\gamma'}{2\pi}(H_k - 4\pi N_z' M_s' \pm H_s') - 10^9 \quad (7)$$

-continued $$\frac{\gamma}{2\pi}(0.4 \times 4\pi N_z M_s - H_s) > \frac{\gamma'}{2\pi}(H_k - 4\pi N'_z M'_s \pm H'_s) + 10^9$$

False writing can be suppressed by satisfying one of the two conditions shown in Formula 7 above.

In the nonvolatile memory device 610 according to the embodiment, in the write operation, an electron whose spin is polarized by passing a current through the stacked body SB0 along the stacking direction SD1 is caused to act on the second ferromagnetic layer 20; thereby, the direction of the magnetization of the second ferromagnetic layer 20 can be determined to a direction in accordance with the direction of the current. In the read operation, the frequency at which the magnetization of the third ferromagnetic layer 30 rotates changes with the direction of the magnetization of the second ferromagnetic layer 20. The direction of the magnetization of the second ferromagnetic layer 20 can be read out by detecting the difference in the frequency f of the rotation of the magnetization of the third ferromagnetic layer 30.

Since the magnetic memory state of the second ferromagnetic layer 20 of the magnetic memory unit is detected as the difference in the frequency f of the oscillation of the third ferromagnetic layer 30 of the sensor unit, the S/N ratio in the read operation does not depend on the MR ratio of the magnetic memory unit. Since the permissible range for the MR ratio is widened, the permissible selection range of the material used for the magnetic memory unit can be widened. In the case where the stray magnetic field of the third ferromagnetic layer 30 is caused to act on the second ferromagnetic layer 20 to assist the magnetization reversal at the time of writing, since the current of the read operation causes the reversal of the second ferromagnetic layer 20 less easily, false writing can be prevented. In a structure in which an intermediate interconnection described later is provided between the sensor unit and the magnetic memory unit, a configuration is possible in which a current does not go through the magnetic memory unit in the reading operation, and therefore false writing at the time of reading can be prevented.

An example of the various stacked configurations of the stacked body SB0 in the magnetic memory element used for the nonvolatile memory device 610 according to the embodiment will now be described.

Figures 10A, 10B:
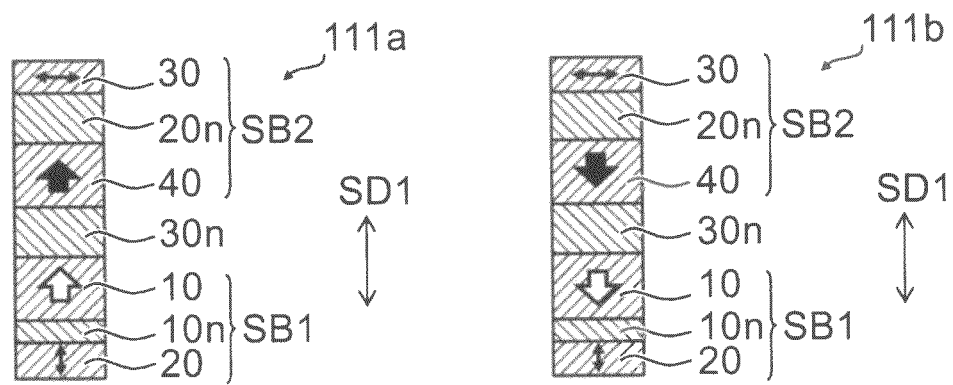
FIG. 10A and FIG. 10B are schematic cross-sectional views showing the configurations of parts of nonvolatile memory devices according to the first embodiment.

FIG. 10A and FIG. 10B are schematic cross-sectional views illustrating the configurations of parts of nonvolatile memory devices according to the first embodiment.

As shown in FIG. 10A and FIG. 10B, in magnetic memory elements 111a and 111b, the first ferromagnetic layer 10 is disposed between the second ferromagnetic layer 20 and the fourth ferromagnetic layer 40, and the fourth ferromagnetic layer 40 is disposed between the first ferromagnetic layer 10 and the third ferromagnetic layer 30. The third nonmagnetic layer 30n is disposed between the first ferromagnetic layer 10 and the fourth ferromagnetic layer 40. The configuration in which the first to fourth ferromagnetic layers 10 to 40 are arranged in such an order is referred to as a first stacked configuration for the sake of convenience.

In the magnetic memory element 111a, the magnetization of the first ferromagnetic layer 10 is in the upward direction and also the magnetization of the fourth ferromagnetic layer 40 is in the upward direction. In the magnetic memory element 111b, the magnetization of the first ferromagnetic layer 10 is in the downward direction and also the magnetization of the fourth ferromagnetic layer 40 is in the downward direction.

FIG. 11A and FIG. 11B are schematic cross-sectional views illustrating the configurations of parts of nonvolatile memory devices according to the first embodiment.

As shown in FIG. 11A and FIG. 11B, also in magnetic memory elements 112a and 112b, the stacked body SB0 has the first stacked configuration. The magnetic memory element 112b has the same configuration as the magnetic memory element 110 illustrated in FIG. 1.

In the magnetic memory element 112a, the magnetization of the first ferromagnetic layer 10 is in the upward direction and the magnetization of the fourth ferromagnetic layer 40 is in the downward direction. In the magnetic memory element 112b, the magnetization of the first ferromagnetic layer 10 is in the downward direction and the magnetization of the fourth ferromagnetic layer 40 is in the upward direction.

FIG. 12A and FIG. 12B are schematic cross-sectional views illustrating the configurations of parts of nonvolatile memory devices according to the first embodiment.

As shown in FIG. 12A and FIG. 12B, in magnetic memory elements 112c and 112d, the stacked body SB0 has the first stacked configuration. In these, the direction of the magnetization of the first ferromagnetic layer 10 and the direction of the magnetization of the fourth ferromagnetic layer 40 are oblique to the film surface. Also in this case, the direction of the magnetic component in Z-axis of the magnetization fixed in the first direction (the magnetization of the first ferromagnetic layer 10) is opposite to the direction of the magnetic component in Z-axis of the magnetization fixed in the second direction (the magnetization of the fourth ferromagnetic layer 40).

FIG. 13A and FIG. 13B are schematic cross-sectional views illustrating the configurations of parts of nonvolatile memory devices according to the first embodiment.

As shown in FIG. 13A and FIG. 13B, in magnetic memory elements 121a and 121b, the second ferromagnetic layer 20 is disposed between the first ferromagnetic layer 10 and the third ferromagnetic layer 30, and the third ferromagnetic layer 30 is disposed between the second ferromagnetic layer 20 and the fourth ferromagnetic layer 40. The third nonmagnetic layer 30n is disposed between the second ferromagnetic layer 20 and the third ferromagnetic layer 30. The configuration in which the first to fourth ferromagnetic layers 10 to 40 are arranged in such an order is referred to as a second stacked configuration for the sake of convenience.

FIG. 14A and FIG. 14B are schematic cross-sectional views illustrating the configurations of parts of nonvolatile memory devices according to the first embodiment.

As shown in FIG. 14A and FIG. 14B, in magnetic memory elements 131a and 131b, the second ferromagnetic layer 20 is disposed between the first ferromagnetic layer 10 and the fourth ferromagnetic layer 40, and the fourth ferromagnetic layer 40 is disposed between the second ferromagnetic layer 20 and the third ferromagnetic layer 30. The third nonmagnetic layer 30n is disposed between the second ferromagnetic layer 20 and the fourth ferromagnetic layer 40. The configuration in which the first to fourth ferromagnetic layers 10 to 40 are arranged in such an order is referred to as a third stacked configuration for the sake of convenience.

FIG. 15A and FIG. 15B are schematic cross-sectional views illustrating the configurations of parts of nonvolatile memory devices according to the first embodiment.

As shown in FIG. 15A and FIG. 15B, in magnetic memory elements 141a and 141b, the first ferromagnetic layer 10 is disposed between the second ferromagnetic layer 20 and the third ferromagnetic layer 30, and the third ferromagnetic layer 30 is disposed between the first ferromagnetic layer 10 and the fourth ferromagnetic layer 40. The third nonmagnetic layer 30n is disposed between the first ferromagnetic layer 10 and the third ferromagnetic layer 30. The configuration in which the first to fourth ferromagnetic layers 10 to 40 are arranged in such an order is referred to as a fourth stacked configuration for the sake of convenience.

In the magnetic memory elements 121a and 121b having the second stacked configuration, the magnetic memory elements 131a and 131b having the third stacked configuration, and the magnetic memory elements 141a and 141b having the fourth stacked configuration, the direction of the magnetic component in Z-axis of the magnetization fixed in the first direction (the magnetization of the first ferromagnetic layer 10) is opposite to the direction of the component in Z-axis of the magnetization fixed in the second direction (the magnetization of the fourth ferromagnetic layer 40). In the second to fourth stacked configurations, the direction of the component in Z-axis of the magnetization of the first ferromagnetic layer 10 may be the same as the direction of the component in Z-axis of the magnetization of the fourth ferromagnetic layer 40.

Furthermore, in the second to fourth stacked configurations, the directions of the magnetization of the first ferromagnetic layer 10 and the magnetization of the fourth ferromagnetic layer 40 may be oblique to the film surface.

FIG. 16A to FIG. 16D are schematic cross-sectional views illustrating the configurations of parts of nonvolatile memory devices according to the first embodiment.

The drawings illustrate examples of the direction of the magnetization in the second stacked unit SB2. In the drawings, the first stacked unit SB1 (and the third nonmagnetic layer 30n) in the magnetic memory element is omitted.

As shown in FIG. 16A, in a magnetic memory element 151, a perpendicular magnetization film is used as the fourth ferromagnetic layer 40, and an in-plane magnetization film is used as the third ferromagnetic layer 30.

As shown in FIG. 16B, in a magnetic memory element 152, a perpendicular magnetization film is used as the fourth ferromagnetic layer 40, and a perpendicular magnetization film is used as the third ferromagnetic layer 30.

As shown in FIG. 16C, in a magnetic memory element 153, an in-plane magnetization film is used as the fourth ferromagnetic layer 40, and an in-plane magnetization film is used as the third ferromagnetic layer 30.

As shown in FIG. 16D, in a magnetic memory element 154, the second stacked unit SB2 further includes a reference layer 41 and an intermediate layer for the reference layer 21n. The reference layer 41 is stacked with the third ferromagnetic layer 30 along the stacking direction. The intermediate layer for the reference layer 21n is disposed between the third ferromagnetic layer 30 and the reference layer 41. The third ferromagnetic layer 30 is disposed between the fourth ferromagnetic layer 40 and the reference layer 41. The magnetization of the reference layer 41 is fixed. In this example, a perpendicular magnetization film is used as the fourth ferromagnetic layer 40. An in-plane magnetization film is used as the third ferromagnetic layer 30. An in-plane magnetization film is used as the reference layer 41. A nonmagnetic layer is used as the intermediate layer for the reference layer 21n.

In the magnetic memory elements 151 to 154, the directions of the magnetizations of the layers may be inclined with respect to the stacking direction SD1.

FIG. 17A and FIG. 17B are schematic cross-sectional views illustrating the configurations of parts of nonvolatile memory devices according to the first embodiment.

The drawings illustrate examples of the direction of the magnetization in the second stacked unit SB2. In the drawings, the first stacked unit SB1 (and the third nonmagnetic layer 30n) in the magnetic memory element is omitted.

As shown in FIG. 17A, in a magnetic memory element 161, a perpendicular magnetization film is used as the first ferromagnetic layer 10, and an perpendicular magnetization film is used as the second ferromagnetic layer 20.

As shown in FIG. 17B, in a magnetic memory element 162, an in-plane magnetization film is used as the first ferromagnetic layer 10, and an in-plane magnetization film is used as the second ferromagnetic layer 20.

In the magnetic memory elements 161 and 162, the directions of the magnetizations of the layers may be inclined with respect to the stacking direction SD1.

Thus, in the embodiment, the configuration of the layers included in the magnetic memory element can be variously altered.

As the first ferromagnetic layer 10 and the second ferromagnetic layer 20, a metal material including at least one element selected from the group consisting of iron (Fe), cobalt (Co), nickel (Ni), manganese (Mn), and chromium (Cr), for example, is preferably used. In addition, an alloy by the combination of at least one selected from the group mentioned above and at least one element selected from the group consisting of platinum (Pt), palladium (Pd), iridium (Ir), ruthenium (Ru), and rhodium (Rh) may be used.

The characteristics of the first ferromagnetic layer 10 and the second ferromagnetic layer 20 can be adjusted by the composition of the magnetic material contained and heat treatment. Furthermore, as the first ferromagnetic layer 10 and the second ferromagnetic layer 20, an amorphous alloy of rare earth-transition metal such as TbFeCo and GdFeCo may be used. A stacked structure such as Co/Pt, Co/Pd, and Co/Ni may be used as the first ferromagnetic layer 10 and the second ferromagnetic layer 20. Co/Ru, Fe/Au, Ni/Cu, and the like become a perpendicular magnetization film depending on the combination with the underlayer. Co/Ru, Fe/Au, Ni/Cu, and the like can be used as the first ferromagnetic layer 10 and the second ferromagnetic layer 20 by controlling the crystalline orientation direction of the film. The first ferromagnetic layer 10 and the second ferromagnetic layer 20 may contain an additive such as aluminum (Al), germanium (Ge), nitrogen (N), phosphorus (P), arsenic (As), boron (B), and silicon (Si).

An insulating material functioning as a nonmagnetic tunnel barrier layer may be used as the first nonmagnetic layer 10n. Specifically, for example, an oxide, nitride, or fluoride including at least one element selected from the group consisting of aluminum (Al), titanium (Ti), zinc (Zn), zirconium (Zr), tantalum (Ta), cobalt (Co), nickel (Ni), silicon (Si), magnesium (Mg), and iron (Fe) may be used.

As the first nonmagnetic layer 10n, for example, $Al_2O_3$, $SiO_2$, MgO, AlN, Ta—O, Al—Zr—O, $Bi_2O_3$, $MgF_2$, $CaF_2$, $SrTiO_3$, $AlLaO_3$, Al—N—O, Si—N—O, and the like may be used. In addition, for example, a nonmagnetic semiconductor ($ZnO_x$, InMn, GaN, GaAs, $TiO_x$, Zn, and Te or these materials doped with a transition metal) and the like may be used as the first nonmagnetic layer 10n.

The thickness of the first nonmagnetic layer 10n is preferably set to a value in a range approximately from 0.2 nm to 2.0 nm. Thereby, for example, an excessive high resistance is suppressed while ensuring the uniformity of the insulating film.

As the second nonmagnetic layer 20n, for example, one of a nonmagnetic tunnel barrier layer and a nonmagnetic metal layer may be used.

An insulating material, for example, is used as the nonmagnetic tunnel barrier layer. Specifically, for example, an oxide, nitride, or fluoride including at least one element selected from the group consisting of aluminum (Al), titanium (Ti), zinc (Zn), zirconium (Zr), tantalum (Ta), cobalt (Co), nickel (Ni), silicon (Si), magnesium (Mg), and iron (Fe) may be used as the nonmagnetic tunnel barrier layer. In addition, as the nonmagnetic tunnel barrier layer, for example, $Al_2O_3$, $SiO_2$, MgO, AlN, Ta—O, Al—Zr—O, $Bi_2O_3$, $MgF_2$, $CaF_2$, $SrTiO_3$, $AlLaO_3$, Al—N—O, Si—N—O, and the like may be used.

As the nonmagnetic tunnel barrier layer, a nonmagnetic semiconductor ($ZnO_x$, InMn, GaN, GaAs, $TiO_x$, Zn, and Te or these materials doped with a transition metal) and the like may be used.

In the case where a nonmagnetic tunnel barrier layer is used as the second nonmagnetic layer $20n$, the thickness of the second nonmagnetic layer $20n$ is preferably set to a value in a range approximately from 0.2 nm to 2.0 nm.

As the nonmagnetic metal layer used as the second nonmagnetic layer $20n$, for example, a nonmagnetic metal selected from the group consisting of copper (Cu), silver (Ag), gold (Au), chromium (Cr), zinc (Zn), gallium (Ga), niobium (Nb), molybdenum (Mo), ruthenium (Ru), palladium (Pd), hafnium (Hf), tantalum (Ta), tungsten (W), platinum (Pt), and bismuth (Bi) or an alloy including at least two elements selected from the group mentioned above may be used. The thickness of the second nonmagnetic layer $20n$ is preferably made not less than 1.5 nm and not more than 20 nm. Thereby, an interlayer coupling does not occur between magnetic layers, and the loss of the spin polarization state of a conduction electron is suppressed when the conduction electron passes through the nonmagnetic metal layer.

Similar materials and configurations (stack configurations, thicknesses, etc.) to the second nonmagnetic layer $20n$ described above may be used for the intermediate layer for the reference layer $21n$.

As the third ferromagnetic layer 30, for example, a magnetic metal including at least one element selected from the group consisting of iron (Fe), cobalt (Co), nickel (Ni), manganese (Mn), and chromium (Cr) may be used. Furthermore, an alloy by the combination of at least one selected from the group mentioned above and at least one element selected from the group consisting of platinum (Pt), palladium (Pd), iridium (Ir), ruthenium (Ru), and rhodium (Rh) may be used.

The characteristics of the third ferromagnetic layer 30 can be adjusted by the composition of the magnetic material contained and heat treatment. The third ferromagnetic layer 30 may contain an additive such as aluminum (Al), germanium (Ge), nitrogen (N), phosphorus (P), arsenic (As), boron (B), and silicon (Si). In addition, as the third ferromagnetic layer 30, a stacked structure such as Co/Pt, Co/Pd, and Co/Ni may be used. Co/Ru, Fe/Au, Ni/Cu, and the like can be used as the third ferromagnetic layer 30 by controlling the crystalline orientation direction of the film.

As the fourth ferromagnetic layer 40, a metal material including at least one element selected from the group consisting of iron (Fe), cobalt (Co), nickel (Ni), manganese (Mn), and chromium (Cr) is preferably used. Furthermore, an alloy by the combination of these and at least one element selected from the group consisting of platinum (Pt), palladium (Pd), iridium (Ir), ruthenium (Ru), and rhodium (Rh) may be used.

The characteristics of the fourth ferromagnetic layer 40 can be adjusted by the composition of the magnetic material contained and heat treatment. As the fourth ferromagnetic layer 40, an amorphous alloy of rare earth-transition metal such as TbFeCo and GdFeCo may be used. In addition, as the fourth ferromagnetic layer 40, a stacked structure such as Co/Pt, Co/Pd, and Co/Ni may be used. Co/Ru, Fe/Au, Ni/Cu, and the like become a perpendicular magnetization film depending on the combination with the underlayer. Co/Ru, Fe/Au, Ni/Cu, and the like can be used as the fourth ferromagnetic layer 40 by controlling the crystalline orientation direction of the film. The fourth ferromagnetic layer 40 may contain an additive such as aluminum (Al), germanium (Ge), nitrogen (N), phosphorus (P), arsenic (As), boron (B), and silicon (Si).

A nonmagnetic metal layer is used as the third nonmagnetic layer $30n$.

As the nonmagnetic metal layer used as the third nonmagnetic layer $30n$, at least one nonmagnetic metal selected from the group consisting of copper (Cu), silver (Ag), gold (Au), chromium (Cr), zinc (Zn), gallium (Ga), niobium (Nb), molybdenum (Mo), ruthenium (Ru), palladium (Pd), hafnium (Hf), tantalum (Ta), tungsten (W), platinum (Pt), bismuth (Bi), iridium (Ir), and osmium (Os) or an alloy including two or more elements selected from the group mentioned above may be used.

As the third nonmagnetic layer $30n$, a material with a long spin diffusion length such as copper (Cu) or a material with a short spin diffusion length such as ruthenium (Ru) may be used. In the case where it is desirable to cancel the effect of spin-polarized electrons being interposed, a material with a short spin diffusion length such as ruthenium (Ru) is preferably used as the third nonmagnetic layer $30n$.

As described above, in the magnetic memory element 110, a pair of electrodes for passing an electronic current through the stacked body SB0 are provided.

A conductive magnetic material or a conductive nonmagnetic material is used as the electrode. Specific examples of the conductive magnetic material include a material similar to the material used as the third ferromagnetic layer 30 and the fourth ferromagnetic layer 40.

Specific examples of the conductive nonmagnetic material include a metal selected from the group consisting of gold (Au), copper (Cu), chromium (Cr), zinc (Zn), gallium (Ga), niobium (Nb), molybdenum (Mo), ruthenium (Ru), palladium (Pd), silver (Ag), hafnium (Hf), tantalum (Ta), tungsten (W), platinum (Pt), bismuth (Bi), and aluminum (Al) or an alloy including two or more selected from the group mentioned above.

In addition, as the conductive nonmagnetic material used as the electrode, a material such as carbon nanotube, carbon nanowire, and graphene is given.

As the conductive protection film provided for the electrode, an alloy including at least one element selected from the group consisting of tantalum (Ta), ruthenium (Ru), copper (Cu), gold (Au), silver (Ag), and aluminum (Al) or a material such as graphene may be used. An element selected from the group consisting of copper (Cu) and aluminum (Al) or an alloy including them is preferably used as the protection film from the viewpoint of being resistant to electromigration and low resistive.

As described above, the shapes of the first stacked unit SB1 and the second stacked unit SB2 when projected onto the X-Y plane are arbitrary. For example, the shapes of the first stacked unit SB1 and the second stacked unit SB2 when projected onto the X-Y plane (the cross-sectional shape taken along a plane parallel to the film surface) may be a circle, ellipse, flat circle, and polygon having three or more angles such as a tetragon and hexagon.

The shapes of the first stacked unit SB1 and the second stacked unit SB2 when cut along a plane parallel to the Z-axis are arbitrary. The shapes of the first stacked unit SB1 and the second stacked unit SB2 when cut along a plane parallel to the Z-axis (the cross-sectional shape taken along a plane perpendicular to the film surface) may have, for example, a tapered shape or an inverse tapered shape.

In the first stacked configuration (e.g. the magnetic memory elements 112a and 112b etc.), the first ferromagnetic layer 10 and the fourth ferromagnetic layer 40 may be coupled antiferromagnetically via the third nonmagnetic layer 30n. Such a structure in which mutual magnetization directions are coupled antiferromagnetically via a nonmagnetic layer to become antiparallel is called a synthetic antiferromagnet (SAF) structure. In this example, the stacked structure of "a first magnetic layer (e.g. the first ferromagnetic layer 10)/a nonmagnetic layer (e.g. the third nonmagnetic layer 30n)/a second magnetic layer (e.g. the fourth ferromagnetic layer 40)" corresponds to the SAF structure.

Using the SAF structure can enhance the mutual magnetization fixing strength and increase resistance to external magnetic fields and thermal stability. In the structure, the stray magnetic field applied in the direction perpendicular to the film surface in the position of the magnetic memory layer (e.g. the second ferromagnetic layer 20) can be made almost zero.

A metal material such as ruthenium (Ru), iridium (Ir), and osmium (Os) is used as the nonmagnetic layer (intermediate layer) of the SAF structure. The thickness of the nonmagnetic layer is set not more than 3 nm. Thereby, a sufficiently strong antiferromagnetic coupling is obtained via the nonmagnetic layer.

That is, in the SAF structure, the third nonmagnetic layer 30n preferably contains a metal selected from the group consisting of ruthenium (Ru), osmium (Os), and iridium (Ir) or an alloy including at least two selected from the group, and the thickness of the third nonmagnetic layer 30n is preferably not more than 3 nm.

The dimensions (width, thickness, etc.) of the layers included in the magnetic memory element according to the embodiment are found through an electron microscope photographic image or the like, for example.

In the second stacked configuration (e.g. the magnetic memory elements 121a and 121b etc.), if the spin information is kept in the third nonmagnetic layer 30n, the third ferromagnetic layer 30 is affected by the spin-transfer torque from the second ferromagnetic layer 20. This may cause a decrease in the controllability of the magnetization rotation of the third ferromagnetic layer 30.

At this time, as the third nonmagnetic layer 30n, a film with a short spin diffusion length such as, for example, ruthenium (Ru) (a material having the function of spin cancel) or a layer having a structure with a short spin diffusion length is preferably used. This can suppress the decrease in the controllability of the magnetization rotation of the third ferromagnetic layer 30.

That is, the magnitude of the spin-transfer torque for the magnetization of the third ferromagnetic layer 30 to precess is determined by the spin polarization in the fourth ferromagnetic layer 40. In this configuration, the magnetization of the third ferromagnetic layer 30 can be independently controlled without being affected by the spin of other electrons (spin-transfer torque).

As the material of the third nonmagnetic layer 30n providing such a spin cancel effect, a metal selected from the group consisting of ruthenium (Ru), tantalum (Ta), tungsten (W), platinum (Pt), palladium (Pd), molybdenum (Mo), niobium (Nb), zirconium (Zr), titanium (Ti), and vanadium (V) or an alloy including two or more selected from the group can be given.

In the second stacked configuration, the thickness of the third nonmagnetic layer 30n is preferably set to a value that does not cause an interlayer magnetic coupling between the second ferromagnetic layer 20 and the third ferromagnetic layer 30. Specifically, the thickness of the third nonmagnetic layer 30n is preferably set not less than 1.4 nm.

In the second stacked configuration, if the thickness of the third nonmagnetic layer 30n is not less than 1.4 nm, the second ferromagnetic layer 20 and the third ferromagnetic layer 30 are not interlayer-coupled, and the spin polarization degree can be canceled in the third nonmagnetic layer 30n when conduction electrons pass through the interior and interface of the third nonmagnetic layer 30n. Furthermore, the third nonmagnetic layer 30n can prevent the precession of the third ferromagnetic layer 30 from changing due to the direction of the magnetization of the second ferromagnetic layer 20.

On the other hand, if the thickness of the third nonmagnetic layer 30n exceeds 20 nm, the pillar formation of a multiple-layer film is difficult. Furthermore, the strength of the magnetic field generated from the second ferromagnetic layer 20 decreases in the position of the third ferromagnetic layer 30. Therefore, the thickness of the third nonmagnetic layer 30n is preferably set not more than 20 nm.

In the second stacked configuration, as the third nonmagnetic layer 30n, a stacked film may be used as well as the single-layer film described above. The stacked film may have, for example, a stacked configuration of the following layers: a layer containing a metal selected from the group consisting of ruthenium (Ru), tantalum (Ta), tungsten (W), platinum (Pt), palladium (Pd), molybdenum (Mo), niobium (Nb), zirconium (Zr), titanium (Ti), and vanadium (V) or an alloy including two or more selected from the group; and a copper (Cu) layer stacked at least on one side of the layer.

In addition, in the second stacked configuration, the stacked film used as the third nonmagnetic layer 30n may have, for example, a stacked configuration including the following layers: a first layer containing a metal selected from the group consisting of ruthenium (Ru), tantalum (Ta), tungsten (W), platinum (Pt), palladium (Pd), molybdenum (Mo), niobium (Nb), zirconium (Zr), titanium (Ti), and vanadium (V) or an alloy including two or more selected from the group; and a second layer stacked at least on one side of the first layer and containing an oxide including at least one element selected from the group consisting of aluminum (Al), magnesium (Mg), titanium (Ti), iron (Fe), cobalt (Co), nickel (Ni), vanadium (V), chromium (Cr), tantalum (Ta), tungsten (W), and ruthenium (Ru).

FIG. 18 is a schematic cross-sectional view illustrating the configuration of part of a nonvolatile memory device according to the first embodiment.

As shown in FIG. 18, a magnetic memory element 112bs further includes a magnetic shield 51 opposed to at least part of the side surface of the stacked body SB0. In this example, the magnetic shield 51 is further opposed to the side surface of the second stacked unit SB2 and the side surface of the third nonmagnetic layer 30n. The magnetic shield 51 covers the above-mentioned at least part of the side surface of the stacked body SB0.

In addition, the magnetic memory element 112bs further includes a protection layer 52 provided between the above-mentioned at least part of the side surface of the stacked body SB0 and the magnetic shield 51.

For example, the side surface of the first stacked unit SB1 and the side surface of the second stacked unit SB2 are covered with the magnetic shield 51 such as a permalloy (Py) via the protection layer 52 such as, for example, SiN or $Al_2O_3$.

Thereby, in the case where a plurality of magnetic memory elements are arranged, the possibility is decreased that the stray magnetic field from an adjacent magnetic memory element affects the operation of the first stacked unit SB1 and the second stacked unit SB2. For example, since the effective magnetic field that acts on the first stacked unit SB1 is substantially equal between cells, the variation in the reversal current between bits is suppressed. Also in the second stacked unit SB2, the variation in the oscillation current is similarly suppressed. Furthermore, the possibility is decreased that the stray magnetic field from the first stacked unit SB1 and the second stacked unit SB2 acts on an adjacent magnetic memory element. As a consequence, the plurality of magnetic memory elements can be closely arranged to improve the integration degree.

As the protection layer 52, an oxide, nitride, or fluoride including at least one element selected from the group consisting of aluminum (Al), titanium (Ti), zinc (Zn), zirconium (Zr), tantalum (Ta), cobalt (Co), nickel (Ni), silicon (Si), magnesium (Mg), and iron (Fe) may be used.

As the magnetic shield 51, an element selected from the group consisting of iron (Fe), cobalt (Co), nickel (Ni), manganese (Mn), and chromium (Cr) or an alloy including two or more selected from the group may be used.

In addition, as the magnetic shield 51, an alloy by the combination of at least one element selected from the group consisting of iron (Fe), cobalt (Co), nickel (Ni), manganese (Mn), and chromium (Cr) and at least one element selected from the group consisting of platinum (Pt), palladium (Pd), iridium (Ir), ruthenium (Ru), and rhodium (Rh) may be used.

The characteristics of the magnetic shield 51 can be adjusted by the composition of the magnetic material contained in the magnetic shield 51 and heat treatment. Furthermore, as the magnetic shield 51, an amorphous alloy of rare earth-transition metal such as TbFeCo and GdFeCo may be used. Furthermore, a stacked structure such as Co/Pt, Co/Pd, and Co/Ni may be used as the magnetic shield 51.

The magnetic shield 51 (and the protection layer 52) mentioned above may be provided also in any magnetic memory element used for the nonvolatile memory device according to the embodiment.

Second Embodiment

FIG. 19 is a schematic view illustrating the configuration of a nonvolatile memory device according to a second embodiment.

As shown in FIG. 19, in a nonvolatile memory device 620 according to the embodiment, the stacked body SB0 of a magnetic memory element 210 includes the first stacked unit SB1, the second stacked unit SB2, and the third nonmagnetic layer 30n. The nonvolatile memory device 620 includes an interconnection (an intermediate interconnection 83) directly or indirectly connected to the third nonmagnetic layer 30n in addition to the magnetic memory element 210 and the control unit 550. The nonvolatile memory device 620 further includes the first interconnection 81 and the second interconnection 82.

Although not shown in FIG. 19, the nonvolatile memory device 620 may further include the switch SW (e.g. the selection transistor TR) provided between the third nonmagnetic layer 30n and the intermediate interconnection 83. That is, the nonvolatile memory device 620 may include the switch SW provided at least one of between one end of the stacked body SB0 and the first interconnection 81 (the first position), between the other end of the stacked body SB0 and the second interconnection 82 (the second position), and between the third nonmagnetic layer 30n and the intermediate interconnection 83 (the third position).

One of the configurations of the magnetic memory elements described in regard to the first embodiment may be used for the magnetic memory element 210 in the nonvolatile memory device 620. In regard to the configuration of the magnetic memory element 210, a description of portions that may be configured similarly to the first embodiment is omitted. Also in the magnetic memory element 210, the magnetic shield 51 (and the protection layer 52) may be further provided. In the following, the case is described where the magnetic memory element 210 has a similar configuration to the magnetic memory element 110.

In the nonvolatile memory device 620, the path of the current flowing in the write operation may be different from the path of the current flowing in the read operation.

Figure 20A:
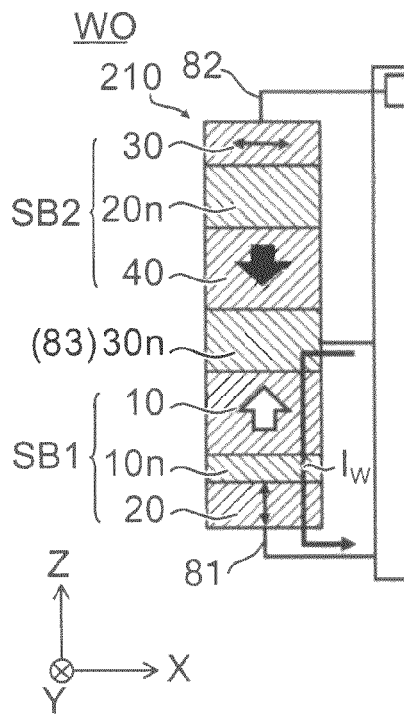
FIG. 20A and FIG. 20B are schematic views showing operations of the nonvolatile memory device according to the second embodiment.
Figure 20B:
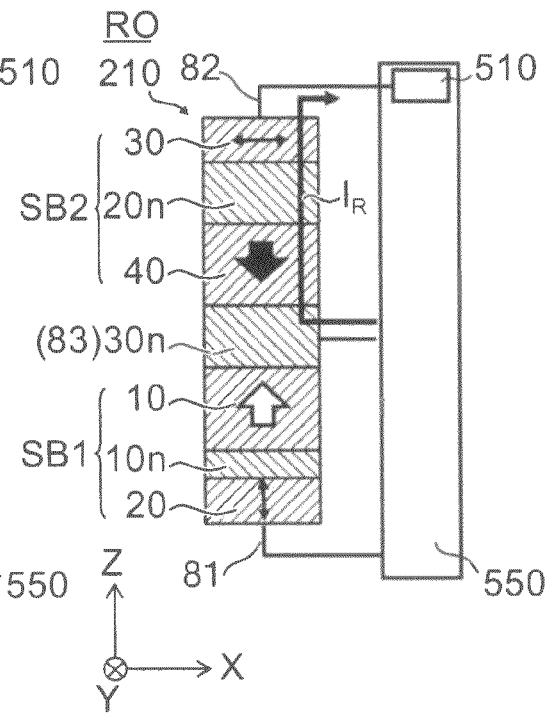

FIG. 20A and FIG. 20B are schematic views illustrating operations of the nonvolatile memory device according to the second embodiment.

FIG. 20A illustrates the write operation WO, and FIG. 20B illustrates the read operation RO.

As shown in FIG. 20A, in the write operation WO, the write current $I_W$ is supplied through a path passing through the intermediate interconnection 83 (the third nonmagnetic layer 30n) and the first stacked unit SB1. In the write operation WO, no current flows through the second stacked unit SB2 (the sensor unit).

As shown in FIG. 20B, in the read operation RO, the read current $I_R$ is supplied through a path passing through the intermediate interconnection 83 (the third nonmagnetic layer 30n) and the second stacked unit SB2. In the read operation RO, if the direction of the magnetization of the second ferromagnetic layer 20 is different, the stray magnetic field in the position of the third ferromagnetic layer 30 is different. The memory state of the second ferromagnetic layer 20 can be read out by detecting the difference in the oscillation frequency in the third ferromagnetic layer 30 with the reading unit 510. In the read operation RO, since the read current $I_R$ does not flow through the first stacked unit SB1, false writing due to the read operation RO is suppressed.

Figure 21A:
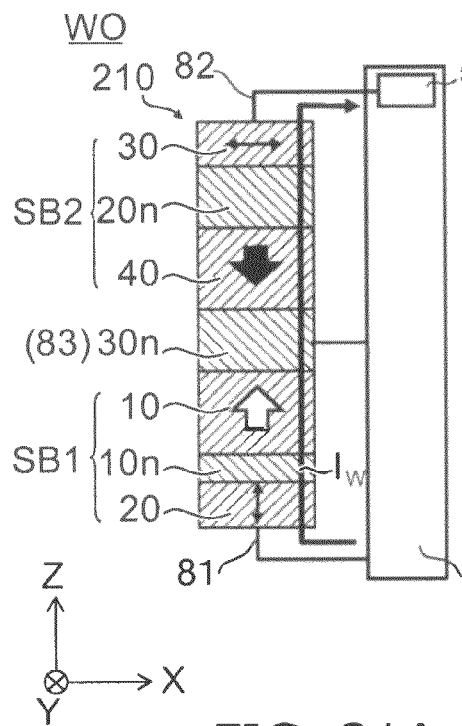
FIG. 21A and FIG. 21B are schematic views showing other operations of the nonvolatile memory device according to the second embodiment.
Figure 21B:
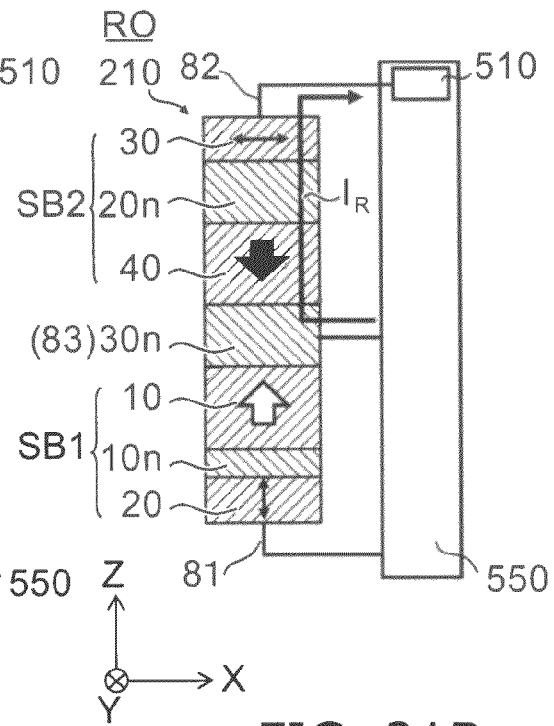

FIG. 21A and FIG. 21B are schematic views illustrating other operations of the nonvolatile memory device according to the second embodiment.

FIG. 21A illustrates the write operation WO, and FIG. 21B illustrates the read operation RO.

As shown in FIG. 21A, in the write operation WO in this example, the write current $I_W$ is supplied through a path passing through the first stacked unit SB1 and the second stacked unit SB2. In the case where the direction of the magnetization of the first ferromagnetic layer 10 is opposite to the direction of the magnetization of the fourth ferromagnetic layer 40, the magnetization of the third ferromagnetic layer 30 is uniform along the direction of the spin torque, and therefore the reversal of the magnetization of the second ferromagnetic layer 20 is assisted.

As shown in FIG. 21B, in the read operation RO, the read current $I_R$ is supplied through a path passing through the intermediate interconnection 83 (the third nonmagnetic layer 30n) and the second stacked unit SB2. Thereby, the memory state of the second ferromagnetic layer 20 is read out as the difference in the oscillation frequency in the third ferromagnetic layer 30. Furthermore, false writing due to the read operation RO is suppressed.

Thus, the nonvolatile memory device 620 according to the embodiment can suppress false writing and perform stable operation.

FIG. 22A to FIG. 22E are schematic cross-sectional views illustrating the configurations of parts of nonvolatile memory devices according to the second embodiment.

Figure 22A:
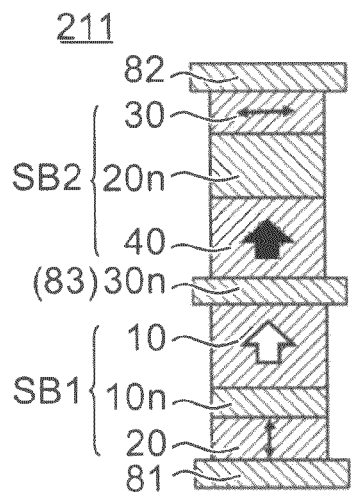
FIG. 22A to FIG. 22E are schematic cross-sectional views showing the configurations of parts of nonvolatile memory devices according to the second embodiment.
Figure 22B:
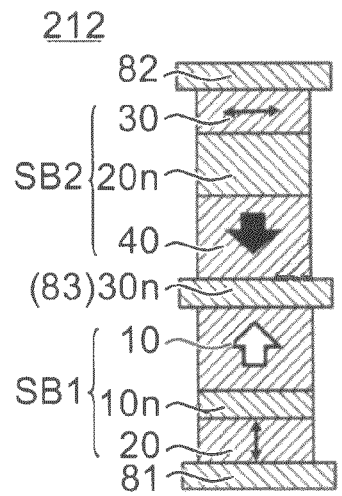

As shown in FIG. 22A and FIG. 22B, magnetic memory elements 211 and 212 used for the nonvolatile memory device 620 according to the embodiment may have the first stacked configuration.

Figure 22C:
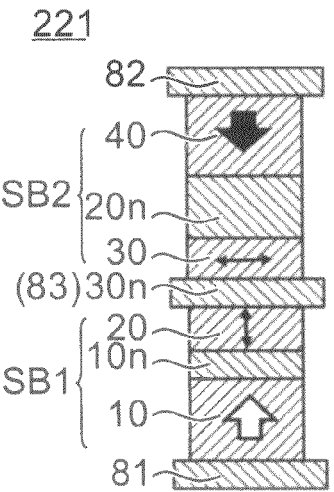
Figure 22D:
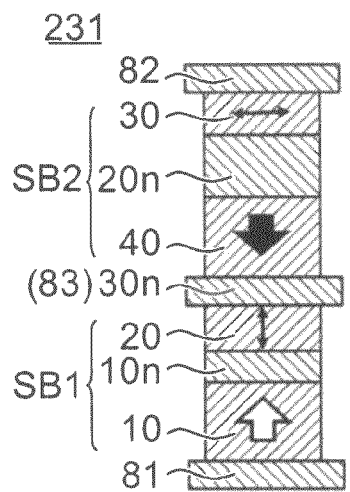
Figure 22E:
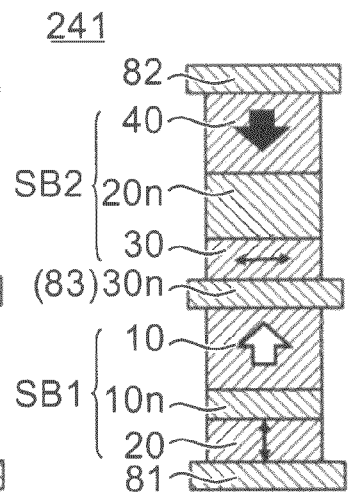

As shown in FIG. 22C to FIG. 22E, magnetic memory elements 221, 231, and 241 used for the nonvolatile memory device 620 according to the embodiment may have the second to fourth stacked configurations.

In the magnetic memory element 211, the direction of the magnetization of the first ferromagnetic layer 10 is the same as the direction of the magnetization of the fourth ferromagnetic layer 40. In the magnetic memory elements 212, 221, 231, and 241, the direction of the magnetization of the first ferromagnetic layer 10 is opposite to the direction of the magnetization of the fourth ferromagnetic layer 40. In the second to fourth stacked configurations, the direction of the magnetization of the first ferromagnetic layer 10 may be opposite to the direction of the magnetization of the fourth ferromagnetic layer 40. In the first to fourth stacked configurations, the directions of the magnetizations of the layers may be inclined with respect to the stacking direction.

In these examples, a perpendicular magnetization film is used as the first ferromagnetic layer 10, the second ferromagnetic layer 20, and the fourth ferromagnetic layer 40, and an in-plane magnetization film is used as the third ferromagnetic layer 30. However, the embodiment is not limited thereto. For example, the second stacked unit SB2 may be variously altered as described in regard to FIGS. 16A to 16D. For example, the first stacked unit SB1 may be variously altered as described in regard to FIGS. 17A and 17B.

As illustrated in FIG. 19, the magnetic memory element used for the nonvolatile memory device 620 according to the embodiment includes the first stacked unit SB1, the second stacked unit SB2, and the third nonmagnetic layer 30n. The third nonmagnetic layer 30n has a first surface 31f and a second surface 32f. The first surface 31f and the second surface 32f are perpendicular to the stacking direction SD1. The second surface 32f is the surface on the side opposite to the first surface 31f. At least part of the first surface 31f faces the first stacked unit SB1. At least part of the second surface 32f faces the second stacked unit SB2. In this example, at least part of the third nonmagnetic layer 30n is disposed between the first stacked unit SB1 and the second stacked unit SB2.

Third Embodiment

Figure 23:
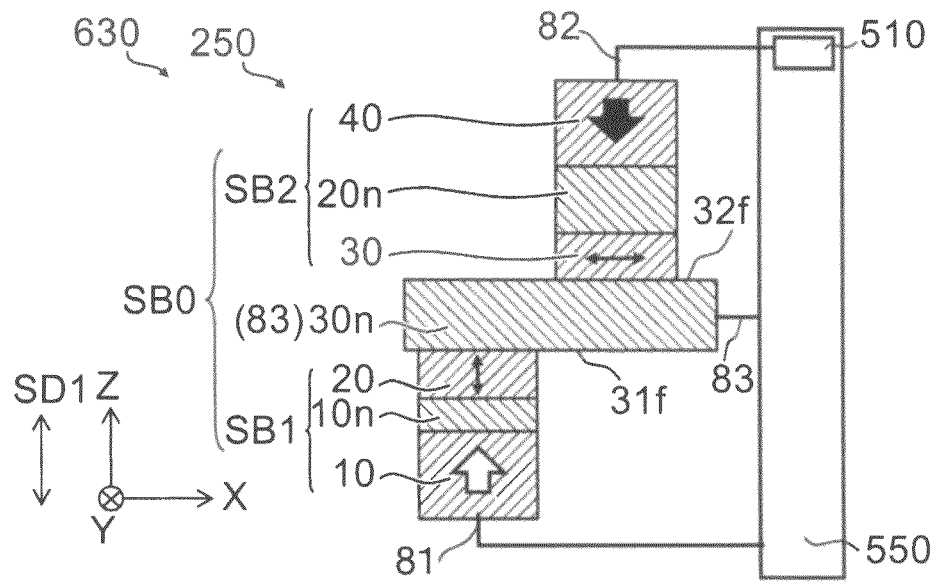
FIG. 23 is a schematic view showing the configuration of a nonvolatile memory device according to a third embodiment.

FIG. 23 is a schematic view illustrating the configuration of a nonvolatile memory device according to a third embodiment.

As shown in FIG. 23, a nonvolatile memory device 630 according to the embodiment includes a magnetic memory element 250, the control unit 550, and the intermediate interconnection 83. The magnetic memory element 250 includes the first stacked unit SB1, the second stacked unit SB2, and the third nonmagnetic layer 30n. The first stacked unit SB1, the second stacked unit SB2, and the third nonmagnetic layer 30n are referred to as the stacked body SB0 for the sake of convenience. The intermediate interconnection 83 is directly or indirectly connected to the third nonmagnetic layer 30n. The nonvolatile memory device 630 further includes the first interconnection 81 and the second interconnection 82. The control unit 550 includes the reading unit 510.

The third nonmagnetic layer 30n includes the first surface 31f and the second surface 32f (the surface on the side opposite to the first surface 31f). At least part of the first surface 31f faces the first stacked unit SB1. At least part of the second surface 32f faces the second stacked unit SB2. In this example, when projected onto the X-Y plane, the first stacked unit SB1 does not include a portion overlapping with the second stacked unit SB2. The third nonmagnetic layer 30n does not include a portion between the first stacked unit SB1 and the second stacked unit SB2. Otherwise, the configuration may be similar to the configuration described in regard to the second embodiment, and a description is therefore omitted.

Also in the nonvolatile memory device 630 thus configured, the stray magnetic field from the first stacked unit SB1 acts on the third ferromagnetic layer 30. Therefore, the direction of the magnetization of the second ferromagnetic layer 20 can be read out by using the reading unit 510 to detect the change in the frequency f of the oscillation of the third ferromagnetic layer 30 in accordance with the direction of the magnetization of the second ferromagnetic layer 20.

Thereby, false writing in the read operation RO can be suppressed and stable operation can be performed.

Also in the embodiment, the stack configuration (the order of the first to fourth ferromagnetic layers 10 to 40) in the magnetic memory element is arbitrary. Furthermore, the directions of the magnetizations of the layers may be variously altered similarly to those described in regard to the first embodiment.

Thus, in the embodiment, the first stacked unit SB1 may not overlap with the second stacked unit SB2 when projected onto the X-Y plane. Furthermore, when projected onto the X-Y plane, at least part of the first stacked unit SB1 may overlap with the second stacked unit SB2.

In the first to third embodiments, the position along the Z-axis of the layer (the layer perpendicular to the Z-axis) including the first stacked unit SB1 is different from the position along the Z-axis of the layer (the layer perpendicular to the Z-axis) including the second stacked unit SB2. That is, the first stacked unit SB1 is not juxtaposed to the second stacked unit SB2 in the X-Y plane. The position along the Z-axis of the first stacked unit SB1 (the magnetic memory unit) is different from the position along the Z-axis of the second stacked unit SB2 (the sensor unit). Thereby, since the sensor unit and the magnetic memory unit are not disposed in the same X-Y plane, the memory density can be made higher than in the case where the sensor unit and the magnetic memory unit are disposed in the same X-Y plane.

Fourth Embodiment

Figure 24:
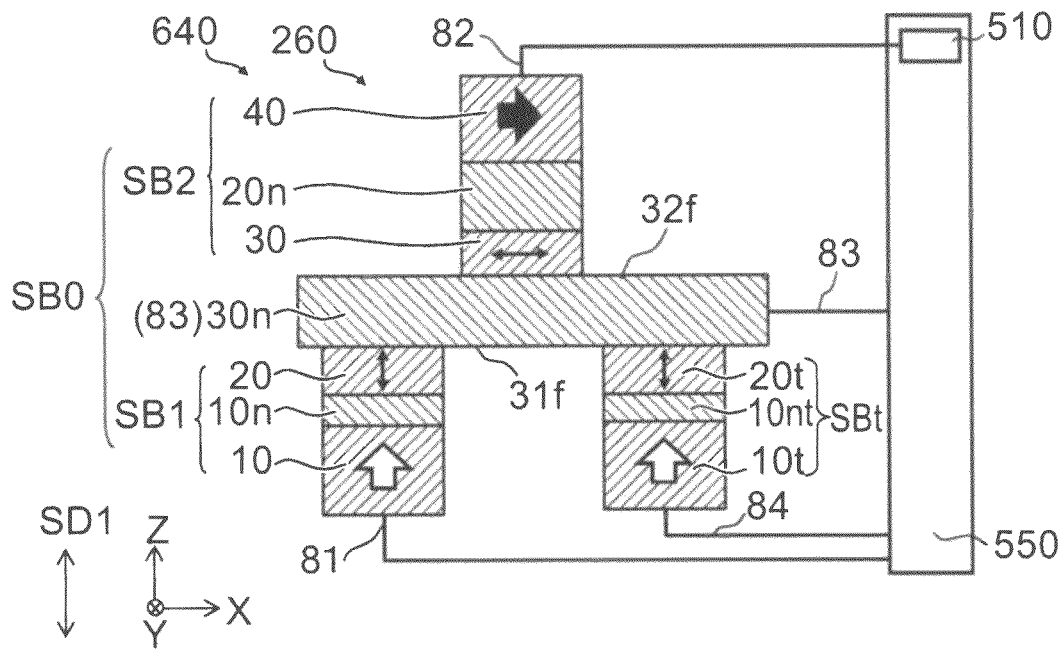
FIG. 24 is a schematic view showing the configuration of a nonvolatile memory device according to a fourth embodiment.

FIG. 24 is a schematic view illustrating the configuration of a nonvolatile memory device according to a fourth embodiment.

As shown in FIG. 24, a nonvolatile memory device 640 according to the embodiment includes a magnetic memory element 260, the control unit 550, and the intermediate interconnection 83.

The magnetic memory element 260 further includes a juxtaposed stacked unit SBt (a third stacked unit) in addition to the first stacked unit SB1, the second stacked unit SB2, and the third nonmagnetic layer 30n.

Also in this case, the third nonmagnetic layer 30n includes the first surface 31f and the second surface 32f (the surface on the side opposite to the first surface 31f). Part of the first surface 31f faces the first stacked unit SB1. Part of the second surface 32f faces the second stacked unit SB2. The juxtaposed stacked unit SBt faces the first surface 31f. The juxtaposed stacked unit SBt is juxtaposed to the first stacked unit SB1. Specifically, the juxtaposed stacked unit SBt is juxtaposed to the first stacked unit SB1 in the same plane (in the X-Y plane) perpendicular to the stacking direction SD1.

The juxtaposed stacked unit SBt includes a first ferromagnetic layer 10t (a fifth ferromagnetic layer), a second ferromagnetic layer 20t (a sixth ferromagnetic layer), and a first nonmagnetic layer 10nt (a fourth nonmagnetic layer). In the first ferromagnetic layer 10t, the magnetization (the magnetization of the first ferromagnetic layer 10t) is fixed in a certain direction (e.g. a third direction). The second ferromagnetic layer 20t is stacked with the first ferromagnetic layer 10t along the stacking direction SD1. In the second ferromagnetic layer 20t, the direction of the magnetization (the magnetization of the second ferromagnetic layer 20t) is variable. The second ferromagnetic layer 20t functions as a magnetic memory layer. The first nonmagnetic layer 10nt is provided between the first ferromagnetic layer 10t and the second ferromagnetic layer 20t.

In this example, a perpendicular magnetization film is used as the first ferromagnetic layer 10, the second ferromagnetic layer 20, the first ferromagnetic layer 10t, and the second ferromagnetic layer 20t. An in-plane magnetization film is used as the third ferromagnetic layer 30 and the fourth ferromagnetic layer 40. However, the embodiment is not limited thereto but the directions of the magnetizations of them are arbitrary.

The nonvolatile memory device 640 further includes an interconnection for the juxtaposed stacked unit 84 in addition to the first interconnection 81 (an interconnection connected to the end of the first stacked unit SB1), the second interconnection 82 (an interconnection connected to the end of the second stacked unit SB2), and the intermediate interconnection 83 (an interconnection connected to the third nonmagnetic layer 30n). The interconnection for the juxtaposed stacked unit 84 is directly or indirectly connected to one end of the juxtaposed stacked unit SBt (the end on the side opposite to the end opposed to the third nonmagnetic layer 30n).

Figure 25A:
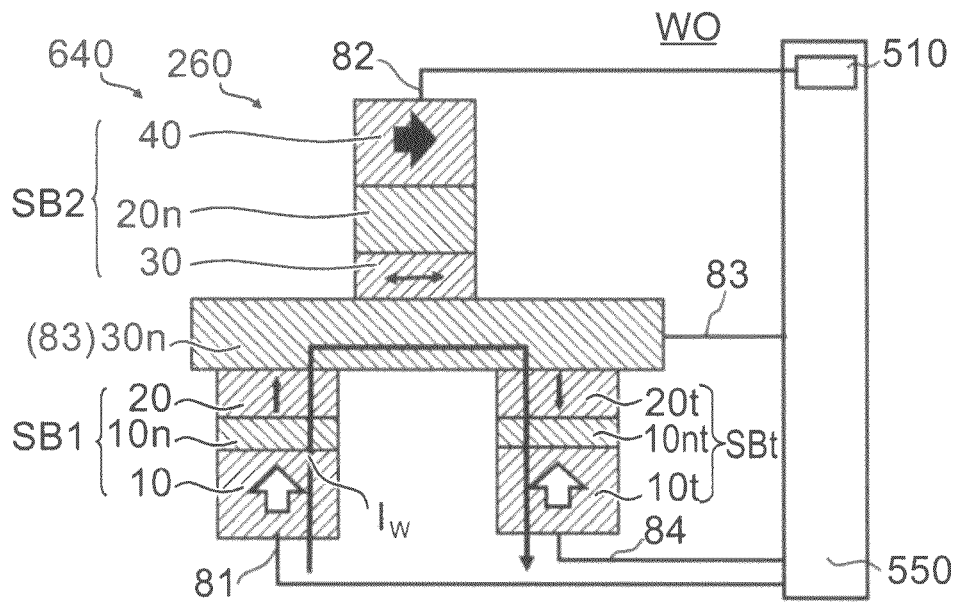
FIG. 25A and FIG. 25B are schematic views showing operations of the nonvolatile memory device according to the fourth embodiment.
Figure 25B:
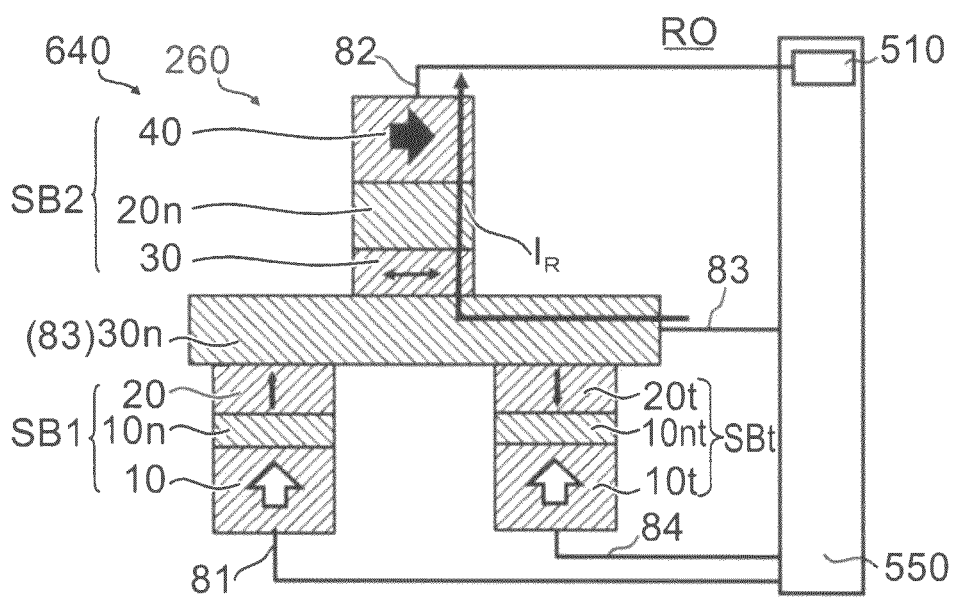

FIG. 25A and FIG. 25B are schematic views illustrating operations of the nonvolatile memory device according to the fourth embodiment.

As shown in FIG. 25A, in the write operation WO, the write current $I_W$ is supplied through a path passing through two MTJ (the first stacked unit SB1 and the juxtaposed stacked unit SBt) and the third nonmagnetic layer 30n (the intermediate interconnection 83). The direction of the magnetization of one of the two magnetic memory layers (e.g. the second ferromagnetic layer 20) is opposite to the direction of the magnetization of the other of the two magnetic memory layers (e.g. the second ferromagnetic layer 20t)

For example, the direction of the stray magnetic field from the second ferromagnetic layer 20 in the position of the third ferromagnetic layer 30 is the same as the direction of the stray magnetic field from the second ferromagnetic layer 20t in the position of the third ferromagnetic layer 30 (the rightward direction in the drawing). Different effective magnetic fields act on the third ferromagnetic layer 30 depending on the magnetization state of the second ferromagnetic layer 20.

As shown in FIG. 25B, in the read operation RO, the read current $I_R$ is supplied to a path passing through the second stacked unit SB2 (the sensor unit) and the intermediate interconnection 83 (the third nonmagnetic layer 30n). Thereby, the frequency of the oscillation of the third ferromagnetic layer 30 is read out by the reading unit 510, and the memory state of the second ferromagnetic layer 20 is read out based on this.

For example, the reading unit 510 reads out the direction of the magnetization of the second ferromagnetic layer 20 by detecting the change in the frequency f of the oscillation of the third ferromagnetic layer 30 which is in accordance with the direction of the magnetization of the second ferromagnetic layer 20 and the direction of the magnetization of the second ferromagnetic layer 20t. Furthermore, the reading unit 510 may read out the direction of the magnetization of the second ferromagnetic layer 20t by detecting the change in the frequency f of the oscillation of the third ferromagnetic layer 30 which is in accordance with the direction of the magnetization of the second ferromagnetic layer 20 and the direction of the magnetization of the second ferromagnetic layer 20t.

Figure 26A:
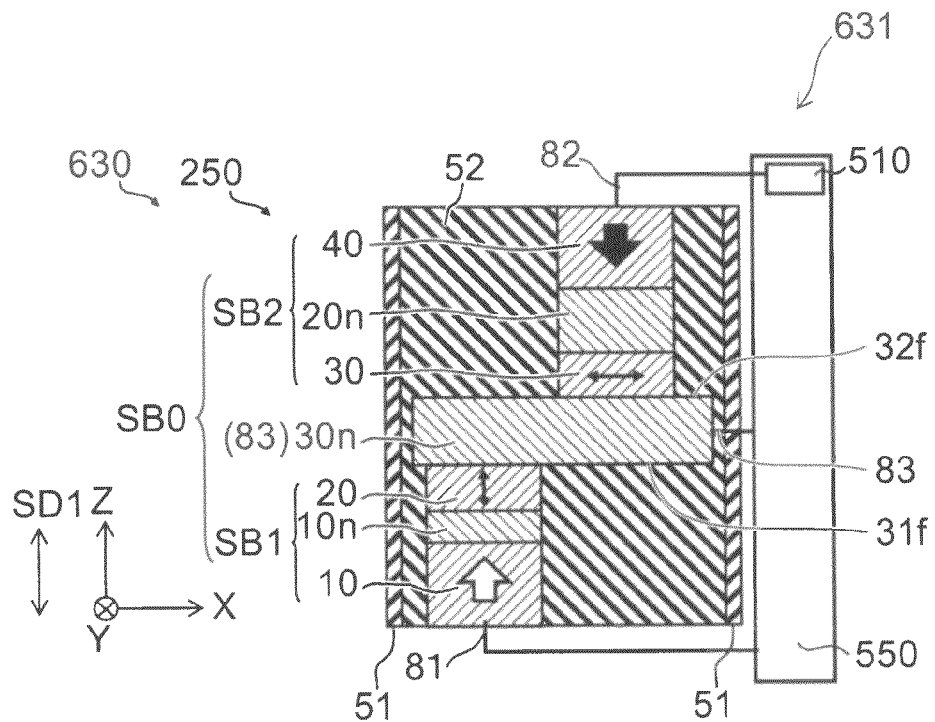
FIG. 26A and FIG. 26B are schematic views showing the configurations of other nonvolatile memory devices according to the fourth embodiment.
Figure 26B:
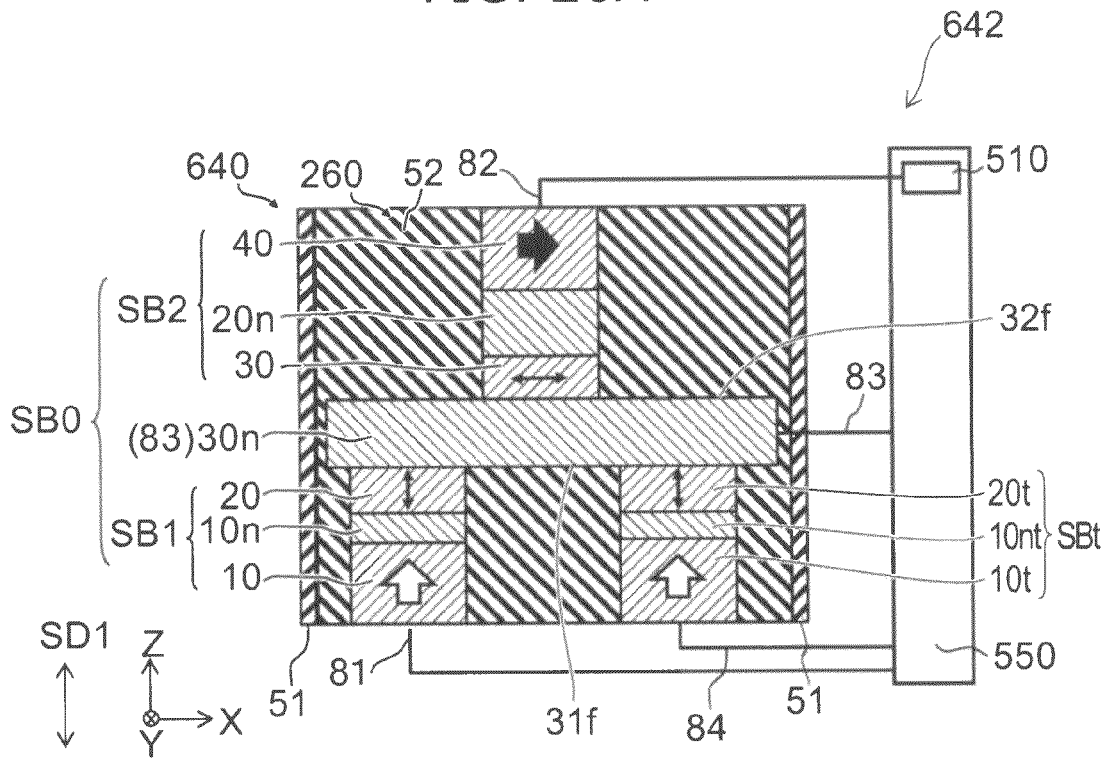

FIG. 26A and FIG. 26B are schematic views illustrating the configurations of other nonvolatile memory devices according to the fourth embodiment.

As shown in FIG. 26A, a nonvolatile memory device 631 has a configuration in which the magnetic shield 51 is further provided in the configuration of the nonvolatile memory device 630 described in regard to FIG. 23. As shown in FIG. 26B, a nonvolatile memory device 642 has a configuration in which the magnetic shield 51 is further provided in the configuration of the nonvolatile memory device 640 described in regard to FIG. 24. The space between the magnetic shield 51 and the magnetic memory element is filled with, for example, an insulating film. For example, the protection layer 52 may be provided between the magnetic shield 51 and the magnetic memory element.

In the case where the magnetic shield 51 is provided in the individual stacked body SB0 like the nonvolatile memory device 631 and the nonvolatile memory device 642, an unintended interference in the combination of the magnetic memory unit and the sensor unit is suppressed even when a plurality of magnetic memory elements are provided in the X-Y plane. Thereby, stable operation can be ensured and the memory density can be improved.

Fifth Embodiment

Figure 27A:
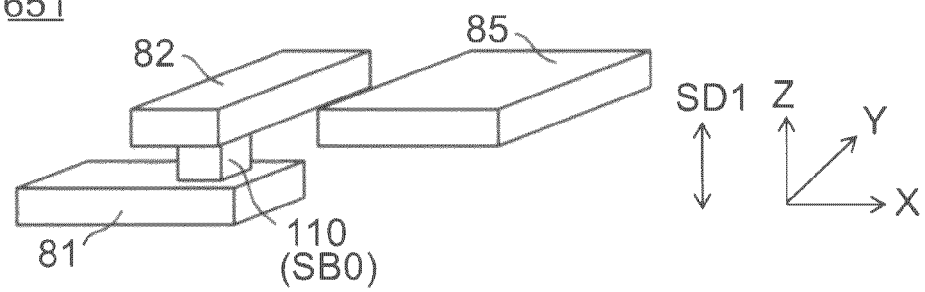
FIG. 27A to FIG. 27C are schematic perspective views showing the configurations of nonvolatile memory devices according to a fifth embodiment.
Figure 27B:
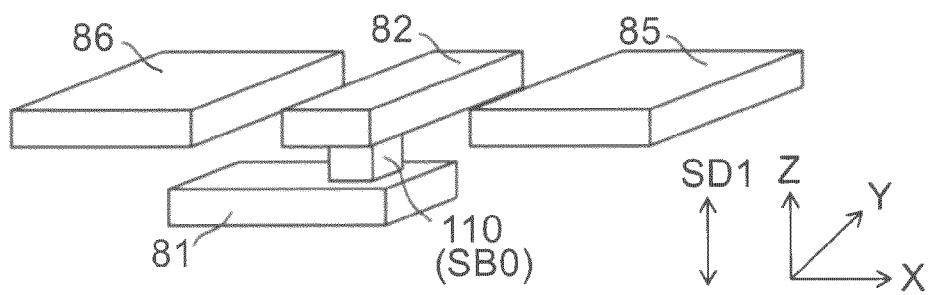
Figure 27C:
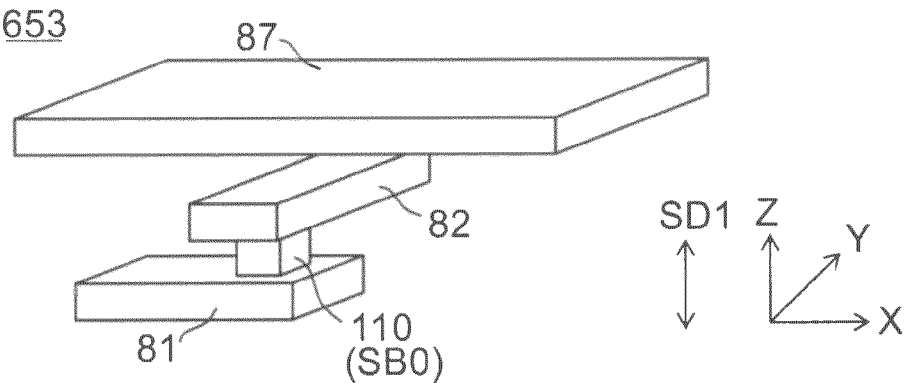

FIG. 27A to FIG. 27C are schematic perspective views illustrating the configurations of nonvolatile memory devices according to a fifth embodiment.

As shown in FIG. 27A, a nonvolatile memory device 651 according to the embodiment further includes an interconnection for reading (a read bit interconnection; in this example, the second interconnection 82) and a conductive layer 85 in addition to the magnetic memory element (e.g. the magnetic memory element 110) and the control unit 550. The interconnection for reading (the second interconnection 82) connects any magnetic memory element according to the first to fourth embodiments (e.g. the magnetic memory element 110 etc.) and the reading unit 510. The conductive layer 85 is provided along the interconnection for reading (the second interconnection 82).

For example, the first interconnection 81 extends along the X-axis, and the second interconnection 82 extends along the Y-axis. The conductive layer 85 extends along, for example, the Y-axis. In this example, the conductive layer 85 is juxtaposed to the second interconnection 82 in the X-Y plane.

As shown in FIG. 27B, a nonvolatile memory device 652 according to the embodiment includes the interconnection for reading (the second interconnection 82), the conductive layer 85 (a first conductive layer), and a conductive layer 86 (a second conductive layer). The interconnection for reading (the second interconnection 82) is disposed between the conductive layer 85 and the conductive layer 86. Also in this case, the conductive layer 85 and the conductive layer 86 extend along the interconnection for reading (the second interconnection 82). In this example, the conductive layer 85 and the conductive layer 86 are juxtaposed to the second interconnection 82 in the X-Y plane.

As shown in FIG. 27C, a nonvolatile memory device 653 according to the embodiment includes the interconnection for reading (the second interconnection 82) and a conductive layer 87. The conductive layer 87 lies along the interconnection for reading (the second interconnection 82). In this example, when projected onto the X-Y plane, the conductive layer 87 includes a portion overlapping with the second interconnection 82. That is, the position along the Z-axis of the conductive layer 87 is different from the position along the Z-axis of the second interconnection 82. The conductive layer 87 may be, for example, in a linear shape or a planar shape.

Thus, various modifications are possible in regard to the conductive layer provided along the second interconnection 82.

In the embodiment, a conductive layer is provided near the interconnection for reading. The conductive layer is provided in a position where lines of electric force generated when a high frequency signal is transmitted through the interconnection for reading converge sufficiently. The high frequency signal is a signal based on the oscillation of the third ferromagnetic layer 30. Providing the conductive layer reduces the attenuation when the high frequency signal generated in the third ferromagnetic layer 30 is transmitted to the reading unit 510 (e.g. a frequency detection circuit). Thereby, the S/N ratio in the read operation RO is improved.

The conductive layer is provided, for example, on the same plane as the interconnection for reading. On the same plane as the interconnection for reading, the interconnection for reading is disposed between a plurality of conductive layers. In the case where the conductive layer is provided on both sides of the interconnection for reading, the interconnection for reading and the conductive layers may have a coplanar structure. The conductive layer is disposed in a position above the interconnection for reading or a position oblique as viewed from the interconnection for reading. In the case where the conductive layer is provided above the interconnection for reading, the conductive layer may be in a planar shape having a sufficiently large surface. In this case, the interconnection for reading and the conductive layer may have a microstrip line structure.

The conductive layer described in the embodiment may be used for one of the nonvolatile memory devices described in regard to the first to third embodiments and nonvolatile memory devices modified based on them.

Sixth Embodiment

Figure 28A:
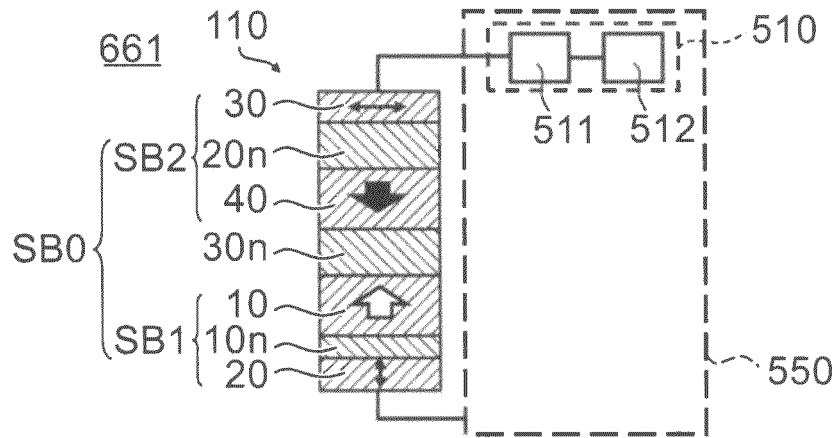
FIG. 28A to FIG. 28C are schematic views showing the configurations of parts of nonvolatile memory devices according to a sixth embodiment.
Figure 28B:
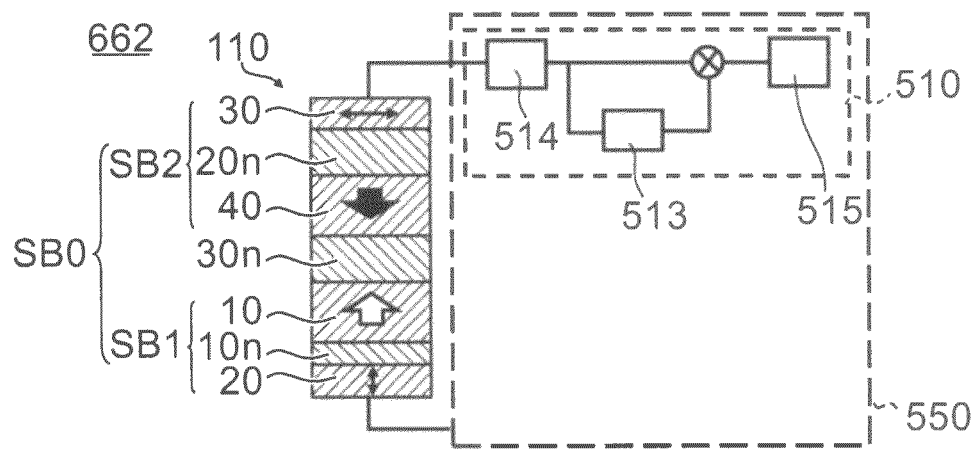
Figure 28C:
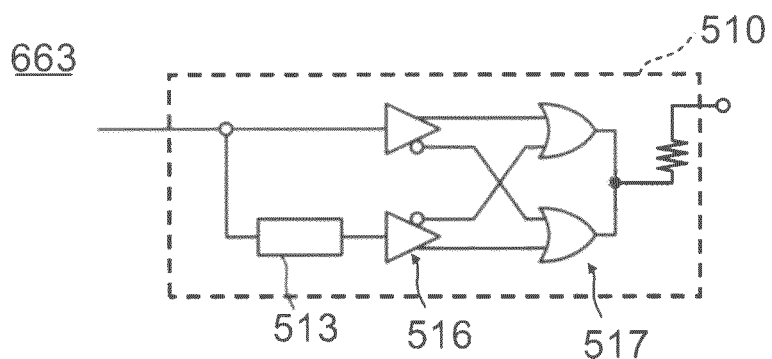

FIG. 28A to FIG. 28C are schematic views illustrating the configurations of parts of nonvolatile memory devices according to a sixth embodiment.

As shown in FIG. 28A, in the reading unit 510 of a nonvolatile memory device 661 according to the embodiment, a high frequency filter 511 and an integration circuit 512 are provided. The high frequency filter 511 is connected to the second interconnection 82. The output of the high frequency filter 511 is inputted to the integration circuit 512. For example, a low-pass filter is used as the high frequency filter 511. In this case, as described in regard to FIG. 7, the oscillation frequency of the parallel state (Spp) selectively passes and is detected. Although the magnetic memory element 110 is used in this example, any magnetic memory element according to the embodiment may be used.

As shown in FIG. 28B, in the reading unit 510 of a nonvolatile memory device 662 according to the embodiment, a signal delay circuit 513, a power limiter 514, and a low-pass filter 515 are used. That is, a delay detection system is used in the reading unit 510. The high frequency signal generated by the oscillation of the third ferromagnetic layer 30 is branched, and one of them is passed through the signal delay circuit 513, after which both are multiplied together. A circuit that shifts the phase arbitrarily, a line path unit with different path lengths, or the like is used as the signal delay circuit 513. The oscillation frequency of the sensor unit changes with the memory state of the magnetic memory unit. When a signal that does not pass through the signal delay circuit 513 is multiplied by a signal that has passed through the signal delay circuit 513, a phase shift occurs. By the phase shift, a change in the amplitude in the reference phase or a shift from the reference frequency is obtained. The memory state can be distinguished also by observing the change in the amplitude in the reference phase. In addition, it is also possible to distinguish the memory state based on the result of removing signals shifted from the reference frequency with a filter. The power limiter 514 is provided as necessary and may be omitted.

As shown in FIG. 28C, in the reading unit 510 of a nonvolatile memory device 663 according to the embodiment, the signal delay circuit 513, a differential buffer circuit 516, and a logic circuit 517 are used.

Figures 29A, 29B:
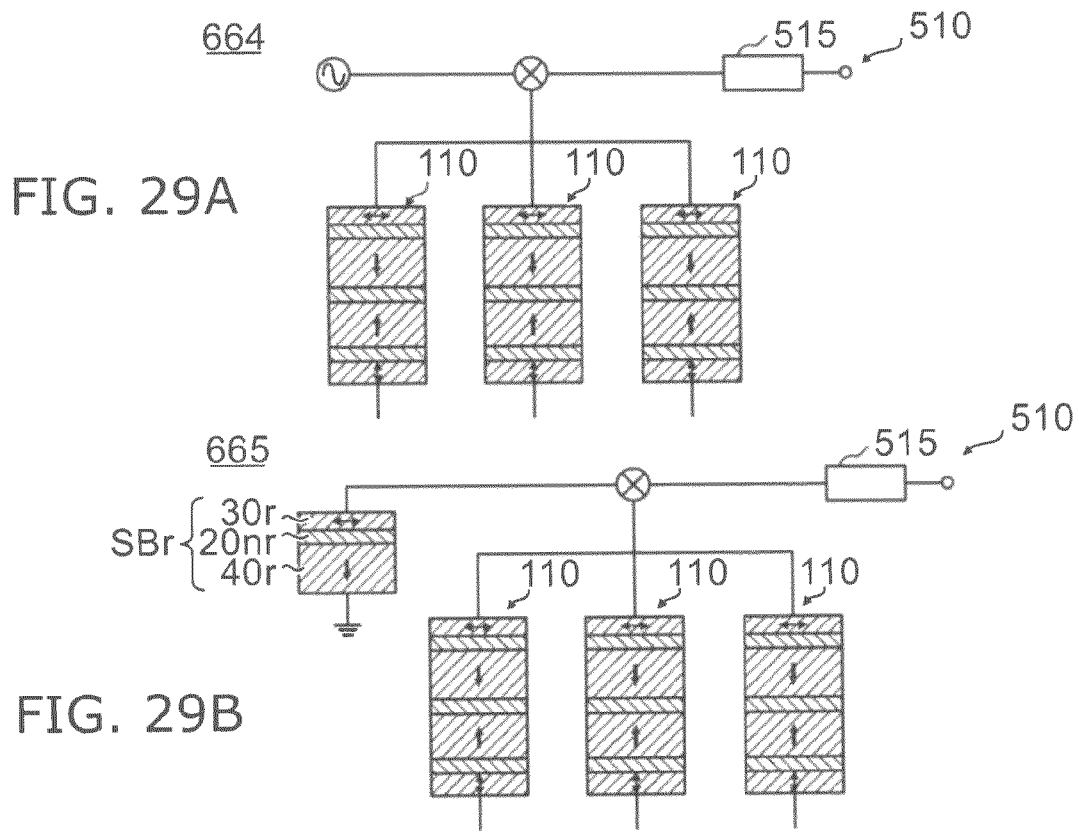
FIG. 29A and FIG. 29B are schematic views showing the configurations of parts of nonvolatile memory devices according to the sixth embodiment.

FIG. 29A and FIG. 29B are schematic views illustrating the configurations of parts of nonvolatile memory devices according to the sixth embodiment.

As shown in FIG. 29A, in the reading unit 510 of a nonvolatile memory device 664 according to the embodiment, the frequency f is detected by the mixer system.

As shown in FIG. 29B, in the reading unit 510 of a nonvolatile memory device 665 according to the embodiment, a stacked oscillator SBr is used. The stacked oscillator SBr includes a ferromagnetic layer 30$r$, a ferromagnetic layer 40$r$, and a nonmagnetic layer 20$nr$ provided between the ferromagnetic layer 30$r$ and the ferromagnetic layer 40$r$. The ferromagnetic layer 30$r$ has the same configuration as the third ferromagnetic layer 30. The ferromagnetic layer 40$r$ has the same configuration as the fourth ferromagnetic layer 40. The nonmagnetic layer 20$nr$ has the same configuration as the second nonmagnetic layer 20$n$. Thus, the stacked oscillator SBr having the same configuration as that used in the sensor unit may be used in place of the local oscillator.

The reading unit 510 may be provided for each of the plurality of magnetic memory elements. Alternatively, one reading unit 510 may be provided for the plurality of magnetic memory elements. One reading unit 510 may be shared by the plurality of magnetic memory elements.

In the delay detection system, the time from passing through the reading unit 510 (a phase delay circuit) to being multiplied is, for example, a time corresponding to not less than 1 Gbps (gigabits per second) and not more than 9 Gbps. According to a calculation of micromagnetics, the frequency of the oscillation in the sensor unit becomes stable in a time less than 1 ns. The time necessary for the read operation RO is expressed by approximately the sum of the time until the sensor unit oscillates stably and the time from passing through the phase delay circuit to being multiplied.

The inventors of this application have found that the time until the sensor unit oscillates stably can be shortened by applying an external magnetic field to the sensor unit. An example of the result of an investigation using a micromagnetics calculation regarding the characteristics of the magnetic memory element according to the embodiment will now be described.

In this calculation, the sensor unit was shaped like a circular cylinder, and the diameter $\phi$ of the sensor unit when projected onto the X-Y plane was set to 30 nm. As the fourth ferromagnetic layer 40, a perpendicular magnetization film of thickness=8 nm, magnetization=1000 emu/cc, and magnetic anisotropy Ku=8 Merg/cm$^3$ (megaerg/cubic centimeter) was used. As the third ferromagnetic layer 30, an in-plane magnetization film of thickness=3 nm, magnetization Ms=800 emu/cc, and magnetic anisotropy Ku=5000 erg/cm$^3$ was used. As the second nonmagnetic layer 20n, a Cu layer with a thickness of 8 nm was used. The frequency f of the oscillation in the third ferromagnetic layer 30 when an external magnetic field Hext in a direction parallel to the Z-axis (the direction from the third ferromagnetic layer 30 toward the fourth ferromagnetic layer 40) was applied to the sensor unit thus configured was calculated.

Figure 30:
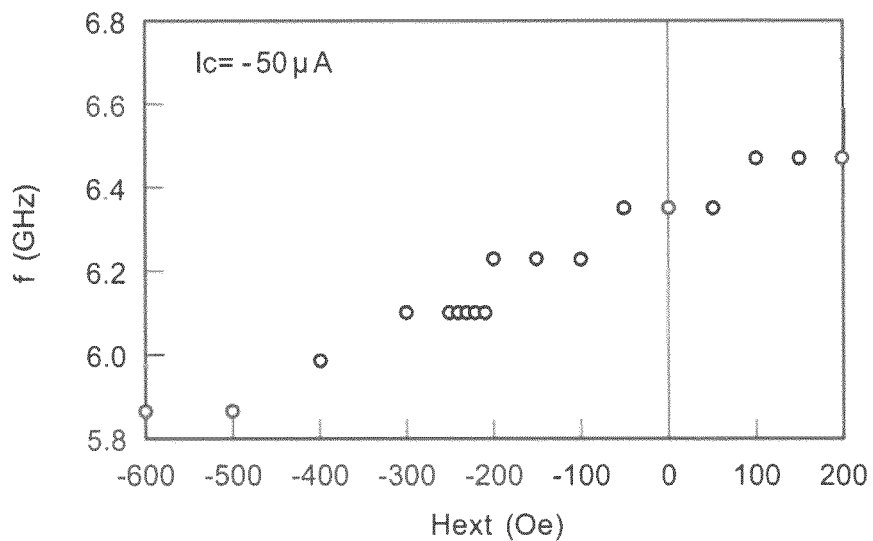
FIG. 30 to FIG. 37 are graphs showing characteristics of the magnetic memory element according to the embodiment.

FIG. 30 is a graph illustrating characteristics of the magnetic memory element according to the embodiment.

The horizontal axis of the drawing is the external magnetic field Hext (Oe), and the vertical axis is the frequency f of the oscillation in the third ferromagnetic layer 30. In this example, the current Ic supplied to the third ferromagnetic layer 30 is −50 µA. When the current Ic is positive, the current Ic flows from the third ferromagnetic layer 30 toward the fourth ferromagnetic layer 40. As can be seen from FIG. 30, when the external magnetic field Hext is large, the frequency f of the oscillation is large.

Figure 31:
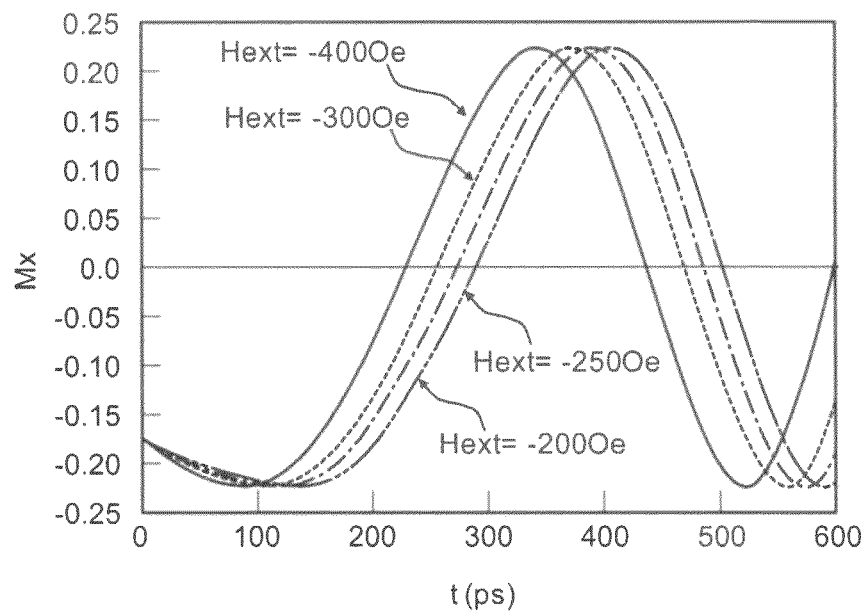

FIG. 31 is a graph illustrating characteristics of the magnetic memory element according to the embodiment.

The horizontal axis of the drawing is the time t (ps; picosecond) from the application of the external magnetic field Hext, and the vertical axis is the normalized magnetization Mx (the unit being dimensionless) in the third ferromagnetic layer 30. As can be seen from FIG. 31, the initial response in the third ferromagnetic layer 30 becomes earlier by applying the external magnetic field Hext and increasing the absolute value of the external magnetic field Hext.

Figure 32:
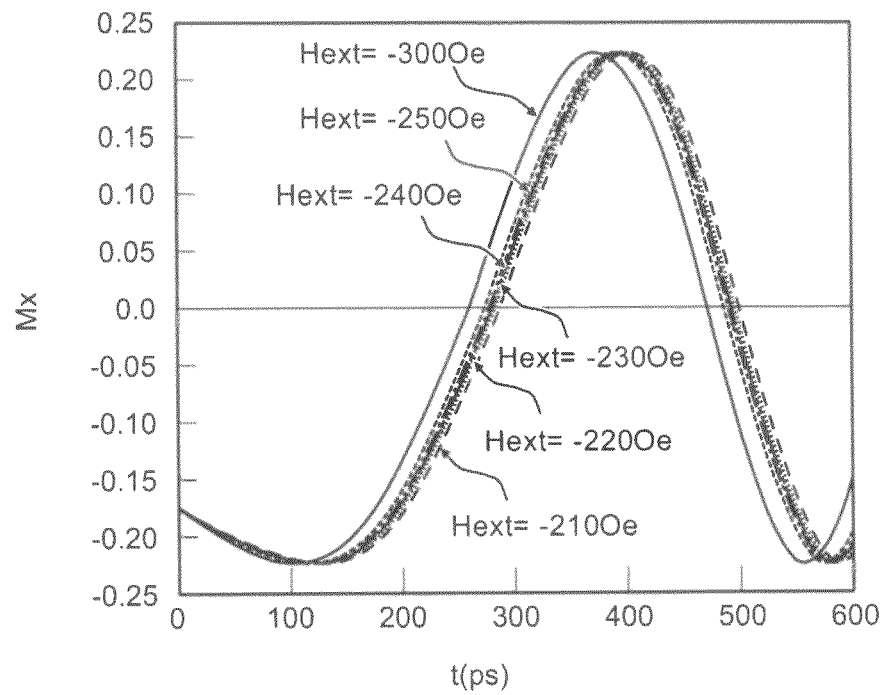

FIG. 32 is a graph illustrating characteristics of the magnetic memory element according to the embodiment.

The drawing illustrates the characteristics when the external magnetic field Hext is −210 Oe to −300 Oe in detail. The horizontal axis is the time t (ps; picosecond) from the application of the external magnetic field Hext, and the vertical axis is the normalized magnetization Mx in the third ferromagnetic layer 30. As can be seen from FIG. 32, the rise time in the third ferromagnetic layer 30 is shortened by the external magnetic field Hext.

Figure 33:
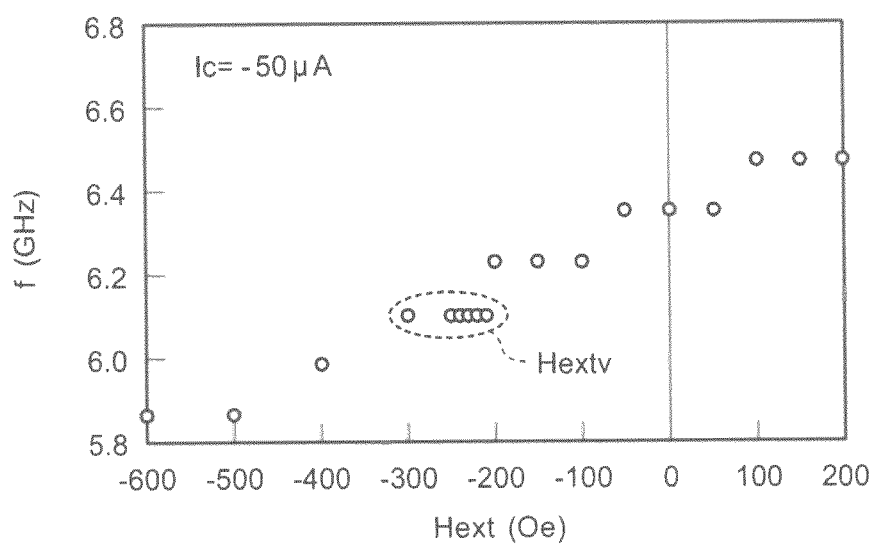

FIG. 33 is a graph illustrating characteristics of the magnetic memory element according to the embodiment.

The drawing is the same as FIG. 30; and the horizontal axis is the external magnetic field Hext and the vertical axis is the frequency f of the oscillation in the third ferromagnetic layer 30. As illustrated in FIG. 33, a fixed frequency f is obtained in a certain range Hextv of the external magnetic field Hext (in this example, a range of the external magnetic field Hext of from −210 Oe to −300 Oe). In the range Hextv, the phase can be changed without changing the frequency f. That is, by setting the magnitude of the applied external magnetic field Hext to an appropriate value, the initial response of the oscillation in the third ferromagnetic layer 30 becomes earlier while the frequency f of the oscillation in the third ferromagnetic layer 30 is kept constant. That is, the time until the oscillation becomes stable can be shortened. By this method, the time until the oscillation becomes stable can be made approximately 0.6 ns. In this case, the time of the read operation RO is less than 1 ns.

An example of the characteristics of the magnetic memory element will now be described.

In the magnetic memory element described below, the stacked body SB0 has the first stacked configuration illustrated in FIG. 1. The third ferromagnetic layer 30 is an FeCoB layer with a thickness of 2 nm, the second nonmagnetic layer 20n is a Cu layer with a thickness of 2 nm, and the fourth ferromagnetic layer 40 is an FeCoB layer with a thickness of 6 nm. The stacked body SB0 is in a circular cylindrical shape, and the diameter φ when projected onto the X-Y plane is 30 nm. The oscillation frequency when a current Ic is passed in a state where no magnetic field is applied to the sensor unit thus configured from the outside is 5.4 GHz.

Figure 34:
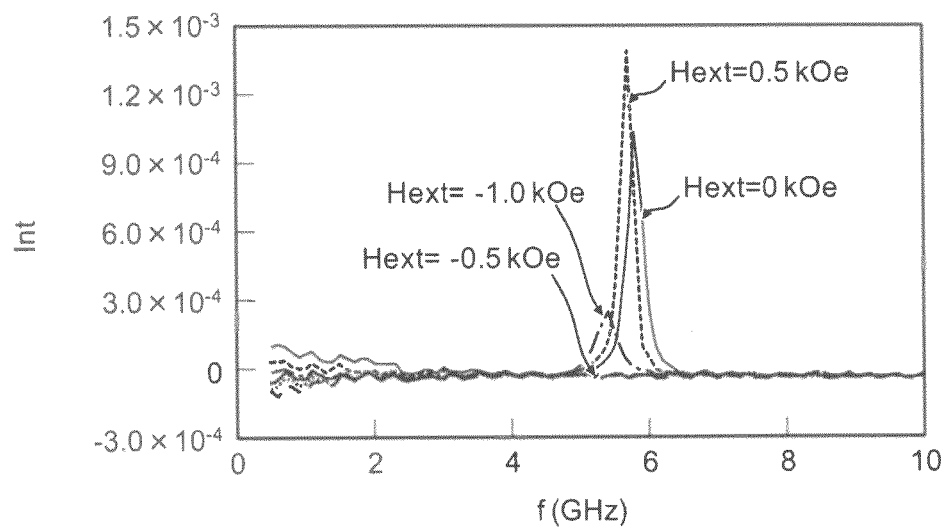

FIG. 34 is a graph illustrating characteristics of the magnetic memory element according to the embodiment.

The drawing illustrates the oscillation state in the sensor unit when the external magnetic field Hext is applied to the sensor unit mentioned above.

The horizontal axis of FIG. 34 is the frequency f of the oscillation in the sensor unit. The vertical axis is the intensity Int of the oscillation. As shown in FIG. 34, the frequency f of the oscillation changes by applying different external magnetic fields Hext of 0.5 kOe, 0 Oe, −0.5 kOe, and −1.0 kOe to the sensor unit. The external magnetic field Hext includes the stray magnetic field from the second ferromagnetic layer 20 applied to the position of the third ferromagnetic layer 30. That is, the frequency f of the oscillation in the third ferromagnetic layer 30 changes with the direction of the magnetization of the second ferromagnetic layer 20.

Figure 35:
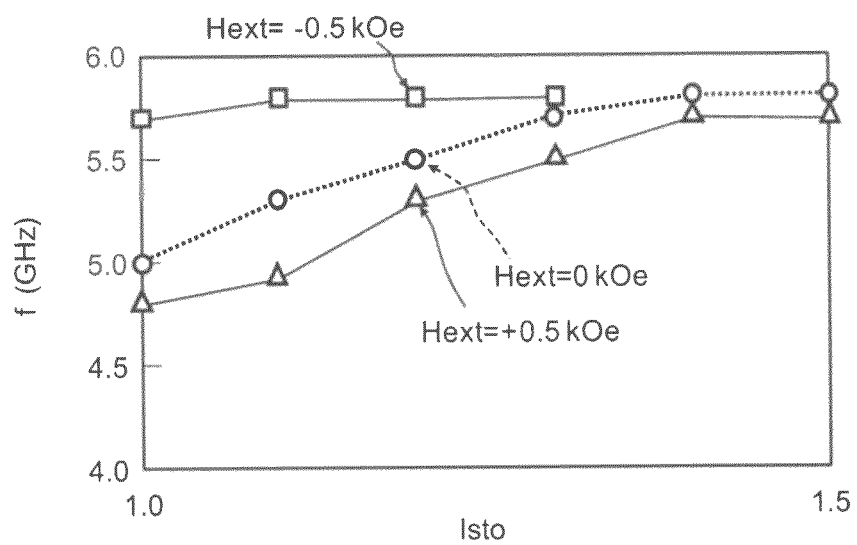

FIG. 35 is a graph illustrating characteristics of the magnetic memory element according to the embodiment.

The drawing illustrates the oscillation state in the sensor unit when the external magnetic field Hext is applied to the sensor unit.

The horizontal axis of FIG. 35 is the current Isto (normalized value) supplied to the sensor unit, and the vertical axis is the frequency f of the oscillation in the sensor unit. As shown in FIG. 35, the frequency f of the oscillation changes by applying different external magnetic fields Hext of 0.5 kOe, 0 Oe, and −0.5 kOe (corresponding to states of the magnetization of the second ferromagnetic layer 20) to the sensor unit. For example, a frequency shift of a few 100 MHz is obtained both when the external magnetic field Hext is +500 Oe and when −500 Oe. The state of the magnetization in the second ferromagnetic layer 20 can be grasped by detecting the frequency f of the oscillation in the third ferromagnetic layer 30 based on these characteristics.

In the example of the magnetic memory element described below, the stacked body SB0 has the first stacked configuration illustrated in FIG. 1. First, the characteristics of the sensor unit are described. As the fourth ferromagnetic layer 40, a perpendicular magnetization film of thickness=6 nm, Ms=700 emu/cc, and Ku=10 Merg/cm$^3$ was used. As the second nonmagnetic layer 20n, a Cu layer with a thickness of 2 nm was used. As the third ferromagnetic layer 30, an in-plane magnetization film of thickness=2 nm, Ms=800 emu/cc, and Ku=5000 erg/cm$^3$ was used. In regard to the sense unit thus configured, the oscillation frequency to the current Ic was analyzed by micromagnetics.

Figure 36:
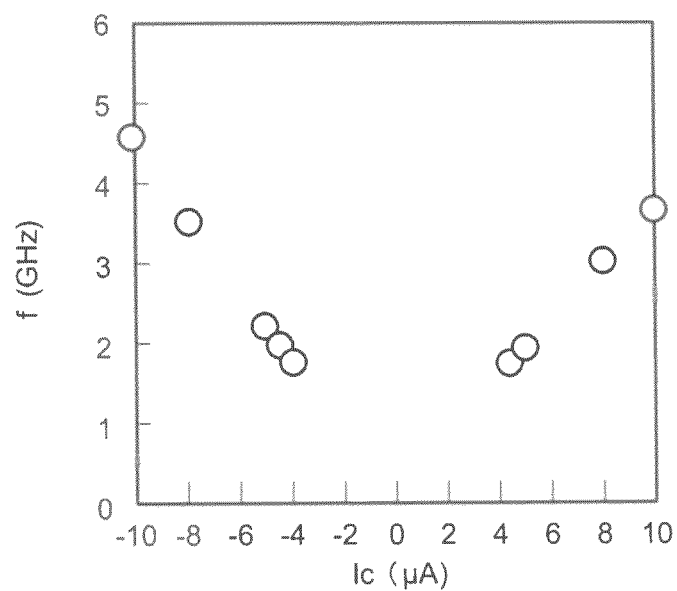

FIG. 36 is a graph illustrating characteristics of the magnetic memory element according to the embodiment.

The horizontal axis of the drawing is the current Ic, and the vertical axis is the frequency f of the oscillation in the third ferromagnetic layer 30. As shown in FIG. 36, oscillation occurs in a region of the absolute value of the current Ic of 4 µA or more. Oscillation does not occur when the current Ic is −11 µA (plotted points are not shown in FIG. 36). When the upper limit of the oscillation frequency of such a sensor unit is calculated from Formula 7, 5 GHz is obtained.

Next, the characteristics of the magnetic memory unit are described. As the second ferromagnetic layer 20, a perpendicular magnetization film of thickness=2 nm, Ms=900 emu/cc, and Ku=6 Merg/cm$^3$ was used. As the first nonmagnetic layer 10n, a MgO film with a thickness of 1 nm was used. As the first ferromagnetic layer 10, a perpendicular magnetization film of thickness=6 nm, Ms=700 emu/cc, and Ku=10 Merg/cm$^3$ was used. In regard to the magnetic memory unit thus configured, the magnetization reversal was analyzed by micromagnetics.

The resonance frequency $f_0$ in the magnetic memory unit is 10 GHz. When a magnetic field near the resonance frequency $f_0$ of the magnetic memory unit is applied to the magnetic memory unit from the outside, magnetization reversal occurs more easily by the resonance effect.

Figure 37:
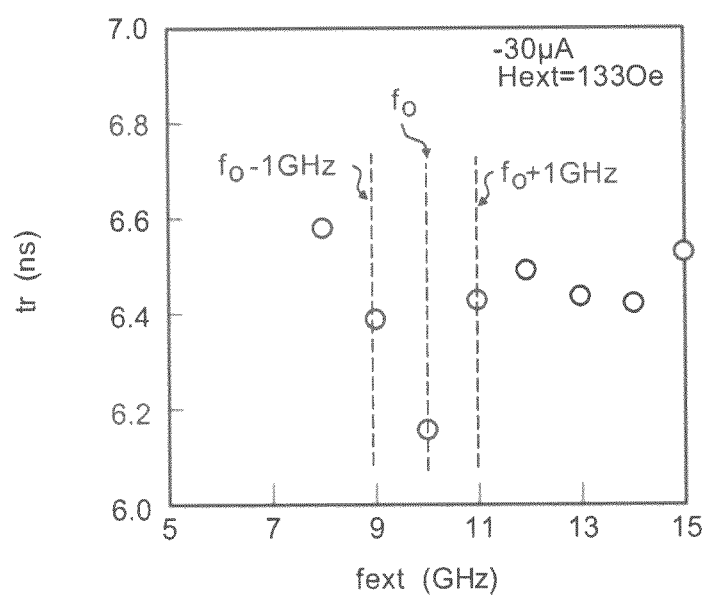

FIG. 37 is a graph illustrating characteristics of the magnetic memory element according to the embodiment.

The drawing illustrates the result of analyzing the magnetization reversal rate in the second ferromagnetic layer 20 when a magnetic field from the outside is applied while a current of −30 µA is supplied to the magnetic memory unit mentioned above. Herein, the strength of the magnetic field from the outside was set to 133 Oe, and the frequency of the magnetic field from the outside was changed. The horizontal axis of the drawing is the frequency fext (GHz) of the magnetization applied to the second ferromagnetic layer 20 from the outside. The vertical axis is the magnetization reversal time tr (ns) in the second ferromagnetic layer 20.

As can be seen from FIG. 37, the magnetization reversal is assisted when a magnetic field in a frequency band within the resonance frequency (10 GHz)±1 GHz is applied.

According to the findings obtained by the inventors of this application, the magnetization reversal in the second ferromagnetic layer 20 is assisted when a magnetic field in a frequency band within the resonance frequency $f_0$±1 GHz is applied.

In the case where the sensor unit described in regard to FIG. 36 and the magnetic memory unit described in regard to FIG. 37 are stacked, the current value at which the sensor unit oscillates is smaller than the current value of the magnetization reversal in the magnetic memory unit. Therefore, when the information stored in the magnetic memory unit (the state of the magnetization of the second ferromagnetic layer 20) is read out, the sensor unit oscillates. The memory state can be distinguished by the difference in the frequency f of the oscillation. Furthermore, since the difference between the resonance frequency $f_0$ of the magnetic memory unit (in this example, 10 GHz) and the frequency f of the oscillation of the sensor unit is 1 GHz or more, false writing does not occur in reading.

A method for manufacturing a magnetic memory element according to the embodiment will now be described. The following manufacturing method is applied to the magnetic memory elements according to the first to fourth embodiments, magnetic memory elements modified based on them, etc. by altering the conditions, order, etc. of the processing processes.

In the following description, "material A\material B" means that material B is stacked on material A.

A lower electrode (not shown) is formed on a wafer, and then an ultrahigh vacuum sputter apparatus is used to stack a Ta layer (a contact layer for contact with an electrode, also functioning as an underlayer), a CoFeB layer (the second ferromagnetic layer 20), MgO (the first nonmagnetic layer 10n), and a CoFeB\FePt layer (the first ferromagnetic layer 10) in this order on the lower electrode. Here, the strength of the magnetic anisotropy in the film surface perpendicular direction of the CoFeB layer and the CoFeB\FePt layer can be adjusted by annealing in a magnetic field. Subsequently, a Ta\Ru layer (the third nonmagnetic layer), an FePt\CoFeB\Cu\Py layer (the sense unit), and Ta (a contact layer) are stacked in this order. Thereby, a workpiece is formed.

Next, an EB (electron beam) resist is applied to perform EB exposure to form a resist mask with a diameter of 20 nm. Ion milling is performed to remove the portions not covered with the resist of the workpiece until the lower electrode becomes exposed. Next, a SiO$_2$ film that forms an embedded insulating layer is deposited. After that, planarization is performed by CMP (chemical mechanical polishing) or the like. After that, RIE (reactive ion etching) or the like is performed to etch the entire surface to expose the contact layer for contact with an electrode.

Further, a resist is applied to the entire surface, and a stepper exposure apparatus is used to perform patterning on the resist so that the opening of the resist may correspond to the position of an upper electrode. A Ta/Cu film is formed so as to fill the opening corresponding to the upper electrode, and the unnecessary portion of the Ta/Cu film and the resist are removed by the lift-off method to form the upper electrode. Further, an interconnection (not shown) electrically connected to the upper electrode is provided.

A method for manufacturing a magnetic memory element including the magnetic shield 51 (e.g. the magnetic memory element 112bs) will now be described.

Similarly to the manufacturing method described above, on the lower electrode, a Ta\Ru layer (a contact layer for contact with an electrode, also functioning as an underlayer), the magnetic memory unit, the third nonmagnetic layer 30n, the first ferromagnetic layer 10, the first nonmagnetic layer 10n, the second ferromagnetic layer 20, and a contact layer for contact with an electrode are stacked in this order, and the workpiece is processed to a size of 20 nm in diameter. Then, a SiN layer that forms the protection layer 52 is formed, and then a Py layer that forms the magnetic shield 51 is formed. Etchback is performed to leave the Py layer on the side wall of the stacked body SB0. Further, a SiO$_2$ film that forms an embedded insulating layer is formed and processed, and an upper electrode is formed. Thereby, the magnetic memory element 112bs is fabricated.

Magnetic memory elements having various configurations including the magnetic shield 51 can be fabricated by changing the order of the formation of the SiN layer that forms the protection layer 52 and the Py layer that forms the magnetic shield 51 in the foregoing.

Seventh Embodiment

In the embodiment, a plurality of magnetic memory elements are arranged in a matrix configuration.

Figure 38:
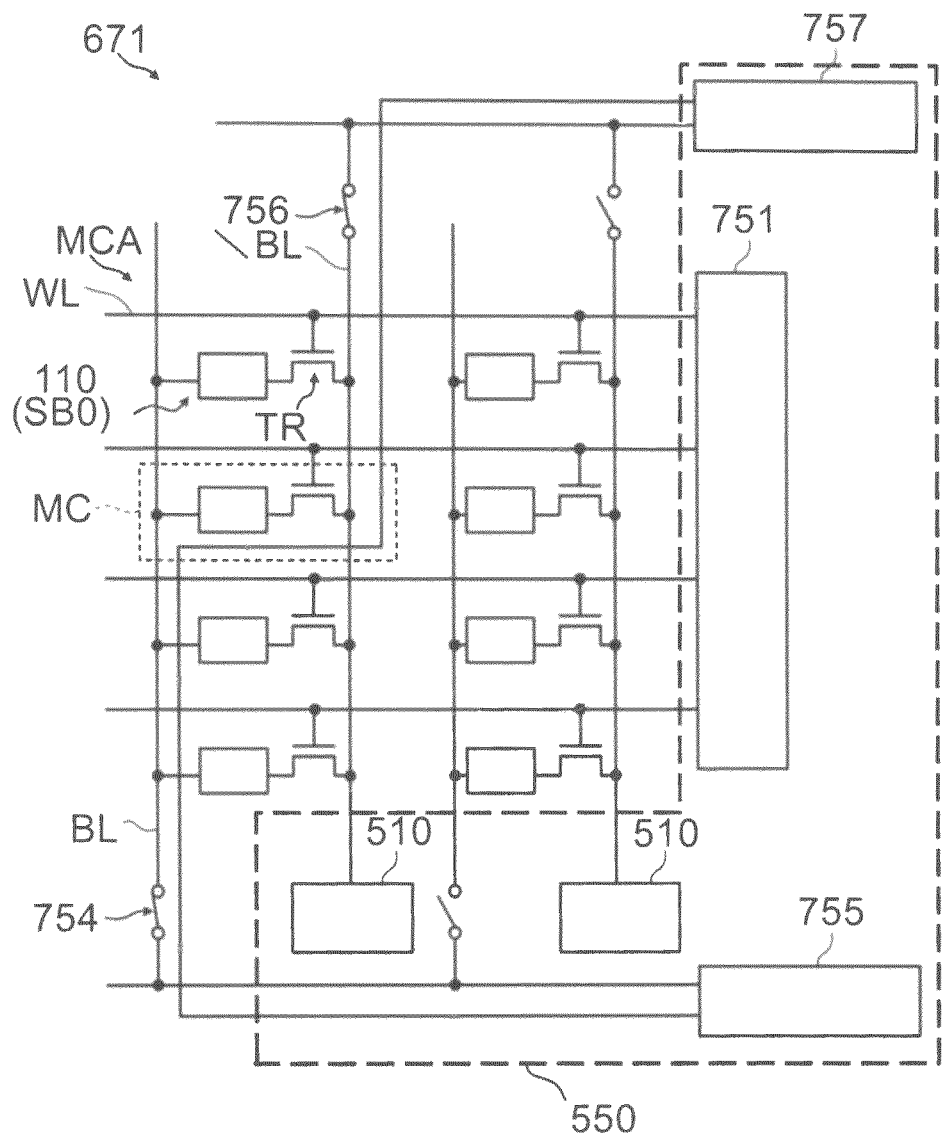
FIG. 38 is a schematic view showing the configuration of a nonvolatile memory device according to a seventh embodiment.

FIG. 38 is a schematic view illustrating the configuration of a nonvolatile memory device according to a seventh embodiment.

As shown in FIG. 38, a nonvolatile memory device 671 according to the embodiment includes a memory cell array unit MCA. The memory cell array unit MCA includes a plurality of memory cells MC arranged in a matrix configuration.

Each memory cell MC includes one of the magnetic memory elements according to the first to fourth embodiments as the memory unit. In this example, the magnetic memory element 110 is used.

In the memory cell array unit MCA, a plurality of bit interconnection pairs (a bit interconnection BL and a bit interconnection bar \BL) and a plurality of word interconnections WL are arranged. Each of the plurality of bit interconnection pairs extends in the column direction. Each of the plurality of word interconnections WL extends in the row direction.

The memory cell MC is disposed at the facing portion of the bit interconnection BL and the word interconnection WL. Each memory cell MC includes the magnetic memory element (e.g. the magnetic memory element 110) and the selection transistor TR. One end of the magnetic memory element 110 is connected to the bit interconnection BL. The other end of the magnetic memory element 110 is connected to the drain terminal of the selection transistor TR. The gate terminal of the selection transistor TR is connected to the word interconnection WL. The source terminal of the selection transistor TR is connected to the bit interconnection bar \BL.

A row decoder 751 is connected to the word interconnection WL. One end of one of the bit interconnection pair (e.g. the bit interconnection bar \BL) is connected to the reading unit 510. The other end of the one of the bit interconnection pair (e.g. the bit interconnection bar \BL) is connected to a first power supply source/sync circuit 757 via a switch 756. The other of the bit interconnection pair (e.g. the bit interconnection BL) is connected to a second power supply source/sync circuit 755 via a switch 754.

By such a configuration, data can be written to an arbitrary memory cell MC (e.g. the magnetic memory element 110) of the memory cell array unit MCA, and the data written in the magnetic memory element 110 can be read out.

Eighth Embodiment

The control unit 550 in a nonvolatile memory device according to the embodiment may have the configuration described above, and a description is therefore omitted. In the following, the memory cell array unit MCA is described. In the following, the magnetic memory element is referred to as a "stacked structure body M-S." The stacked structure body M-S includes a stacked structure of the magnetic memory unit (MTJ), the sense unit (STO), and the intermediate interconnection 83 (3rd-Wire; the third nonmagnetic layer 30n) provided therebetween.

Figure 39A:
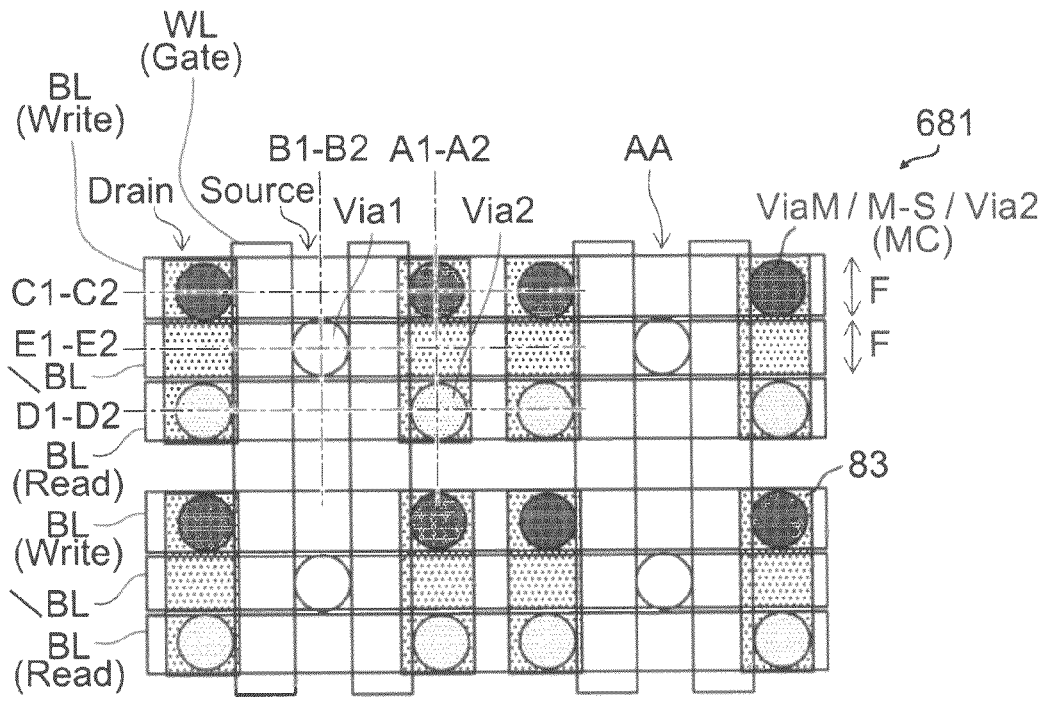
FIG. 39A and FIG. 39B are schematic plan views showing the configuration of a nonvolatile memory device according to an eighth embodiment.
Figure 39B:
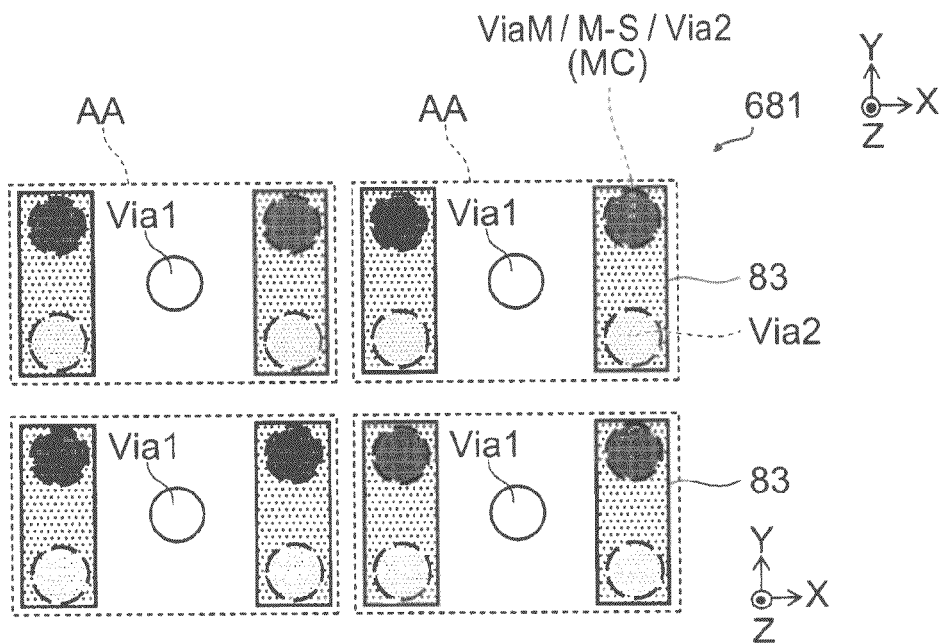

FIG. 39A and FIG. 39B are schematic plan views illustrating the configuration of a nonvolatile memory device according to an eighth embodiment.

FIG. 40A to FIG. 40E are schematic cross-sectional views illustrating the configuration of the nonvolatile memory device according to the eighth embodiment.

FIG. 40A to FIG. 40E are cross-sectional views taken along line A1-A2, B1-B2, C1-C2, D1-D2, and E1-E2, respectively, of FIG. 39A.

In the drawings, for ease of illustration, interconnection portions and element portions are shown and the detailed inner structure (e.g. the stack structure etc.) of interlayer insulating films, protection films, interconnections, active areas of transistors, etc. is omitted. Furthermore, for ease of illustration, the widths of the interconnections etc. are illustrated with alteration as appropriate in the drawings.

The drawings illustrate an example of the memory cell array unit MCA of a nonvolatile memory device 681. FIG. 39B is a schematic plan view of the intermediate interconnection 83 extracted from the configuration illustrated in FIG. 39A.

As shown in FIG. 39A, in the nonvolatile memory device 681, bit interconnections for writing BL(Write) and bit interconnections for reading BL(Read) are alternately arranged. The width of the bit interconnection for writing BL(Write), the width of the bit interconnection for reading BL(Read), and the width of the portion therebetween are almost equal to, for example, a width F.

The bit interconnection bar \BL is disposed in every other portion between the bit interconnection for writing BL(Write) and the bit interconnection for reading BL(Read). The width of the bit interconnection bar \BL is almost equal to the width F. The layer of the bit interconnection bar \BL is different from the layer of the bit interconnection for writing BL(Write) and the layer of the bit interconnection for reading BL(Read).

In this example, the bit interconnection for writing BL(Write) is, for example, a second bit interconnection, the bit interconnection for reading BL(Read) is, for example, a third bit interconnection, and the bit interconnection bar \BL is, for example, a first bit interconnection. These bit interconnections (bit lines) extend along the X-axis, for example. That is, the extending direction of the first bit interconnection is parallel to the extending direction of the second bit interconnection and the extending direction of the third bit interconnection.

That is, one bit interconnection for writing BL(Write), one bit interconnection for reading BL(Read), and one bit interconnection bar \BL therebetween make a set (bit line). The set is arranged repeatedly in plural. The spacing between the sets is, for example, the width F. Herein, the width F is, for example, the minimum line width in the design and fabrication of the nonvolatile memory device 681.

Word interconnections WL (word lines) are arranged in a direction intersecting with (e.g. orthogonal to) the extending direction of the bit interconnections (bit lines). The word interconnection WL extends along the Y-axis, for example. The width of the word interconnection WL is almost equal to the width F. The word interconnection WL is provided in plural. The spacing between two closely-aligned word interconnections WL out of the plurality of word interconnections WL is almost equal to the width F. The spacing between two word interconnections between which the distance is long out of the plurality of word interconnections WL is almost equal to three times the width F (3F).

The word interconnection WL forms the gate electrode of a transistor. The source region (source) and the drain region (drain) of the transistor are formed between two word interconnections WL between which the distance is long. The length of the source region along the Y-axis is, for example, 3F. The length of the drain region along the Y-axis is, for example, 3F.

That is, the drain region is formed between gate electrodes between which the spacing is substantially 3F. The drain regions are separated with a width of substantially F in the bit line direction.

The length of the active area (AA) of the transistor in the bit line direction is about 5F and the length in the word interconnection direction is about 3F. The spacing between the active areas (AA) of transistors is about F in the bit line direction and about F in the word interconnection direction. The three kinds of bit line mentioned above (the bit interconnection for writing BL(Write), the bit interconnection for reading BL(Read), and the bit interconnection bar \BL) are arranged so as to overlap with the active area (AA) of the transistor.

The stacked structure body M-S of the magnetic memory element is disposed in a position where the drain region and the BL(Write) overlaps.

As shown in FIG. 39A and FIG. 39B, a connection via Via1 for connection to the intermediate interconnection 83 (3rd-Wire) is disposed in a position where the bit interconnection for reading BL(Read) and the drain region overlap. The diameter of the connection via Via1 is, for example, about F. The intermediate interconnection 83 (3rd-Wire) is disposed so as to connect the connection via Via2 and the stacked structure body M-S. The width of the intermediate interconnection 83 (3rd-Wire) is, for example, about F, and the length (the length along the Y-axis) is 3F, for example.

A connection via Via1 is disposed in a position where the bit interconnection bar \BL and the source overlap. The diameter of the connection via Via1 is about F, for example.

In the memory cell array unit MCA having such a configuration, an identical structure is repeated with a period of 6F in the bit line direction, and an identical structure is repeated with a period of 4F in a direction orthogonal to the bit line. Two memory cells MC are provided in a region of 6F×4F, which is a repeating unit of the memory cell array unit MCA. Therefore, the nonvolatile memory device 681 has a $12F^2$ cell configuration.

As shown in 40A, the connection via Via2 connected to the bit interconnection for writing BL(Write) extends downward and is connected to the stacked structure body M-S. The bit interconnection for writing BL(Write) is connected to the drain region via a connection via ViaM. The bit interconnection for reading BL(Read) is connected to the intermediate interconnection 83 (3rd-Wire) extending from the stacked structure body M-S in a horizontal direction via a connection via extending downward.

The bit interconnection bar \BL is disposed above the intermediate interconnection 83 (3rd-Wire). In the region shown in the drawing, the bit interconnection bar \BL is not directly connected to other portions. In this example, the bit interconnection for writing BL(Write) is provided in the same layer as the bit interconnection for reading BL(Read). The bit interconnection bar \BL is disposed below them. However, the embodiment is not limited thereto but the vertical relationships of the members are arbitrary. For example, a configuration is possible in which the heights of the three bit interconnections are different from one another and the bit interconnection bar \BL is the uppermost layer.

Figures 40A, 40B, 40C:
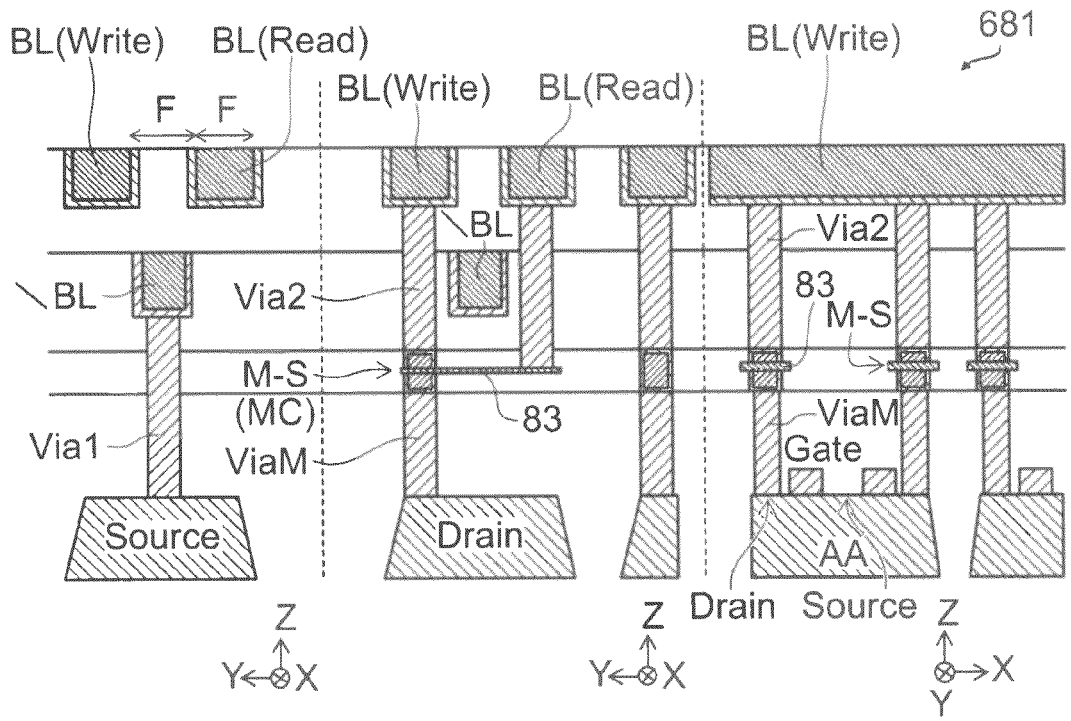
FIG. 40A to FIG. 40E are schematic cross-sectional views showing the configuration of the nonvolatile memory device according to the eighth embodiment.

As shown in FIG. 40B, the connection via Via1 connected to the bit interconnection bar \BL extends downward and is connected to the source. In the region shown in the drawing, the bit interconnection for writing BL(Write) and the bit interconnection for reading BL(Read) are not directly connected to other portions.

As shown in FIG. 40C, the connection via Via2 connected to the bit interconnection for writing BL(Write) extends downward and is connected to the stacked structure body M-S. The bit interconnection for writing BL(Write) is connected to the drain region via the connection via ViaM. A plurality of stacked structure bodies M-S are arranged with two kinds of spacing: a shorter spacing of about F and a longer spacing of about 3F. Two gates and one source region disposed therebetween are provided in a region of the longer spacing (the spacing being about 3F).

Figures 40D, 40E:
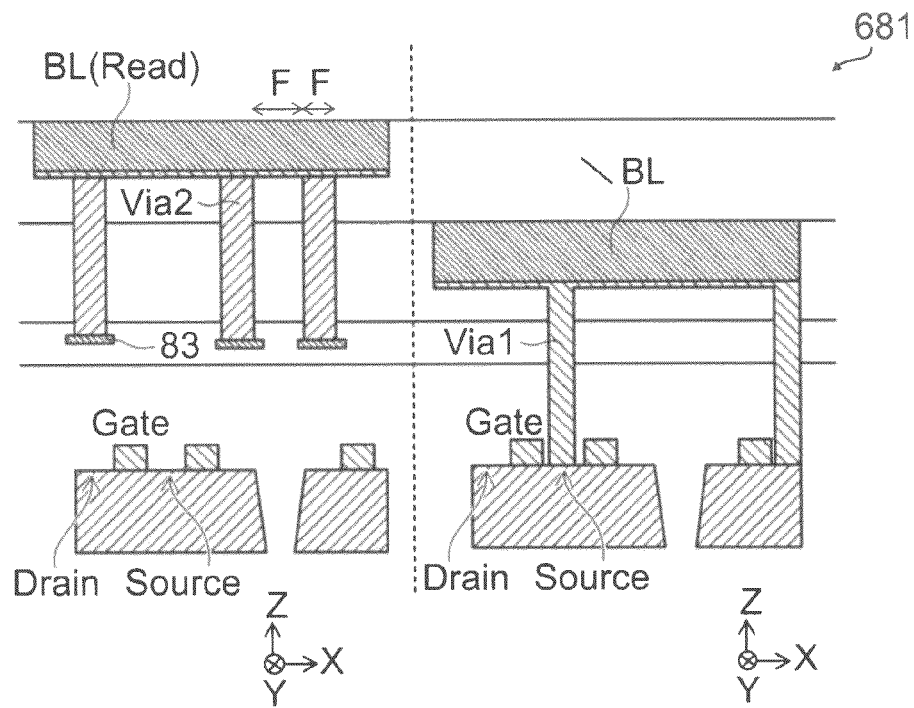

As shown in FIG. 40D, the connection via Via2 connected to the bit interconnection for reading BL(Read) extends downward and is connected to the intermediate interconnection 83 (3rd-Wire). The transistor portion (the gate, the drain, and the source) is disposed further below. In the region shown in the drawing, however, the transistor portion is not directly connected to the bit interconnection for reading BL(Read), the connection via Via2, and the intermediate interconnection 83 (3rd-Wire).

As shown in FIG. 40E, the connection via Via1 connected to the bit interconnection bar \BL extends downward and is connected to the source region. Gates are arranged on both sides of the source region, and drain regions are further arranged on the other sides of the gates.

The bit interconnection for writing BL(Write), the bit interconnection for reading BL(Read), the bit interconnection bar \BL, and the word interconnection WL mentioned above are directly or indirectly connected to the control unit 550 (not shown).

In this example, one intermediate interconnection 83 (3rd-Wire) is directly connected to one stacked structure body M-S. However, the embodiment is not limited thereto.

Figure 41A:
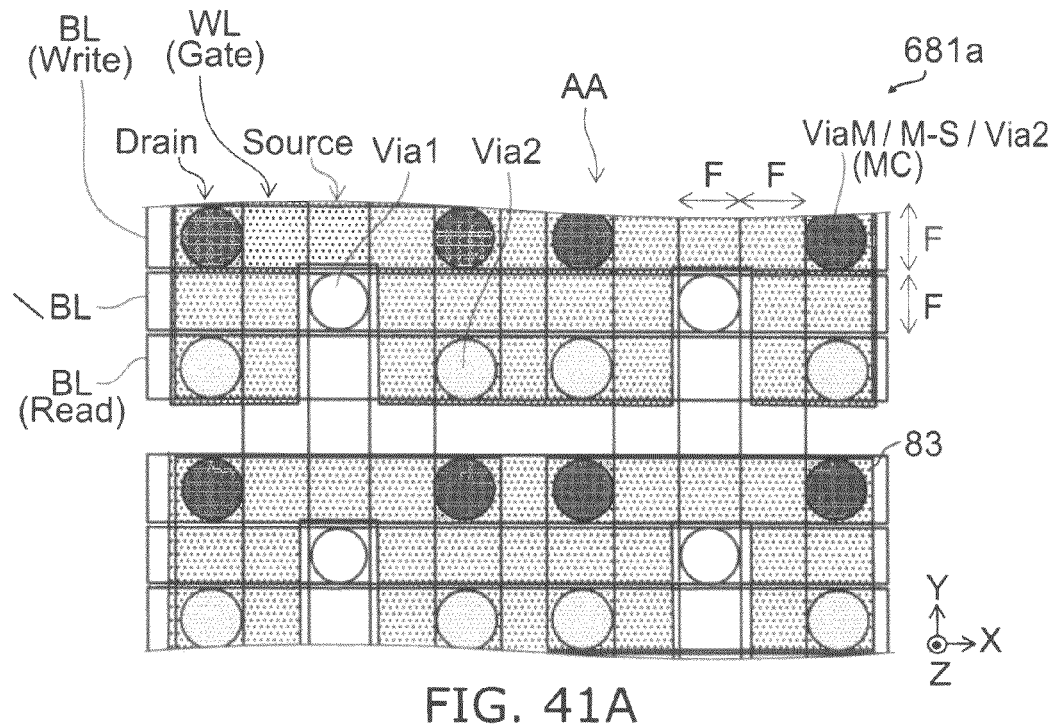
FIG. 41A and FIG. 41B are schematic plan views showing the configuration of another nonvolatile memory device according to the eighth embodiment.
Figure 41B:
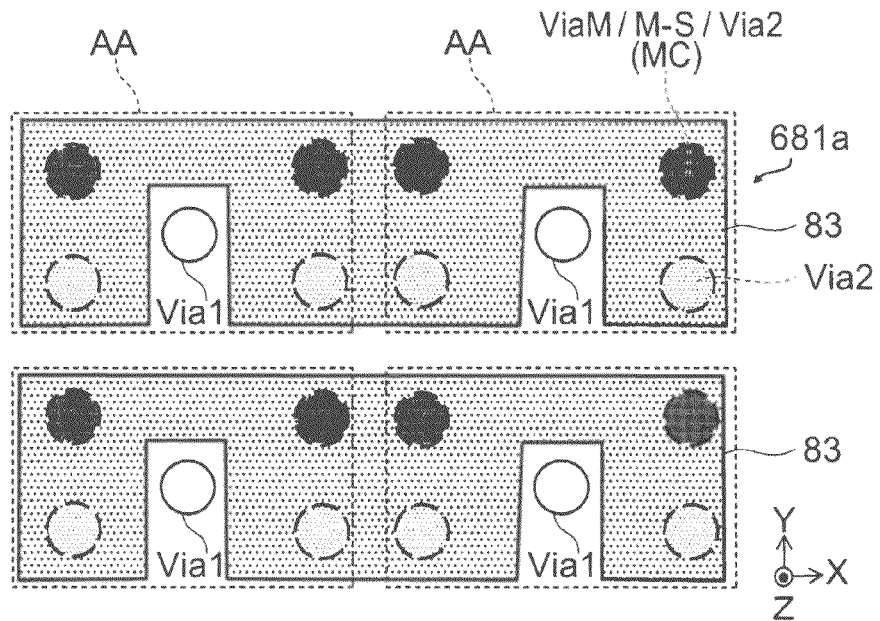

FIG. 41A and FIG. 41B are schematic plan views illustrating the configuration of another nonvolatile memory device according to the eighth embodiment.

FIG. 41B shows the intermediate interconnection 83 extracted from the configuration illustrated in FIG. 41A. The control unit 550 is omitted in the drawings.

As shown in FIG. 41A and FIG. 41B, in another nonvolatile memory device 681a according to the embodiment, the intermediate interconnections 83 (3rd-Wire) included in adjacent magnetic memory elements are connected in the extending direction of the bit interconnection for reading BL(Read) (the X-axis direction).

Figure 42:
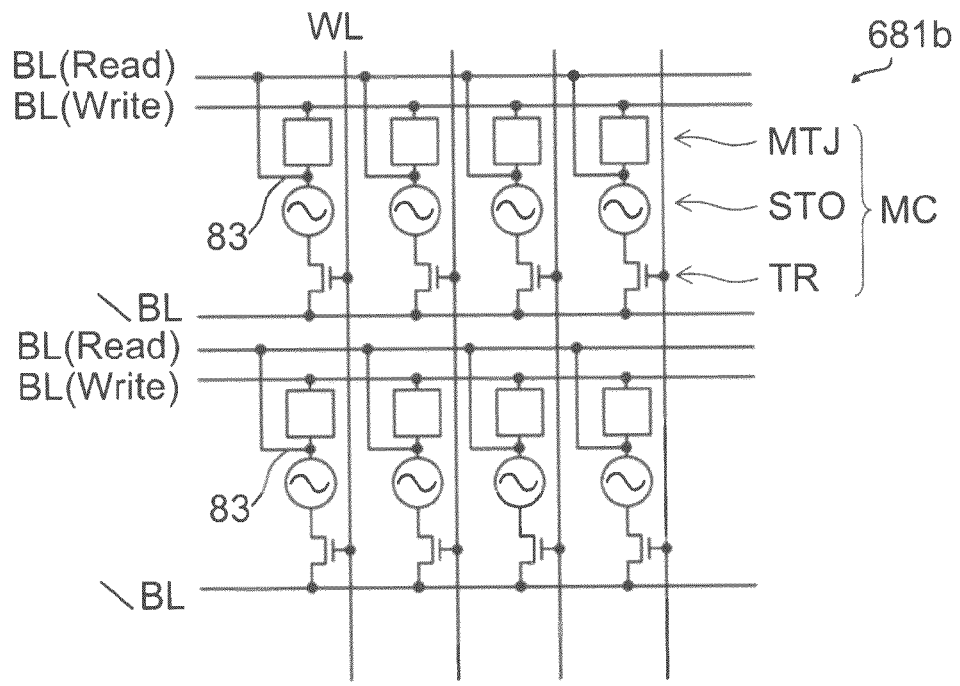
FIG. 42 is a schematic circuit diagram showing the configuration of another nonvolatile memory device according to the eighth embodiment.

FIG. 42 is a schematic circuit diagram illustrating the configuration of another nonvolatile memory device according to the eighth embodiment. As shown in FIG. 42, in a nonvolatile memory device 681b according to the embodiment, one MTJ and one STO are connected to one selection transistor TR, and these correspond to one memory cell MC. The intermediate interconnection 83 (3rd-Wire) is further connected to a portion where the STO and the MTJ are connected. The other end of the intermediate interconnection 83 (3rd-Wire) is connected to the bit interconnection for reading BL(Read). The other end of the MTJ is connected to the bit interconnection for writing BL(Write). One end of the selection transistor TR is connected to the STO and the other end is connected to the bit interconnection bar \BL.

The gate of the selection transistor TR is connected to the word interconnection WL. The bit interconnection for writing BL(Write), the bit interconnection for reading BL(Read), and the bit interconnection bar \BL are arranged parallel in a horizontal direction in the drawing. Each of the bit interconnections is connected to each of the plurality of memory cells MC. The ends (e.g. both ends) of the bit interconnections are connected to the control unit 550 (not shown in the drawing). The plurality of word interconnections WL extend in a direction orthogonal to the bit interconnections. Each of the plurality of word interconnections WL is connected to the gates of the selection transistors TR of a plurality of memory cells MC. The ends (e.g. both ends) of the plurality of word interconnections WL are connected to the control unit 550 (not shown in the drawing).

The configuration of the nonvolatile memory device 681 described in regard to FIG. 39A to FIG. 40E corresponds to a configuration in which the MTJ (the first stacked unit SB1) and the STO (the second stacked unit SB2) are disposed to be replaced with each other in the nonvolatile memory device 681b.

Figure 43:
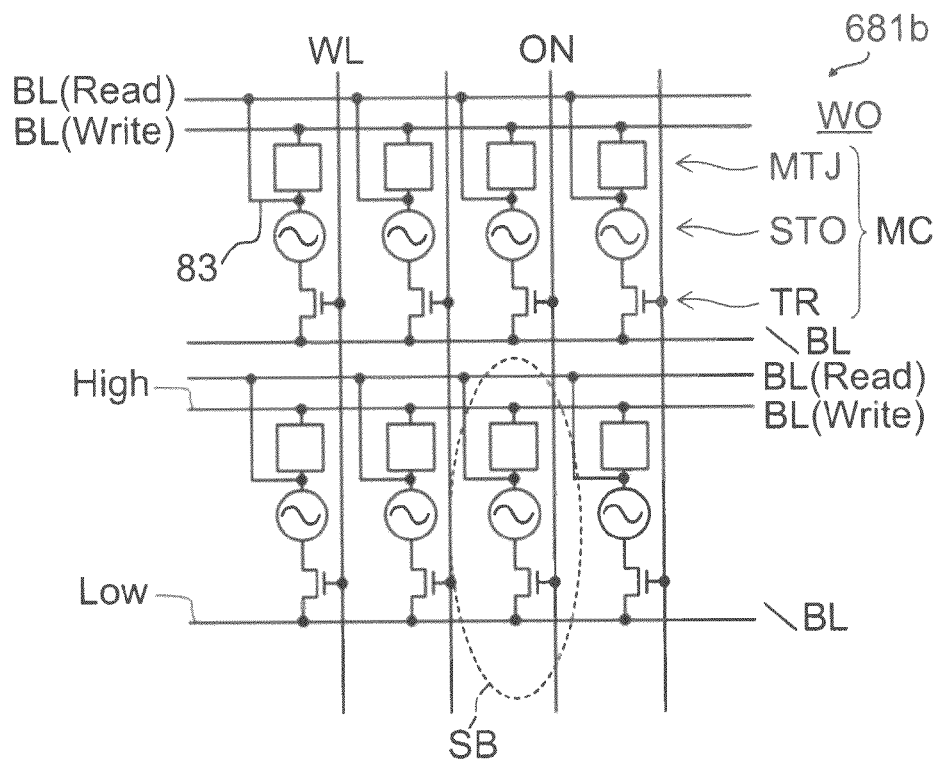
FIG. 43 is a schematic circuit diagram showing an operation of another nonvolatile memory device according to the eighth embodiment.

FIG. 43 is a schematic circuit diagram illustrating an operation of another nonvolatile memory device according to the eighth embodiment. The drawing illustrates the write operation WO in the nonvolatile memory device 681b.

As shown in FIG. 43, to switch the gate of a memory cell MC to which data will be written (herein referred to as a selected bit SB) to ON, the word interconnection WL connected to the selected bit SB is switched to ON. Further, the bit interconnection for writing BL(Write) connected to the selected bit SB is set in a High state, and the bit interconnection bar \BL connected to the selected bit SB is set in a Low state. Thereby, in the selected bit SB, the write current $I_W$ flows through the STO and the MTJ to perform data writing.

At this time, a sneak current is produced via the MTJ unit, the intermediate interconnection 83 (3rd-Wire), and the bit interconnection for reading BL(Read) of a not-selected bit. However, the interconnection resistance of the bit interconnection for writing BL(Write) may be set lower than that of the intermediate interconnection 83 (3rd-Wire). Thereby, the sneak current is suppressed to prevent influence on the write operation WO. To make this more effective, a diode may be connected to the intermediate interconnection 83 (3rd-Wire).

Figure 44:
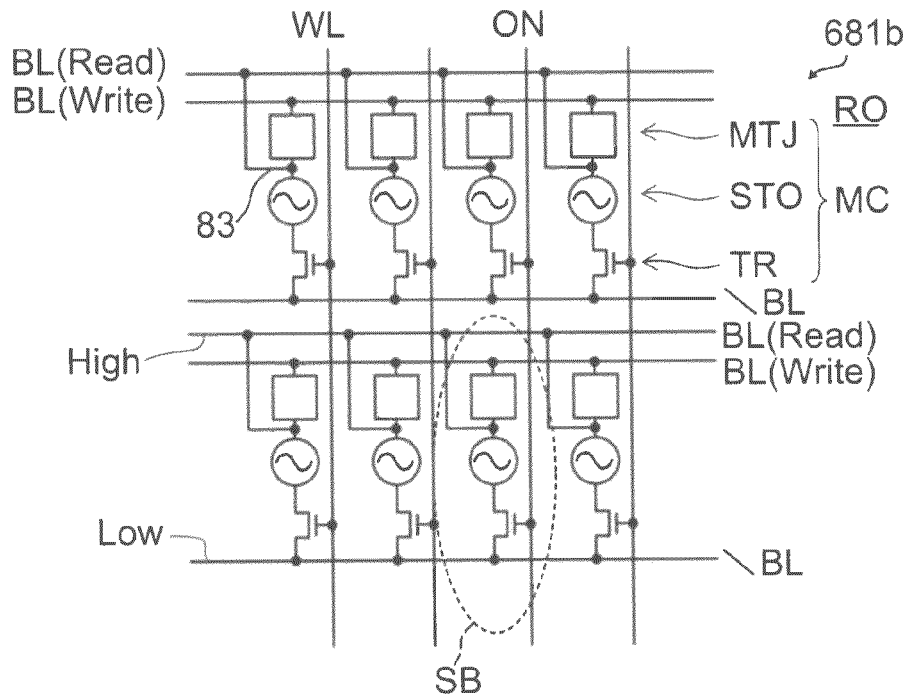
FIG. 44 is a schematic circuit diagram showing an operation of another nonvolatile memory device according to the eighth embodiment.

FIG. 44 is a schematic circuit diagram illustrating an operation of another nonvolatile memory device according to the eighth embodiment. The drawing illustrates the read operation in the nonvolatile memory device 681*b*.

As shown in FIG. 44, to switch the gate of the selected bit SB to ON, the word interconnection WL connected to the selected bit SB is switched to ON. Further, the bit interconnection for reading BL(Read) connected to the selected bit SB is set in the High state, and the bit interconnection bar \BL connected to the selected bit SB is set in the Low state. Thereby, in the selected bit SB, the read current Ir flows through the STO to perform data reading.

At this time, a sneak current is produced via the MTJ unit, the intermediate interconnection 83 (3rd-Wire), and the bit interconnection for writing BL(Write) of a not-selected bit and a current flows also through the MTJ of the selected bit SB. However, since the current is small, reading can be performed without causing false writing.

Figure 45:
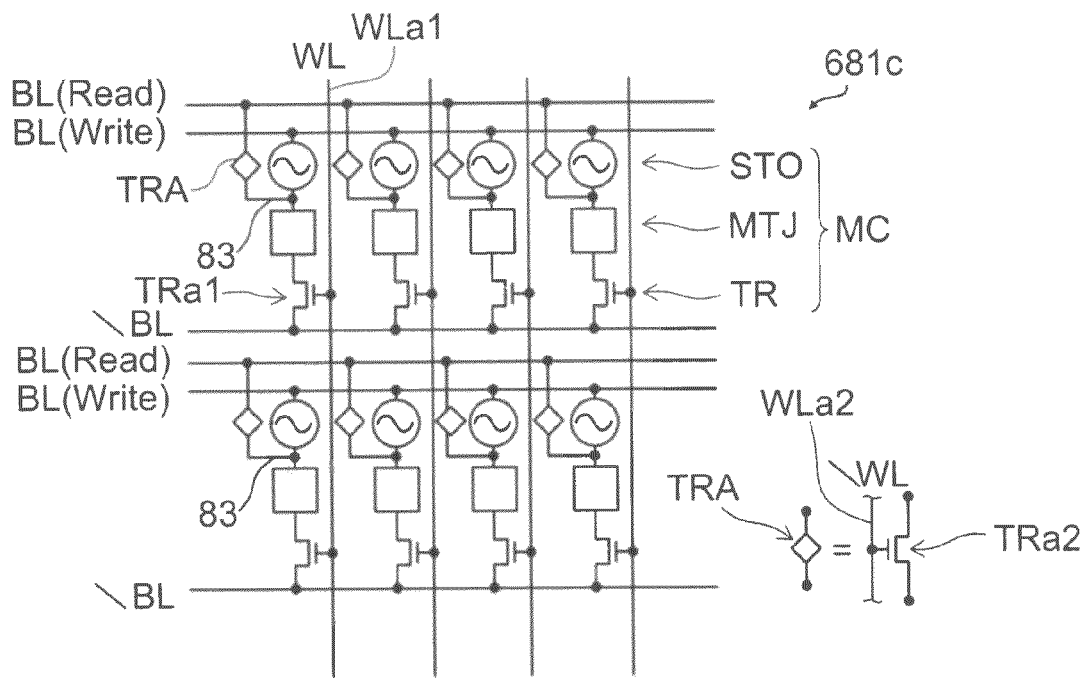
FIG. 45 is a schematic circuit diagram showing the configuration of another nonvolatile memory device according to the eighth embodiment.

FIG. 45 is a schematic circuit diagram illustrating the configuration of another nonvolatile memory device according to the eighth embodiment.

As shown in FIG. 45, in a nonvolatile memory device 681*c* according to the embodiment, one end of the intermediate interconnection 83 is connected to one end of the MTJ and one end of the STO. The other end of the MTJ is connected to one of the source and the drain of a first transistor TRa1. The other of the source and the drain of the first selection transistor TRa1 is connected to the bit interconnection bar \BL. The gate of the first selection transistor TRa1 is connected to the word interconnection WL. The other end of the STO is connected to the BL(Write). The other end of the intermediate interconnection 83 is connected to one of the source and the drain of a second selection transistor TRa2. The bit interconnection for reading BL(Read) is connected to the other of the source and the drain of the second selection transistor TRa2. The gate of the second selection transistor TRa2 is connected to a word interconnection bar \WL. The word interconnection bar \WL extends along, for example, the extending direction of the word interconnection WL.

In this example, the first bit interconnection (the bit interconnection bar \BL) connects one end of the magnetic memory element and the control unit 550 directly or indirectly. The second bit interconnection (the bit interconnection for writing BL(Write)) connects the other end of the magnetic memory element and the control unit 550 directly or indirectly. The third bit interconnection (the bit interconnection for reading BL(Read)) connects the third nonmagnetic layer 83 and the control unit 550 directly or indirectly. The first transistor TRa1 is provided at least one of between the first bit interconnection and the one end mentioned above and between the second bit interconnection and the other end mentioned above (in this example, provided between the first bit interconnection and the one end mentioned above). The second selection transistor TRa2 is provided between the third bit interconnection and the third nonmagnetic layer 83.

A first word interconnection WLa1 connects the gate of the first selection transistor TRa1 and the control unit 550 directly or indirectly. A second word interconnection WLa2 connects the gate of the second selection transistor TRa2 and the control unit 550 directly or indirectly.

Also in such a configuration, the read operation of detecting the frequency f of the oscillation of the STO based on the direction of the magnetization of the MTJ is performed.

Ninth Embodiment

Also in the embodiment, one of the magnetic memory elements according to the first to fourth embodiments is used.

Figure 46A:
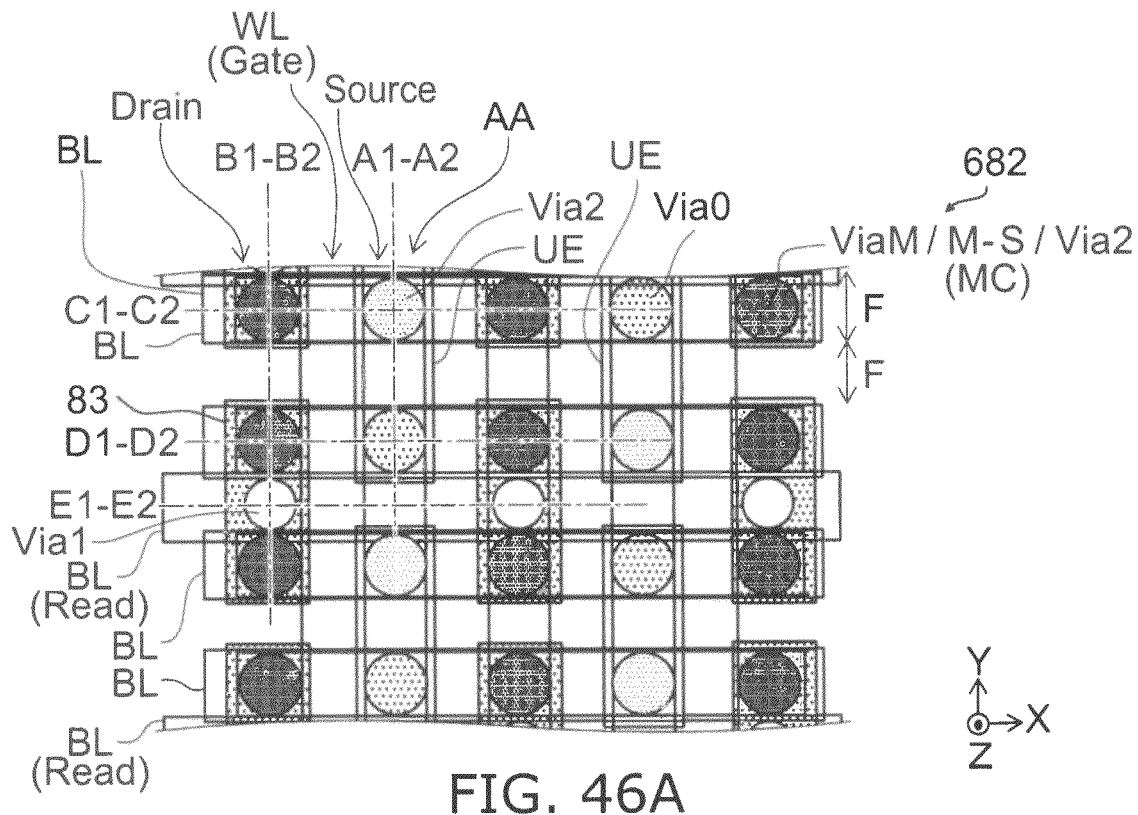
FIG. 46A and FIG. 46B are schematic plan views showing the configuration of a nonvolatile memory device according to a ninth embodiment.
Figure 46B:
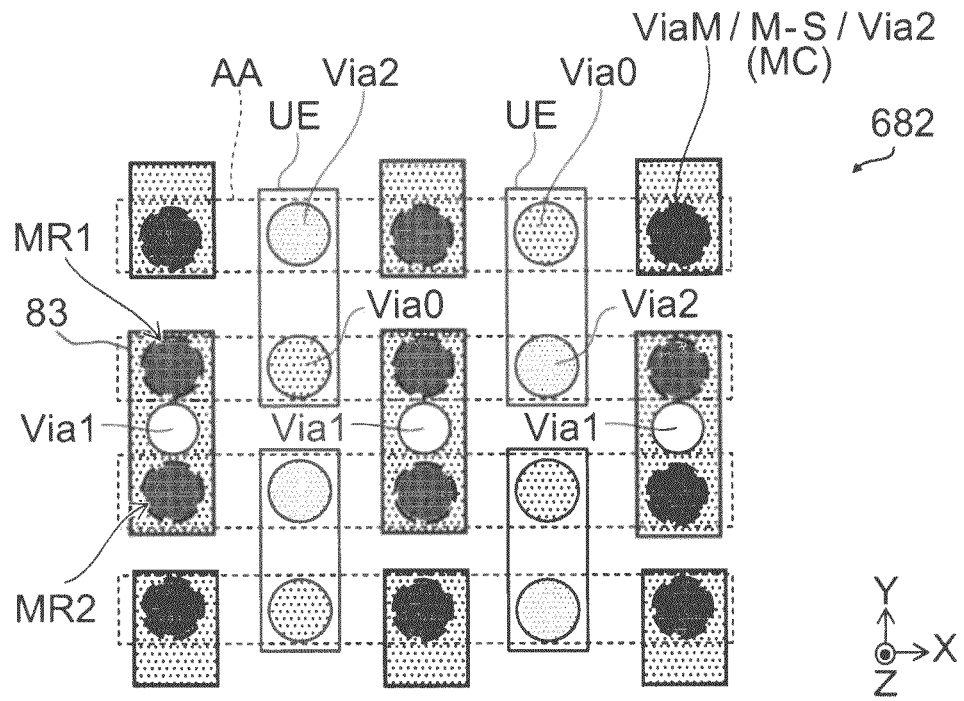

FIG. 46A and FIG. 46B are schematic plan views illustrating the configuration of a nonvolatile memory device according to a ninth embodiment.

FIG. 47A to FIG. 47E are schematic cross-sectional views illustrating the configuration of the nonvolatile memory device according to the ninth embodiment.

FIG. 47A to FIG. 47E are cross-sectional views taken along line A1-A2, B1-B2, C1-C2, D1-D2, and E1-E2, respectively, of FIG. 46A. FIG. 46B is a schematic plan view of the intermediate interconnection 83 extracted from the configuration illustrated in FIG. 46A. The control unit 550 is omitted in the drawings.

As shown in FIG. 46A, in a nonvolatile memory device 682, a plurality of multiple-use bit interconnections BL with a width of about F are arranged with intervals of about F. A plurality of word interconnections WL with a width of about F are arranged with intervals of about F in a direction intersecting with (in this example, orthogonal to) the multiple-use bit interconnection BL.

Further, the bit interconnection for reading BL(Read) with a width of about F is disposed in every other portion between multiple-use bit interconnections BL parallel to the extending direction of the multiple-use bit interconnection BL.

The connection via Via1 connected to the intermediate interconnection 83 (3rd-Wire) is provided in a position overlapping with the bit interconnection for reading BL(Read). The diameter of the connection via Via1 is, for example, about F. The connection via Via1 is provided in plural. The spacing between connection vias Via1 is, for example, 3F.

As shown in FIG. 46A and FIG. 46B, the intermediate interconnection 83 (3rd-Wire) is provided in a position overlapping with the connection via Via1. The width of the intermediate interconnection 83 (3rd-Wire) is about F. The long side of the intermediate interconnection 83 (3rd-Wire) extends in a direction intersecting with (e.g. orthogonal to) the bit interconnection for reading BL(Read), and has a length of about 3F. The connection via Via1 is disposed almost at the center of the intermediate interconnection 83 (3rd-Wire).

The stacked structure body M-S of the magnetic memory element (a first magnetic memory element MR1 and a second magnetic memory element MR2) is disposed on both sides of the intermediate interconnection 83 (3rd-Wire). The stacked structure body M-S is disposed so as to overlap with the multiple-use bit interconnection BL. The transistor active area (AA) is disposed so as to almost overlap with the multiple-use bit interconnection BL. The width of the transistor active area is, for example, about F. The transistor active area intersects with (e.g. is orthogonal to) the word interconnection WL. The word interconnection WL forms the gate of the transistor.

The drain and the source are alternately arranged beside the gate. The drain and the stacked structure body M-S of the magnetic memory element are arranged to overlap.

A connection via Via0 connected to the source and the connection via Via2 connected to the multiple-use bit interconnection BL are arranged in a position overlapping with the source. The connection via Via0 and the connection via Via2 are alternately arranged both in a direction parallel to the multiple-use bit interconnection BL and in a direction orthogonal to the multiple-use bit interconnection BL. In regard to the connection via Via0 and the connection via Via2 arranged in the direction orthogonal to the multiple-use bit interconnection BL, two proximal ones make one set and are connected via an in-cell local interconnection UE. The width of the in-cell local interconnection UE is, for example, about F, and the length is about 3F. The in-cell local interconnection UE is disposed so as not to overlap with the bit interconnection for reading BL(Read).

In regard to the memory cell array unit MCA having such a configuration, an identical structure is repeated with a period of 8F in the direction of the multiple-use bit interconnection BL, and an identical structure is repeated with a period of 4F in a direction orthogonal to the multiple-use bit interconnection BL. Four memory cells MC are provided in a repeating unit of 8F×4F. The nonvolatile memory device 682 has an $8F^2$ cell configuration.

Figures 47A, 47B, 47C:
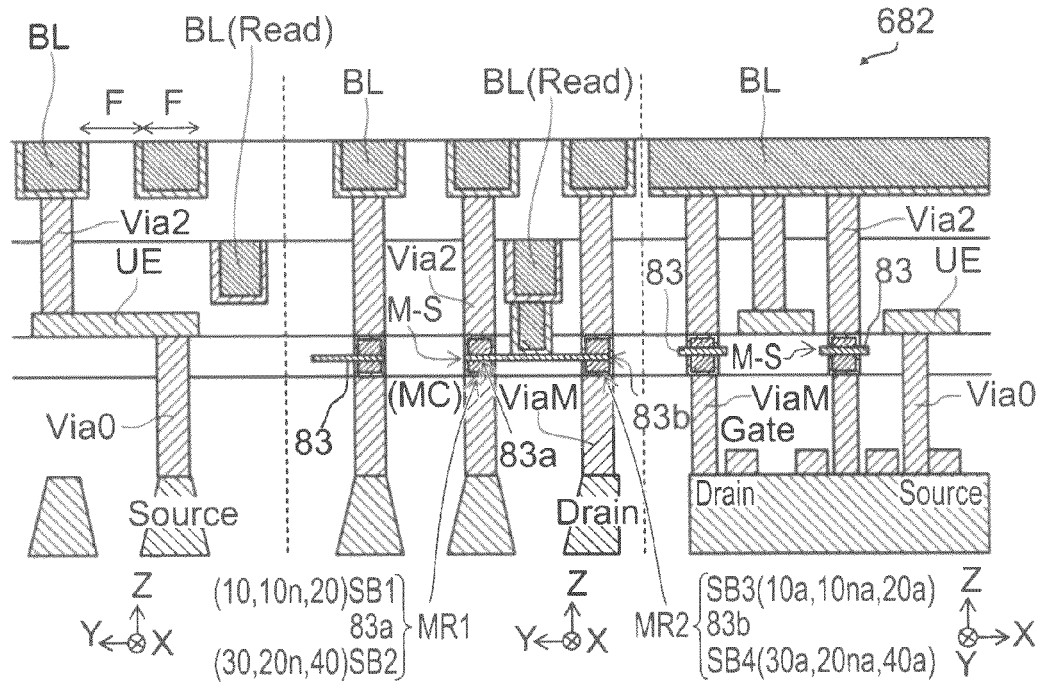
FIG. 47A to FIG. 47E are schematic cross-sectional views showing the configuration of the nonvolatile memory device according to the ninth embodiment.

As shown in FIG. 47A, the connection via Via2 connected to the multiple-use bit interconnection BL extends downward and is connected to one end of the in-cell local interconnection UE. The connection via Via0 extends from the other end of the in-cell local interconnection UE, and the in-cell local interconnection UE is connected to the source. The bit interconnection for reading BL(Read) is not disposed above the in-cell local interconnection UE, and is disposed in a portion where there is no in-cell local interconnection UE. In the region shown in the drawing, the source below the connection via Via2 is not directly connected to other portions. Although the bit interconnection for reading BL(Read) is disposed below the multiple-use bit interconnection BL in this example, the vertical arrangement relationship of them is arbitrary.

As shown in FIG. 47B, the connection via Via2 connected to the multiple-use bit interconnection BL extends downward and is connected to the stacked structure body M-S. The multiple-use bit interconnection BL is further connected to the drain via the connection via ViaM below the multiple-use bit interconnection BL. Two stacked structure bodies M-S adjacent in a horizontal direction (e.g. the X-axis direction) are connected via the intermediate interconnection 83 (3rd-Wire). The connection via Via1 connected to the central portion of the intermediate interconnection 83 (3rd-Wire) and extending upward is connected to the bit interconnection for reading BL(Read).

The first magnetic memory element MR1 includes the first stacked unit SB1, the second stacked unit SB2, and a first intermediate interconnection (a part of the intermediate interconnection 83). The second magnetic memory element MR2 includes a third stacked unit SB3, a fourth stacked unit SB4, and a second intermediate interconnection (another part of the intermediate interconnection 83). The third stacked unit SB3 includes a fifth ferromagnetic layer 10*a*, a sixth ferromagnetic layer 20*a*, and a third nonmagnetic layer 10*na*. The configurations of the fifth ferromagnetic layer 10*a*, the sixth ferromagnetic layer 20*a*, and the third nonmagnetic layer 10*na* correspond to the configurations of the first ferromagnetic layer 10, the second ferromagnetic layer 20, and the first nonmagnetic layer 10*n*, respectively. The fourth stacked unit SB4 includes a seventh ferromagnetic layer 30*a*, an eighth ferromagnetic layer 40*a*, and a fourth nonmagnetic layer 20*na*. The configurations of the seventh ferromagnetic layer 30*a*, the eighth ferromagnetic layer 40*a*, and the fourth nonmagnetic layer 20*na* correspond to the configurations of the third ferromagnetic layer 30, the fourth ferromagnetic layer 40, and the second nonmagnetic layer 20*n*, respectively.

As shown in FIG. 47C, the connection via Via2 connected to the multiple-use bit interconnection BL extends downward and is connected to the stacked structure body M-S or the in-cell local interconnection UE. The stacked structure body M-S and the in-cell local interconnection UE are alternately arranged in a horizontal direction (e.g. the X-axis direction). Some of the in-cell local interconnections UE are connected to the multiple-use bit interconnection BL via the connection via Via2 extending upward. The others of the in-cell local interconnections UE are connected to the source via the connection via Via0 extending downward. These two kinds of in-cell local interconnection UE are alternately arranged. Although the stacked structure body M-S is disposed below the in-cell local interconnection UE in this example, the vertical arrangement relationship of them is arbitrary.

Figures 47D, 47E:
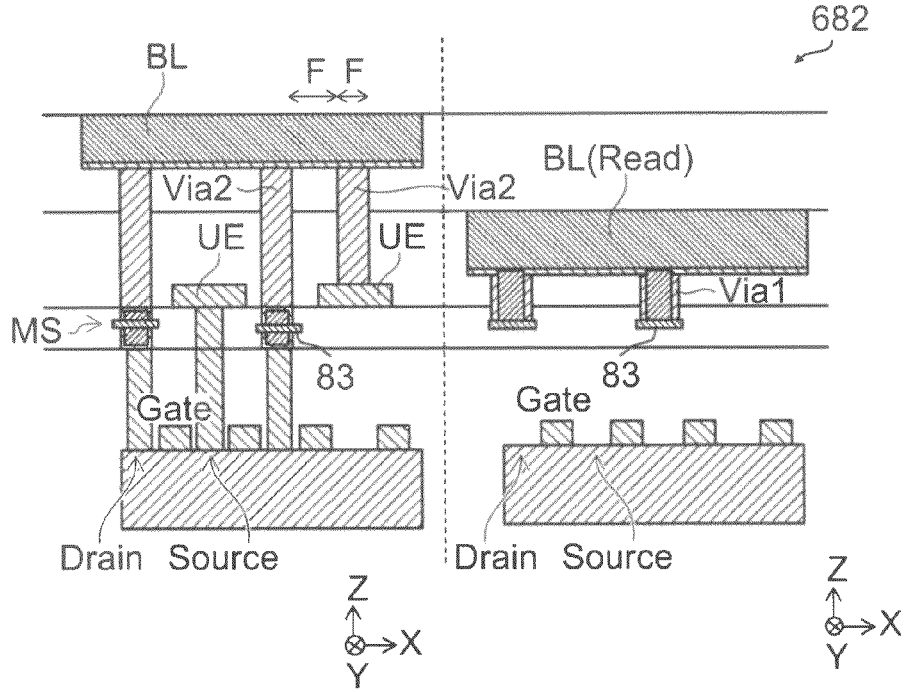

As shown in FIG. 47D, the arrangement of the connection via Via0 and the connection via Via2 connected to the in-cell local interconnection UE is opposite to the arrangement of the connection via Via0 and the connection via Via2 illustrated in FIG. 47C. The structure of the C1-C2 cross section of FIG. 46A corresponds to the structure of the D1-D2 cross section translated in a horizontal direction (the X-axis direction) by a distance of 4F.

As shown in FIG. 47E, the connection via Via1 connected to the bit interconnection for reading BL(Read) extends downward and is connected to the intermediate interconnection 83 (3rd-Wire). The drain is disposed below the intermediate interconnection 83 (3rd-Wire). In the region shown in the drawing, the drain, the gate, and the source are not directly connected to interconnections thereabove.

This example has a structure in which one intermediate interconnection 83 (3rd-Wire) is directly connected to two stacked structure bodies M-S. However, the embodiment is not limited thereto.

Figure 48A:
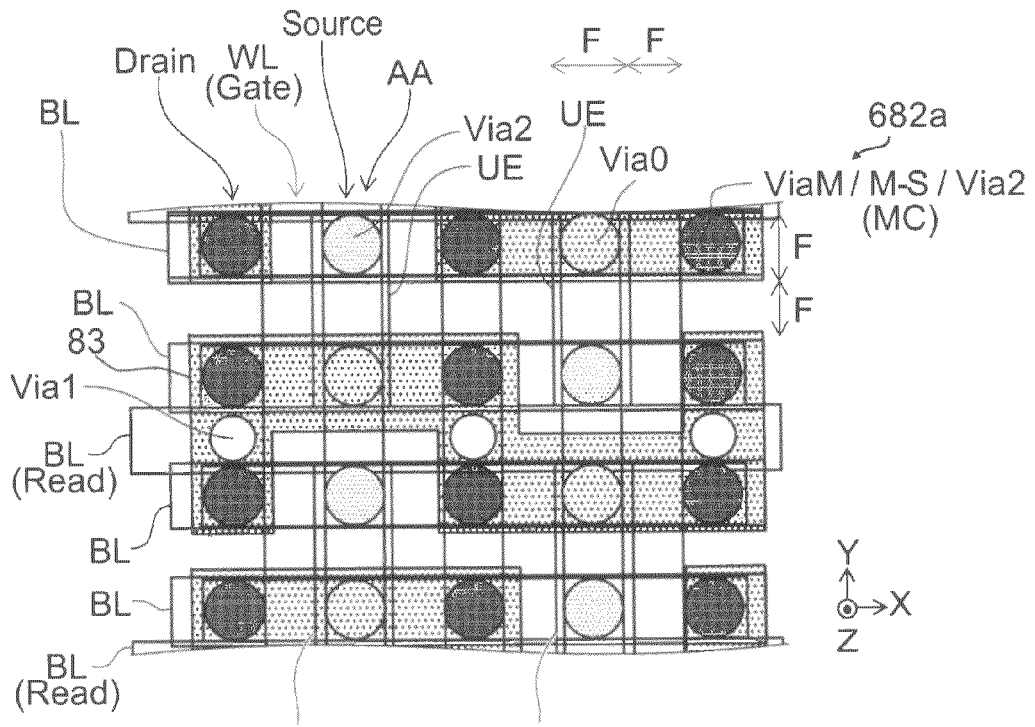
FIG. 48A and FIG. 48B are schematic plan views showing the configuration of another nonvolatile memory device according to the ninth embodiment.
Figure 48B:
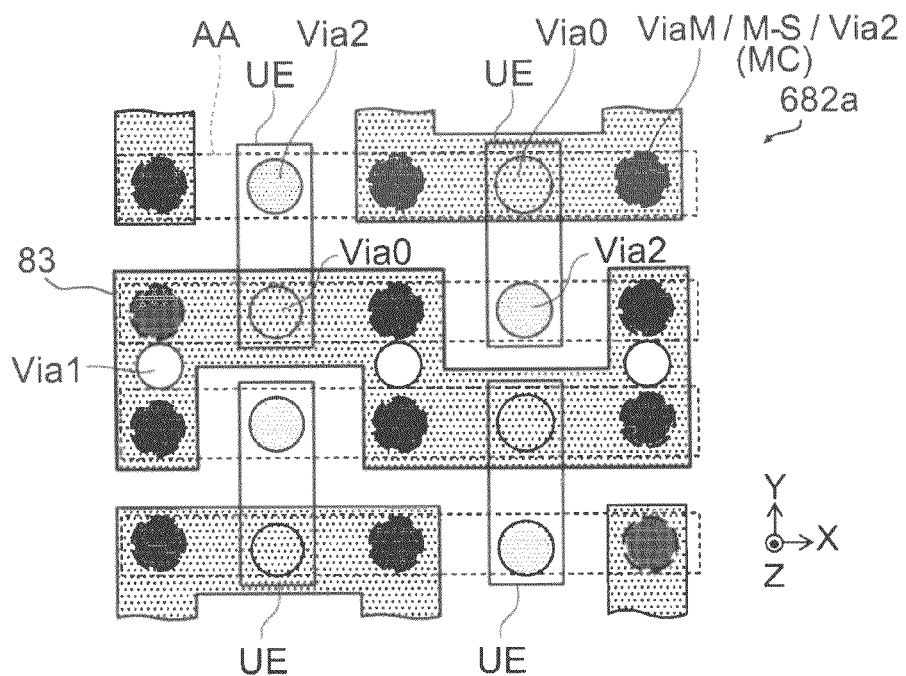

FIG. 48A and FIG. 48B are schematic plan views illustrating the configuration of another nonvolatile memory device according to the ninth embodiment.

FIG. 48B shows the intermediate interconnection 83 extracted from the configuration illustrated in FIG. 48A.

As shown in FIG. 48A and FIG. 48B, in another nonvolatile memory device 682*a* according to the embodiment, the intermediate interconnections 83 (3rd-Wire) included in adjacent magnetic memory elements are connected to each other in the extending direction of the bit interconnection for reading BL(Read) (the X-axis direction).

Figure 49A:
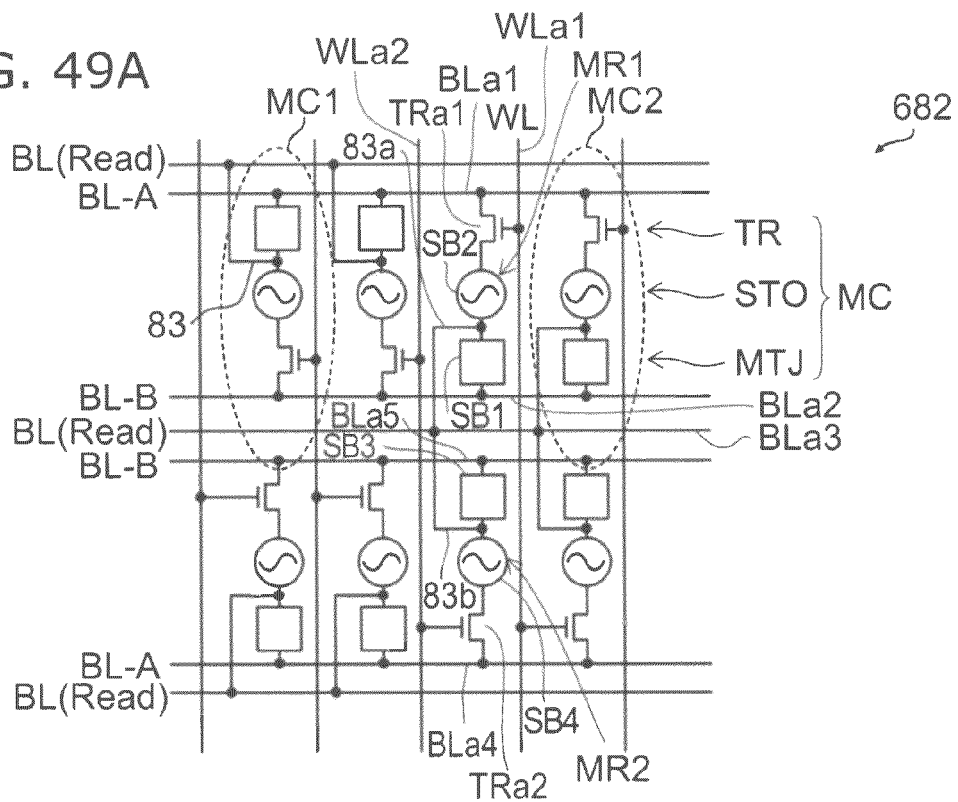
FIG. 49A and FIG. 49B are schematic circuit diagrams showing the configurations of nonvolatile memory devices according to the ninth embodiment.
Figure 49B:
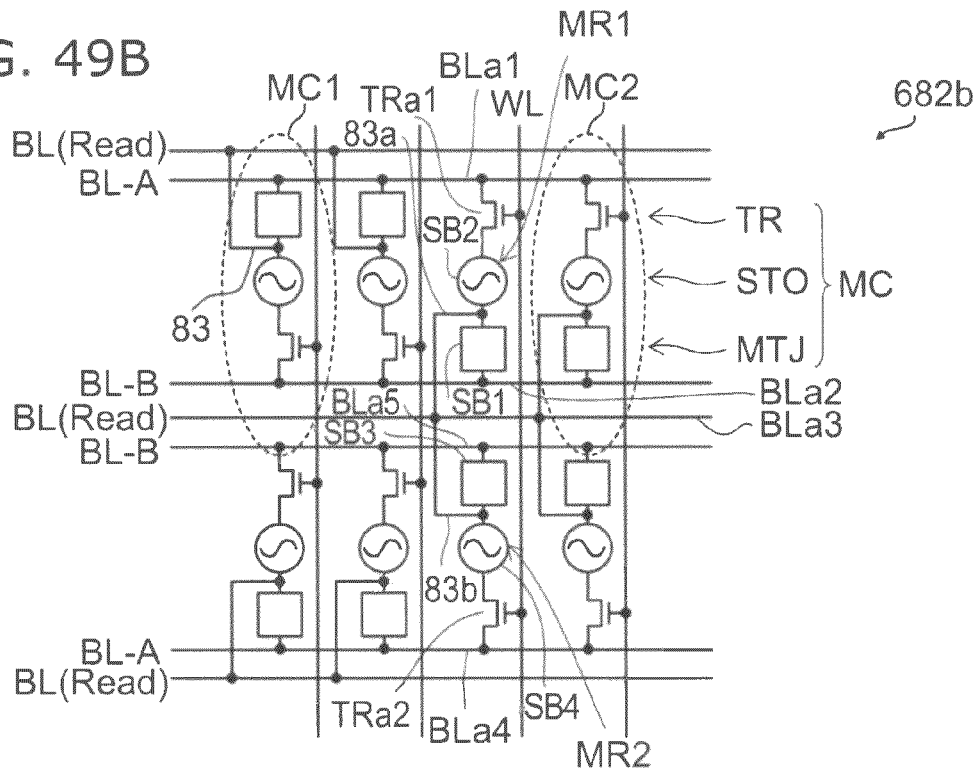

FIG. 49A and FIG. 49B are schematic circuit diagrams illustrating the configurations of nonvolatile memory devices according to the ninth embodiment.

FIG. 49A is a schematic circuit diagram of the nonvolatile memory device 682 mentioned above. In this configuration, two kinds of multiple-use bit interconnection BL (a multiple-use bit interconnection BL-A and a multiple-use bit interconnection BL-B) take the roles of the bit interconnection for writing BL(Write) and the bit interconnection bar \BL depending on the memory cell MC connected thereto.

As shown in FIG. 49B, the configuration of a nonvolatile memory device 682*b* corresponds to a configuration in which the MTJ (the first stacked unit SB1) and the STO (the second stacked unit SB2) are disposed to be replaced with each other in the nonvolatile memory device 682 mentioned above. Also in the nonvolatile memory device 682*b* according to the embodiment, two kinds of multiple-use bit interconnection BL (the multiple-use bit interconnection BL-A and the multiple-use bit interconnection BL-B) take the roles of the bit interconnection for writing BL(Write) and the bit interconnection bar \BL depending on the memory cell MC connected thereto.

That is, for a first memory cell MC1, the multiple-use bit interconnection BL-A functions as the bit interconnection for writing BL(Write) and the multiple-use bit interconnection BL-B functions as the bit interconnection bar \BL. For a second memory cell MC2, the multiple-use bit interconnection BL-A functions as the bit interconnection bar \BL and the multiple-use bit interconnection BL-B functions as the bit interconnection for writing BL(Write).

Also in this configuration, the write operation WO and the read operation RO mentioned above described in regard to the embodiment are performed.

In this example, in one memory cell MC (a set of the MTJ and the STO), the bit interconnection for reading BL(Read) is, for example, the third bit interconnection, the multiple-use bit interconnection BL-A is the second bit interconnection, and the multiple-use bit interconnection BL-B is the first bit interconnection. In another memory cell MC (a set of the MTJ and the STO), the bit interconnection for reading BL(Read) is, for example, the third bit interconnection, the multiple-use bit interconnection BL-A is the first bit interconnection, and the multiple-use bit interconnection BL-B is the second bit interconnection.

Also in this example, the extending direction of the first bit interconnection is parallel to the extending direction of the second bit interconnection and the extending direction of the third bit interconnection.

Figure 50A:
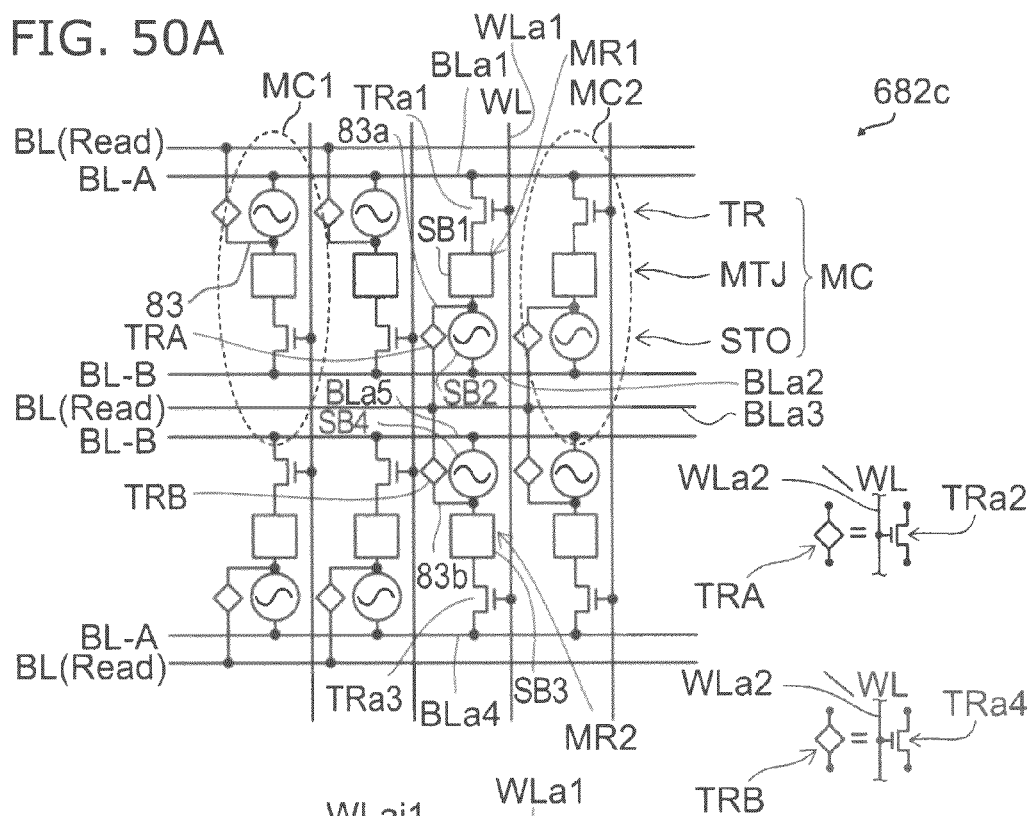
FIG. 50A and FIG. 50B are schematic circuit diagrams showing the configurations of other nonvolatile memory devices according to the ninth embodiment.
Figure 50B:
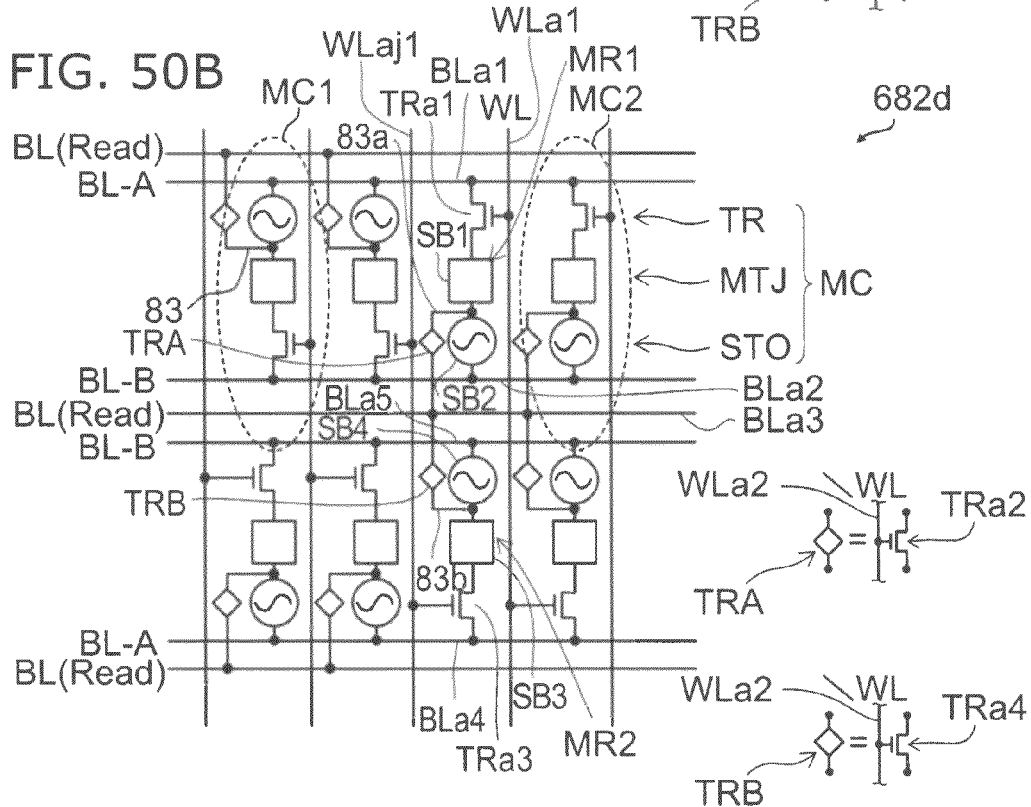

FIG. 50A and FIG. 50B are schematic circuit diagrams illustrating the configurations of other nonvolatile memory devices according to the ninth embodiment.

As shown in FIG. 50A, a nonvolatile memory device 682c according to the embodiment has a configuration in which the MTJ (the first stacked unit SB1) and the STO (the second stacked unit SB2) are disposed to be replaced with each other and a switch TRA is further provided in the configuration of the nonvolatile memory device 682b. The gate of the second transistor TRa2 included in the switch TRA is connected to the word interconnection bar \WL. Some bit interconnections are multiply used in the nonvolatile memory device 682c.

That is, the nonvolatile memory device 682c includes the first magnetic memory element MR1, the second magnetic memory element MR2, a first to a fifth bit interconnection BLa1 to BLa5, a first to a fourth selection transistor TRa1 to TRa4, and the first and second word interconnections WLa1 and WLa2.

The first magnetic memory element MR1 includes the first stacked unit SB1, the second stacked unit SB2, and an intermediate interconnection 83a (e.g. a part of the intermediate interconnection 83).

The first stacked unit SB1 includes the first ferromagnetic layer 10 in which the magnetization is fixed in the first direction, the second ferromagnetic layer 20 stacked with the first ferromagnetic layer 10 and in which the direction of the magnetization is variable, and the first nonmagnetic layer 10n provided between the first ferromagnetic layer 10 and the second ferromagnetic layer 20.

The second stacked unit SB2 is stacked with the first stacked unit SB1 along the stacking direction SD1 running from the first ferromagnetic layer 10 toward the second ferromagnetic layer 20. The second stacked unit SB2 includes the third ferromagnetic layer 30 in which the direction of the magnetization is variable, the fourth ferromagnetic layer 40 stacked with the third ferromagnetic layer 30 along the stacking direction SD1 and in which the magnetization is fixed in the second direction, and the second nonmagnetic layer 20n provided between the third ferromagnetic layer 30 and the fourth ferromagnetic layer 40.

The first intermediate interconnection 83a is provided between the first stacked unit SB1 and the second stacked unit SB2.

The second magnetic memory element MR2 is juxtaposed to the first magnetic memory element MR1 along an axis orthogonal to the stacking direction SD1. The second magnetic memory element MR2 has a similar configuration to the first magnetic memory element MR1. That is, the second magnetic memory element MR2 includes the third stacked unit SB3, the fourth stacked unit SB4, and a second intermediate interconnection 83b.

The third stacked unit SB3 includes the fifth ferromagnetic layer 10a in which the magnetization is fixed in a third direction, the sixth ferromagnetic layer 20a stacked with the fifth ferromagnetic layer 10a along the stacking direction SD1 and in which the direction of the magnetization is variable, and the third nonmagnetic layer 10na provided between the fifth ferromagnetic layer 10a and the sixth ferromagnetic layer 20a.

The fourth stacked unit SB4 is stacked with the third stacked unit SB3 along the stacking direction SD1. The fourth stacked unit SB4 includes the seventh ferromagnetic layer 30a in which the direction of the magnetization is variable, the eighth ferromagnetic layer 40a staked with the seventh ferromagnetic layer 30a along the stacking direction SD1 and in which the magnetization is fixed in a fourth direction, and the fourth nonmagnetic layer 20na provided between the seventh ferromagnetic layer 30a and the eighth ferromagnetic layer 40a.

The second intermediate interconnection 83b is provided between the third stacked unit SB3 and the fourth stacked unit SB4.

The first bit interconnection BLa1 is (directly or) indirectly connected to a first end of the first stacked unit SB1 on the side opposite to the first intermediate interconnection 83a.

The second bit interconnection BLa2 is directly or indirectly connected to a second end of the second stacked unit SB2 on the side opposite to the first intermediate interconnection 83a.

The third bit interconnection BLa3 is (directly or) indirectly connected to the first intermediate interconnection 83a and the second intermediate interconnection 83b.

The fourth bit interconnection BLa4 is (directly or) indirectly connected to a third end of the third stacked unit SB3 on the side opposite to the second intermediate interconnection 83b.

The fifth bit interconnection BLa5 is directly or indirectly connected to a fourth end of the fourth stacked unit SB4 on the side opposite to the second intermediate interconnection 83b.

The first selection transistor TRa1 is disposed between the first bit interconnection BLa1 and the first end.

The second selection transistor TRa2 is connected between the first intermediate interconnection 83a and the third bit interconnection BLa3.

The third selection transistor TRa3 is disposed between the fourth bit interconnection BLa4 and the third end.

The fourth selection transistor TRa4 is connected between the second intermediate interconnection 83b and the third bit interconnection BLa3.

The first word interconnection WLa1 is directly or indirectly connected to the gate of the first selection transistor TRa1 and the gate of the third selection transistor TRa3.

The second word interconnection WLa2 is directly or indirectly connected to the gate of the second selection transistor TRa2 and the gate of the fourth selection transistor TRa2.

The reading unit 510 of the control unit 550 is connected to the first to fifth bit interconnections BLa1 to BLa5. The reading unit 510 reads out the direction of the magnetization of the second ferromagnetic layer 20 by detecting the change in the frequency f of the oscillation of the third ferromagnetic layer 30 in accordance with the direction of the magnetization of the second ferromagnetic layer 20. Furthermore, the reading unit 510 reads out the direction of the magnetization of the sixth ferromagnetic layer 20a by detecting the change in the frequency of the oscillation of the seventh ferromagnetic layer 30a in accordance with the direction of the magnetization of the sixth ferromagnetic layer 20a.

As shown in FIG. 50B, a nonvolatile memory device 682d has a configuration in which the gate of the third selection transistor TRa3 is connected to another word interconnection WL (an adjacent word interconnection WLaj1) adjacent to the first word interconnection WLa1 in the configuration of the nonvolatile memory device 682c. Also in this case, the direction of the magnetization of the second ferromagnetic layer 20 is read out by detecting the change in the frequency f of the oscillation of the third ferromagnetic layer 30 in accordance with the direction of the magnetization of the second ferromagnetic layer 20.

Tenth Embodiment

Also in the embodiment, one of the magnetic memory elements according to the first to fourth embodiments is used.

Figure 51:
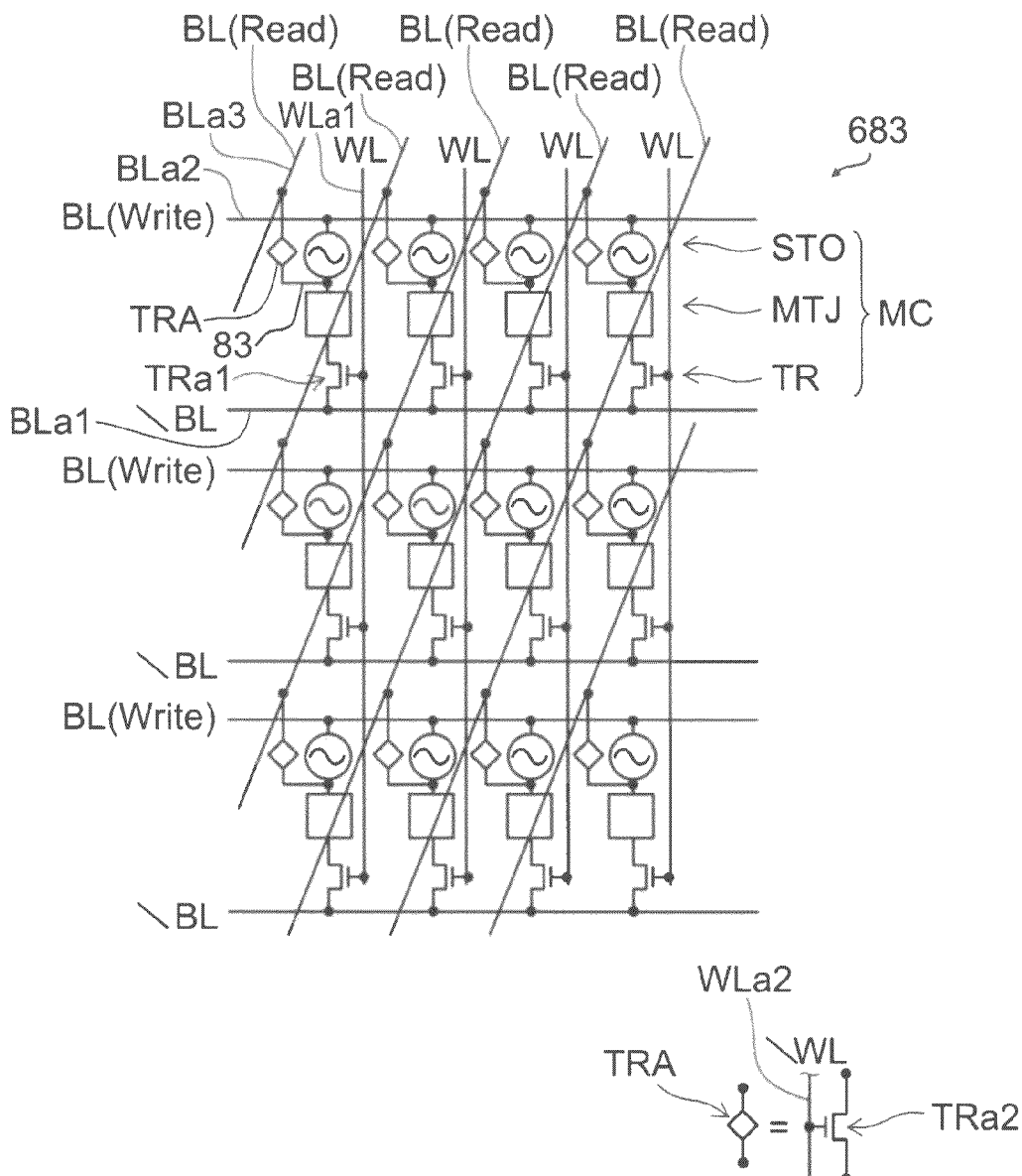
FIG. 51 is a schematic circuit diagram showing the configuration of a nonvolatile memory device according to a tenth embodiment.

FIG. 51 is a schematic circuit diagram illustrating the configuration of a nonvolatile memory device according to a tenth embodiment.

FIG. 51 illustrates the configuration of the memory cell array unit MCA of a nonvolatile memory device 683 according to the embodiment. In the drawing, the control unit 550 is omitted.

As shown in FIG. 51, in the nonvolatile memory device 683, the extending direction of the bit interconnection for writing BL(Write) is not parallel to the extending direction of the bit interconnection for reading BL(Read). That is, for the memory cells MC arranged vertically and horizontally, one bit interconnection for writing BL(Write) is connected to memory cells MC arranged along a horizontal direction (e.g. the X-axis direction). One bit interconnection for reading BL(Read) is connected to memory cells MC arranged in an oblique direction.

The nonvolatile memory device 683 has the following configuration.

The first bit interconnection BLa1 (e.g. the bit interconnection bar \BL) is (directly or) indirectly connected to the first end of the first stacked unit SB1 (MTJ) on the side opposite to the first intermediate interconnection 83a.

The second bit interconnection BLa2 (e.g. the bit interconnection for writing BL(Write)) is (directly or) indirectly connected to the second end of the second stacked unit SB2 (STO) on the side opposite to the first intermediate interconnection 83a.

The third bit interconnection BLa3 (e.g. the bit interconnection for reading BL(Read)) is directly or indirectly connected to the first intermediate interconnection 83a.

The first selection transistor TRa1 is disposed between the first bit interconnection BLa1 and the first end.

The second selection transistor TRa2 is connected between the first intermediate interconnection 83a and the third bit interconnection BLa3.

The first word interconnection WLa1 is directly or indirectly connected to the gate of the first selection transistor TRa1.

The second word interconnection WLa2 is directly or indirectly connected to the gate of the second selection transistor TRa2.

Also in this case, the reading unit 510 of the control unit 550 is connected to the first to third bit interconnections BLa1 to BLa3. The reading unit 510 reads out the direction of the magnetization of the second ferromagnetic layer 20 by detecting the change in the frequency f of the oscillation of the third ferromagnetic layer 30 in accordance with the direction of the magnetization of the second ferromagnetic layer 20.

Figure 52:
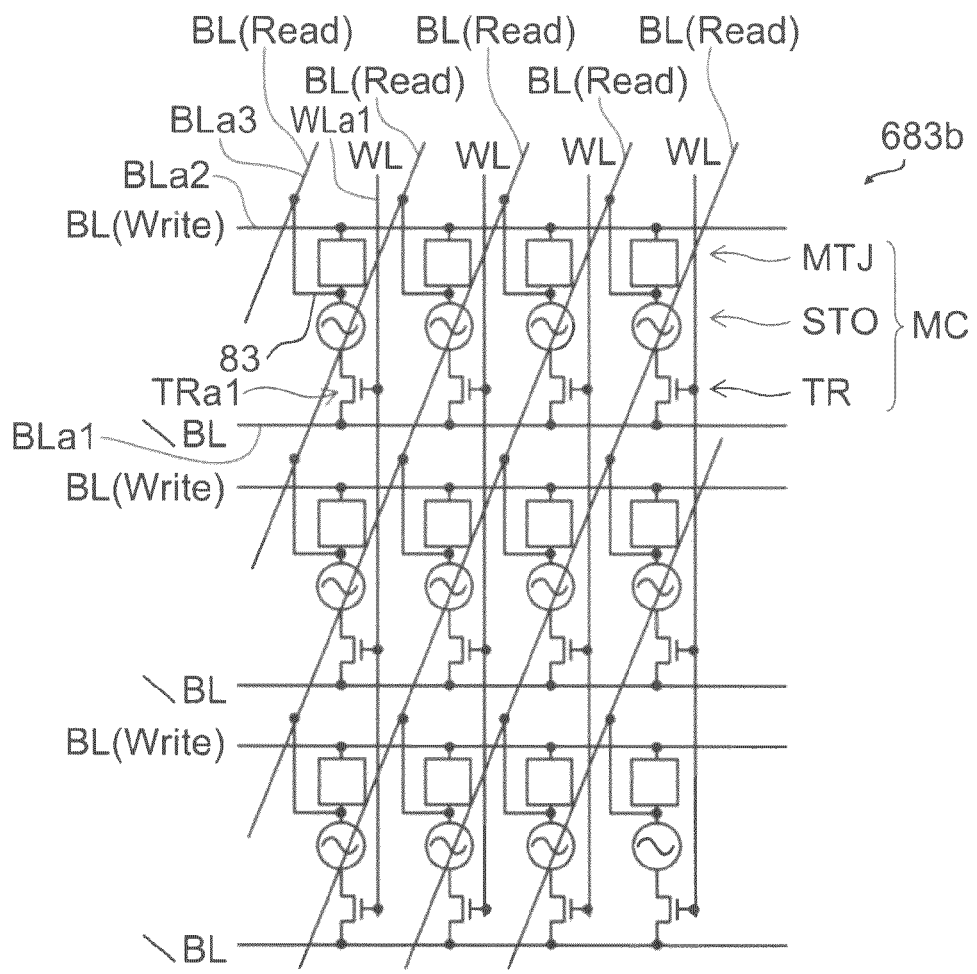
FIG. 52 is a schematic circuit diagram showing the configuration of another nonvolatile memory device according to the tenth embodiment.

FIG. 52 is a schematic circuit diagram illustrating the configuration of another nonvolatile memory device according to the tenth embodiment.

As shown in FIG. 52, also in a nonvolatile memory device 683b according to the embodiment, the extending direction of the bit interconnection for writing BL(Write) is not parallel to the extending direction of the bit interconnection for reading BL(Read).

In this example, the bit interconnection for reading BL(Read) is, for example, the third bit interconnection BLa3, the bit interconnection for writing BL(Write) is, for example, the second bit interconnection BLa2, and the bit interconnection bar \BL is, for example, the first bit interconnection BLa1.

In this example, the extending direction of the third bit interconnection BLa3 is non-parallel to the extending direction of the first bit interconnection BLa1 and the extending direction of the second bit interconnection BLa2.

The nonvolatile memory device 683b has the following configuration.

The first bit interconnection BLa1 is (directly or) indirectly connected to the first end of the second stacked unit SB2 on the side opposite to the first intermediate interconnection 83a.

The second bit interconnection BLa2 is (directly or) indirectly connected to the second end of the first stacked unit SB1 on the side opposite to the first intermediate interconnection 83a.

The third bit interconnection BLa3 is directly or indirectly connected to the first intermediate interconnection 83a.

The first selection transistor TRa1 is disposed between the first bit interconnection BLa1 and the first end.

The first word interconnection WLa1 (the word interconnection WL) is directly or indirectly connected to the gate of the first selection transistor TRa1.

Also in this case, the reading unit 510 of the control unit 550 is connected to the first to third bit interconnections BLa1 to BLa3. The reading unit 510 reads out the direction of the magnetization of the second ferromagnetic layer 20 by detecting the change in the frequency f of the oscillation of the third ferromagnetic layer 30 in accordance with the direction of the magnetization of the second ferromagnetic layer 20.

Thus, the nonvolatile memory devices according to the eighth to tenth embodiments include a plurality of bit lines, a plurality of word interconnections, a plurality of memory cells MC, and a plurality of transistors.

The extending direction of the plurality of word interconnections is non-parallel to the extending direction of the plurality of bit lines. Each of the plurality of memory cells MC is provided at the intersection of each of the plurality of bit lines and each of the plurality of word interconnections. Each memory cell MC includes any magnetic memory element according to the first to fourth embodiments. The plurality of transistors are connected between at least one of the portions between the first interconnection 81 and the second interconnection 82 of the plurality of magnetic memory elements, and one of the plurality of bit lines or one of the plurality of word interconnections.

For example, each of the plurality of bit lines may include the first bit interconnection directly or indirectly connected to one end of the MT) of a magnetic memory element, the second bit interconnection directly or indirectly connected to one end of the STO of the magnetic memory element, and the third bit interconnection directly or indirectly connected to the intermediate interconnection 83 of the magnetic memory element.

For example, in the magnetic memory element, one end of the MTJ is connected to the transistor and the other end of the MTJ is connected to the STO. The transistor is provided at least one of between the first bit interconnection and the MTJ and between the second bit interconnection and the STO. However, the embodiment is not limited thereto but the positional relationship of the MTJ and the STO may be opposite. A configuration is possible in which one end of the STO is connected to the transistor and the other end of the STO is connected to the MTJ. Alternatively, the transistor may be connected to both of the MTJ and the STO.

The nonvolatile memory device according to the embodiment includes a plurality of bit lines, a plurality of word interconnections, and a plurality of memory cells MC. Each of the plurality of memory cells MC is provided at the facing portion of each of the plurality of bit lines and each of the plurality of word interconnections.

Each of the plurality of memory cells MC includes the first stacked unit SB1, the second stacked unit SB2, the intermediate interconnection 83, and the selection transistor. The intermediate interconnection 83 is provided between the first stacked unit SB1 and the second stacked unit SB2. The selection transistor includes the gate, and current passage becomes possible by switching the gate to ON. That is, the selection transistor further includes the source and the drain, and a current flows between the source and the drain by switching the gate to ON.

The first stacked unit SB1 includes the first ferromagnetic layer 10, the second ferromagnetic layer 20, and the first nonmagnetic layer 10n mentioned above. The second stacked unit SB2 includes the third ferromagnetic layer 30, the fourth ferromagnetic layer 40, and the second nonmagnetic layer 20n mentioned above. As described above, the stacking order of them may be variously altered.

Each of the plurality of bit lines includes the first to third bit interconnections. Each of the first to third bit interconnections is connected to one of the plurality of memory cells MC provided at the intersection of one of the plurality of bit lines and one of the plurality of word interconnections.

The first bit interconnection is directly or indirectly connected to the first end of the first stacked unit SB1 of the one of the memory cells MC on the side opposite to the intermediate interconnection 83. The second bit interconnection is directly or indirectly connected to the second end of the second stacked unit SB2 of the one of the memory cells MC on the side opposite to the intermediate interconnection 83. The third bit interconnection is directly or indirectly connected to the intermediate interconnection 83 of the one of the memory cells MC.

The selection transistor of the one of the memory cells MC is disposed at least one of between the first bit interconnection and the first end and between the second bit interconnection and the second end. The one of the plurality of word interconnections is connected to the gate of the selection transistor of the one of the memory cells MC.

For example, the selection transistor of the one of the memory cells MC is disposed between the first bit interconnection and the first end, and the source of the selection transistor of the one of the memory cells MC is directly or indirectly connected to one of the first bit interconnection and the first end. The drain of the transistor is directly or indirectly connected to the other of the first bit interconnection and the first end.

For example, the selection transistor of the one of the memory cells MC is disposed between the second bit interconnection and the second end, and the source of the selection transistor of the one of the memory cells MC is directly or indirectly connected to one of the second bit interconnection and the second end. The drain of the transistor is directly or indirectly connected to the other of the second bit interconnection and the second end.

The reading unit 510 of the control unit 550 is connected to a plurality of bit lines (specifically, the first to third bit interconnections). The reading unit 510 reads out the direction of the magnetization of the second ferromagnetic layer 20 by detecting the change in the frequency f of the oscillation of the third ferromagnetic layer 30 in accordance with the direction of the magnetization of the second ferromagnetic layer 20

The embodiment provides a nonvolatile memory device capable of stable operation.

In the specification of the application, "perpendicular" and "parallel" refer to not only strictly perpendicular and strictly parallel but also include, for example, the fluctuation due to manufacturing processes, etc. It is sufficient to be substantially perpendicular and substantially parallel.

Hereinabove, embodiments of the invention are described with reference to specific examples. However, the embodiment of the invention is not limited to these specific examples. For example, one skilled in the art may appropriately select specific configurations of components of magnetic memory elements such as ferromagnetic layers, nonmagnetic layers, and electrodes and components of nonvolatile memory devices such as interconnections, transistors, reading units, and control units from known art and similarly practice the invention. Such practice is included in the scope of the invention to the extent that similar effects thereto are obtained.

Further, any two or more components of the specific examples may be combined within the extent of technical feasibility and are included in the scope of the invention to the extent that the purport of the invention is included.

Moreover, all nonvolatile memory devices that can be obtained by an appropriate design modification by one skilled in the art based on the nonvolatile memory devices described above as embodiments of the invention also are within the scope of the invention to the extent that the purport of the invention is included.

Various other variations and modifications can be conceived by those skilled in the art within the spirit of the invention, and it is understood that such variations and modifications are also encompassed within the scope of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:
1. A nonvolatile memory device comprising:
   a magnetic memory element including a stacked body including:

a first stacked unit including:
  a first ferromagnetic layer, a magnetization of the first ferromagnetic layer being fixed in a first direction;
  a second ferromagnetic layer stacked with the first ferromagnetic layer along a stacking direction, a direction of a magnetization of the second ferromagnetic layer being variable; and
  a first nonmagnetic layer provided between the first ferromagnetic layer and the second ferromagnetic layer; and
a second stacked unit stacked with the first stacked unit along the stacking direction, the second stacked unit including:
  a third ferromagnetic layer, a magnetization of the third ferromagnetic layer being rotated by a passed current to produce oscillation, a frequency of the oscillation changing in accordance with the direction of the magnetization of the second ferromagnetic layer;
  a fourth ferromagnetic layer stacked with the third ferromagnetic layer along the stacking direction, a magnetization of the fourth ferromagnetic layer being fixed in a second direction; and
  a second nonmagnetic layer provided between the third ferromagnetic layer and the fourth ferromagnetic layer; and
a control unit including a reading unit configured to read out the direction of the magnetization of the second ferromagnetic layer by detecting the change in the frequency of the oscillation of the third ferromagnetic layer.

2. The device according to claim 1, wherein
the stacked body further includes a third nonmagnetic layer provided between the first stacked unit and the second stacked unit and
the third nonmagnetic layer contains a metal selected from the group consisting of ruthenium (Ru), tantalum (Ta), tungsten (W), platinum (Pt), palladium (Pd), molybdenum (Mo), niobium (Nb), zirconium (Zr), titanium (Ti), and vanadium (V) or an alloy including at least two selected from the group.

3. The device according to claim 1, wherein
the stacked body further includes a third nonmagnetic layer provided between the first stacked unit and the second stacked unit,
the third nonmagnetic layer contains a metal selected from the group consisting of ruthenium (Ru), osmium (Os), and iridium (Ir) or an alloy including at least two selected from the group, and
a thickness of the third nonmagnetic layer is not more than 3 nanometers.

4. A nonvolatile memory device comprising:
a magnetic memory element including:
  a first stacked unit including:
    a first ferromagnetic layer, a magnetization of the first ferromagnetic layer being fixed in a first direction;
    a second ferromagnetic layer stacked with the first ferromagnetic layer along a stacking direction, a direction of a magnetization of the second ferromagnetic layer being variable; and
    a first nonmagnetic layer provided between the first ferromagnetic layer and the second ferromagnetic layer;
  a second stacked unit including:
    a third ferromagnetic layer, a magnetization of the third ferromegnetic layer being rotated by a passed current to produce oscillation, a frequency of the oscillation changing in accordance with the direction of the magnetization of the second ferromagnetic layer;
    a fourth ferromagnetic layer stacked with the third ferromagnetic layer along the stacking direction, a magnetization of the fourth ferromagnetic layer being fixed in a second direction; and
    a second nonmagnetic layer provided between the third ferromagnetic layer and the fourth ferromagnetic layer; and
  a third nonmagnetic layer having a first surface perpendicular to the stacking direction and a second surface on a side opposite to the first surface, at least a part of the first surface facing the first stacked unit, at least a part of the second surface facing the second stacked unit; and
a control unit including a reading unit configured to read out the direction of the magnetization of the second ferromagnetic layer by detecting the change in the frequency of the oscillation of the third ferromagnetic layer.

5. The device according to claim 4, wherein at least a part of the third nonmagnetic layer is disposed between the first stacked unit and the second stacked unit.

6. The device according to claim 4, wherein
the magnetic memory element further includes a third stacked unit facing the first surface and juxtaposed to the first stacked unit and
the third stacked unit includes:
  a fifth ferromagnetic layer, a magnetization of the fifth ferromagnetic layer being fixed in a third direction;
  a sixth ferromagnetic layer stacked with the fifth ferromagnetic layer along the stacking direction, a direction of a magnetization of the sixth ferromagnetic layer being variable; and
  a fourth nonmagnetic layer provided between the fifth ferromagnetic layer and the sixth ferromagnetic layer.

7. The device according to claim 6, wherein the reading unit reads out the direction of the magnetization of the second ferromagnetic layer by detecting a change in a frequency of the oscillation of the third ferromagnetic layer in accordance with the direction of the magnetization of the second ferromagnetic layer and the direction of a magnetization of the sixth ferromagnetic layer.

8. The device according to claim 1, wherein the first direction is opposite to the second direction.

9. The device according to claim 1, wherein a damping coefficient α of the third ferromagnetic layer, a magnetization Ms (emu/cc) of the third ferromagnetic layer, a volume V (cm$^3$) of the third ferromagnetic layer, a demagnetic field coefficient Nz of the third ferromagnetic layer, a stray magnetic field Hs (Oe) from the first ferromagnetic layer, the second ferromagnetic layer, and the fourth ferromagnetic layer in a position of the third ferromagnetic layer, and a write current $I_W$ (A) supplied to the stacked body in a write operation of setting the magnetization of the second ferromagnetic layer in a prescribed direction satisfy a relationship of $$\frac{2e\alpha}{\hbar} \cdot \frac{M_s V}{g(\theta)} (4\pi N_z M_s - H_s) < I_w$$

$$\hbar = h/2\pi$$

where e is an elementary electric charge, h is a Planck constant, θ (radian) is an angle between the direction of the magnetization of the third ferromagnetic layer and the stacking direction, and g(θ) is a spin polarization efficiency of the third ferromagnetic layer.

10. The device according to claim 1, wherein a damping coefficient α of the third ferromagnetic layer, a magnetization Ms (emu/cc) of the third ferromagnetic layer, a volume V (cm³) of the third ferromagnetic layer, a demagnetic field coefficient Nz of the third ferromagnetic layer, a stray magnetic field Hs (Oe) from the first ferromagnetic layer, the second ferromagnetic layer, and the fourth ferromagnetic layer in a position of the third ferromagnetic layer, and a write current $I_W$ (A) supplied to the stacked body in a write operation of setting the magnetization of the second ferromagnetic layer in a prescribed direction satisfy a relationship of $$\frac{2e\alpha}{\hbar} \cdot \frac{M_s V}{g(\theta)} (0.4 \times 4\pi N_z M_s - H_s) < I_w$$

$$\hbar = h/2\pi$$

where e is an elementary electric charge, h is a Planck constant, θ (radian) is an angle between the direction of the magnetization of the third ferromagnetic layer and the stacking direction, and g(θ) is a spin polarization efficiency of the third ferromagnetic layer.

11. The device according to claim 1, wherein a gyromagnetic ratio γ (Hz/Oe) of the third ferromagnetic layer, a magnetization Ms (emu/cc) of the third ferromagnetic layer, a demagnetic field coefficient Nz of the third ferromagnetic layer, a stray magnetic field Hs (Oe) from the first ferromagnetic layer, the second ferromagnetic layer, and the fourth ferromagnetic layer in a position of the third ferromagnetic layer, a gyromagnetic ratio γ' (Hz/Oe) of the second ferromagnetic layer, a magnetization Ms' (emu/cc) of the second ferromagnetic layer, a demagnetic field coefficient Nz' of the second ferromagnetic layer, an anisotropic magnetic field Hk (Oe) of the second ferromagnetic layer, and a stray magnetic field Hs' (Oe) from the first ferromagnetic layer, the third ferromagnetic layer, and the fourth ferromagnetic layer in a position of the second ferromagnetic layer satisfy one of relationships of $$\frac{\gamma}{2\pi}(0.4 \times 4\pi N_z M_s - H_s) < \frac{\gamma'}{2\pi}(H_k - 4\pi N'_z M'_s \pm H'_s) - 10^9$$

$$\frac{\gamma}{2\pi}(0.4 \times 4\pi N_z M_s - H_s) > \frac{\gamma'}{2\pi}(H_k - 4\pi N'_z M'_s \pm H'_s) + 10^9.$$

12. The device according to claim 1, further comprising:
an interconnection for reading connecting the magnetic memory element and the reading unit; and
a conductive layer provided along the interconnection for reading.

13. The device according to claim 1, wherein the magnetic memory element further includes a magnetic shield facing at least a part of a side surface of the stacked body.

14. The device according to claim 1, further comprising:
a first interconnection connecting one end of the magnetic memory element and the control unit directly or indirectly;
a second interconnection connecting another end of the magnetic memory element and the control unit directly or indirectly; and
a transistor provided at least one of between the first interconnection and the one end and between the second interconnection and the other end.

15. The device according to claim 1, wherein
the magnetic memory element further includes a third nonmagnetic layer provided between the first stacked unit and the second stacked unit and
the device further comprises:
a first bit interconnection connecting one end of the magnetic memory element and the control unit directly or indirectly;
a second bit interconnection connecting another end of the magnetic memory element and the control unit directly or indirectly;
a third bit interconnection connecting the third nonmagnetic layer and the control unit directly or indirectly;
a first selection transistor provided at least one of between the first bit interconnection and the one end and between the second bit interconnection and the other end;
a second selection transistor provided between the third bit interconnection and the third nonmagnetic layer;
a first word interconnection connecting a gate of the first selection transistor and the control unit directly or indirectly; and
a second word interconnection connecting a gate of the second selection transistor and the control unit directly or indirectly.

16. The device according to claim 15, wherein an extending direction of the first bit interconnection is parallel to an extending direction of the second bit interconnection and an extending direction of the third bit interconnection.

17. The device according to claim 15, wherein an extending direction of the third bit interconnection is non-parallel to an extending direction of the first bit interconnection and an extending direction of the second bit interconnection.

18. A nonvolatile memory device comprising:
a plurality of bit lines;
a plurality of word lines;
a plurality of memory cells each provided at each of facing portions, the bit lines facing the word lines at the facing portions; and
a control unit including a reading unit connected to the bit lines,
each of the memory cells including:
a first stacked unit;
a second stacked unit stacked with the first stacked unit along a stacked direction;
an intermediate interconnection provided between the first stacked unit and the second stacked unit; and
a selection transistor including a gate and configured to allow current passage by switching the gate to ON,
the first stacked unit including:
a first ferromagnetic layer, a magnetization of the first ferromagnetic layer being fixed in a first direction;
a second ferromagnetic layer stacked with the first ferromagnetic layer along the stacking direction, a direction of a magnetization of the second ferromagnetic layer being variable; and
a first nonmagnetic layer provided between the first ferromagnetic layer and the second ferromagnetic layer,
the second stacked unit including:
a third ferromagnetic layer, a magnetization of the third ferromagnetic layer being rotated by a passed current to produce oscillation, a frequency of the oscillation changing in accordance with the direction of the magnetization of the second ferromagnetic layer;
a fourth ferromagnetic layer stacked with the third ferromagnetic layer along the stacking direction, a magnetization of the fourth ferromagnetic layer being fixed in a second direction; and a second nonmagnetic layer provided between the third ferromagnetic layer and the fourth ferromagnetic layer, each of the bit lines including a first to a third bit interconnection, each of the first to third bit interconnections being connected to one of the memory cells provided at the facing portion, the first bit interconnection being directly or indirectly connected to a first end of the first stacked unit of the one of the memory cells on a side opposite to the intermediate interconnection, the second bit interconnection being directly or indirectly connected to a second end of the second stacked unit of the one of the memory cells on a side opposite to the intermediate interconnection, the third bit interconnection being directly or indirectly connected to the intermediate interconnection of the one of the memory cells, the selection transistor of the one of the memory cells being disposed at least a position between the first bit interconnection and the first end and a position between the second bit interconnection and the second end, the one of the word lines being connected to the gate of the selection transistor of the one of the memory cells, the reading unit being configured to read out the direction of the magnetization of the second ferromagnetic layer by detecting the change in the frequency of the oscillation of the third ferromagnetic layer.

19. A nonvolatile memory device comprising:
a first magnetic memory element including:
   a first stacked unit including:
      a first ferromagnetic layer, a magnetization of the first ferromagnetic layer being fixed in a first direction;
      a second ferromagnetic layer stacked with the first ferromagnetic layer along a stacking direction, a direction of a magnetization of the second ferromagnetic layer being variable; and
      a first nonmagnetic layer provided between the first ferromagnetic layer and the second ferromagnetic layer;
   a second stacked unit stacked with the first stacked unit along the stacking direction and including:
      a third ferromagnetic layer, a magnetization of third ferromagnetic layer being rotated by a passed current to produce oscillation, a frequency of the oscillation changing in accordance with the direction of the magnetization of the second ferromagnetic layer;
      a fourth ferromagnetic layer stacked with the third ferromagnetic layer along the stacking direction, a magnetization of the fourth ferromagnetic layer being fixed in a second direction; and
      a second nonmagnetic layer provided between the third ferromagnetic layer and the fourth ferromagnetic layer; and
   a first intermediate interconnection provided between the first stacked unit and the second stacked unit;
a second magnetic memory element juxtaposed to the first magnetic memory element along a direction orthogonal to the stacking direction and including:
   a third stacked unit including:
      a fifth ferromagnetic layer, a magnetization of the fifth ferromagnetic layer being fixed in a third direction;
      a sixth ferromagnetic layer stacked with the fifth ferromagnetic layer along the stacking direction, a direction of a magnetization of the sixth ferromagnetic layer being variable; and
      a third nonmagnetic layer provided between the fifth ferromagnetic layer and the sixth ferromagnetic layer;
   a fourth stacked unit stacked with the third stacked unit along the stacking direction and including:
      a seventh ferromagnetic layer, a magnetization of the seventh ferromagnetic layer being rotated by a passed current to produce oscillation, a frequency of the oscillation changing in accordance with the direction of the magnetization of the sixth ferromagnetic layer;
      an eighth ferromagnetic layer stacked with the seventh ferromagnetic layer along the stacking direction, a magnetization of the eighth ferromagnetic layer being fixed in a fourth direction; and
      a fourth nonmagnetic layer provided between the seventh ferromagnetic layer and the eighth ferromagnetic layer; and
   a second intermediate interconnection provided between the third stacked unit and the fourth stacked unit;
a first bit interconnection directly or indirectly connected to a first end of the first stacked unit on a side opposite to the first intermediate interconnection;
a second bit interconnection directly or indirectly connected to a second end of the second stacked unit on a side opposite to the first intermediate interconnection;
a third bit interconnection directly or indirectly connected to the first intermediate interconnection and the second intermediate interconnection;
a fourth bit interconnection directly or indirectly connected to a third end of the third stacked unit on a side opposite to the second intermediate interconnection;
a fifth bit interconnection directly or indirectly connected to a fourth end of the fourth stacked unit on a side opposite to the second intermediate interconnection;
a first selection transistor disposed between the first bit interconnection and the first end;
a second selection transistor connected between the first intermediate interconnection and the third bit interconnection;
a third selection transistor disposed between the fourth bit interconnection and the third end;
a fourth selection transistor connected between the second intermediate interconnection and the third bit interconnection;
a first word interconnection directly or indirectly connected to a gate of the first selection transistor and a gate of the third selection transistor;
a second word interconnection directly or indirectly connected to a gate of the second selection transistor and a gate of the fourth selection transistor; and
a control unit connected to the first to fifth bit interconnections and including a reading unit configured to read out the direction of the magnetization of the second ferromagnetic layer by detecting the change in the frequency of the oscillation of the third ferromagnetic layer or configured to read out the direction of the magnetization of the sixth ferromagnetic layer by detecting a change in the frequency of the oscillation of the seventh ferromagnetic layer.

* * * * *